United States Patent [19]

Yamada et al.

[11] Patent Number: 5,391,886

[45] Date of Patent: Feb. 21, 1995

[54] CHARGED PARTICLE BEAM EXPOSURE SYSTEM AND METHOD OF EXPOSING A PATTERN ON AN OBJECT BY SUCH A CHARGED PARTICLE BEAM EXPOSURE SYSTEM

[75] Inventors: Akio Yamada; Yoshihisa Oae; Satoru Yamazaki; Tomohiko Abe; Katsuhiko Kobayashi; Kiichi Sakamoto; Junko Hatta, all of Kawasaki, Japan

[73] Assignee: Fujitsu Limited, Kawasaki, Japan

[21] Appl. No.: 131,670

[22] Filed: Oct. 5, 1993

Related U.S. Application Data

[63] Continuation-in-part of Ser. No. 897,050, Jun. 11, 1992, Pat. No. 5,304,811.

[30] Foreign Application Priority Data

| Aug. 9, 1991 | [JP] | Japan | 3-200479 |
| Nov. 6, 1991 | [JP] | Japan | 3-290232 |
| Oct. 7, 1992 | [JP] | Japan | 4-268815 |
| Feb. 12, 1993 | [JP] | Japan | 5-024224 |
| Jul. 26, 1993 | [JP] | Japan | 5-183992 |

[51] Int. Cl.$^6$ .................................. H01J 37/00
[52] U.S. Cl. .................... 250/492.22; 250/398
[58] Field of Search ............ 250/492.22, 492.2 R, 250/398, 252.1 R

[56] References Cited

U.S. PATENT DOCUMENTS

| 4,137,459 | 1/1979 | Albrecht et al. | 250/492.2 |
| 4,362,942 | 12/1982 | Yasuda | 250/492.2 |
| 4,929,838 | 5/1990 | Yasuda et al. | 250/492.2 |
| 5,047,646 | 9/1991 | Hattori et al. | 250/492.2 |
| 5,051,556 | 9/1991 | Sakamoto et al. | 250/492.22 |
| 5,130,547 | 7/1992 | Sakamoto et al. | 250/492.2 |
| 5,173,582 | 12/1992 | Sakamoto et al. | 250/492.22 |
| 5,304,811 | 4/1994 | Yamada et al. | 250/492.22 |

FOREIGN PATENT DOCUMENTS

| 4-65818 | 3/1992 | Japan . |
| 4-111413 | 4/1992 | Japan . |

Primary Examiner—Paul M. Dzierzynski
Assistant Examiner—Kiet T. Nguyen
Attorney, Agent, or Firm—Armstrong, Westerman, Hattori, McLeland & Naughton

[57] ABSTRACT

A method of exposing a pattern on a substrate by a charged particle beam includes the steps of energizing first and second mask deflectors provided at an upstream side of a stencil mask simultaneously to obtain a first relativistic relationship of energization between the first and second mask deflectors, energizing the first mask deflector and simultaneously the second mask deflector according to the first relativistic relationship so as to hit a selected aperture on the stencil mask, to obtain an absolute deflection of the charged particle beam as a function of the energization of the first mask deflector, energizing third and fourth mask deflectors provided at a downstream side of the stencil mask simultaneously to obtain a second relativistic relationship of energization between the third and fourth mask deflectors, and energizing the first through fourth mask deflectors according to the first and second relativistic relationship and further to the absolute relationship, such that the charged particle beam is deflected away from an optical axis and hit a selected aperture on the stencil mask while traveling parallel to the optical axis, and such that the charged particle beam passed through the stencil mask is deflected toward the optical axis and deflected again such that the charged particle beam travels toward the substrate in alignment with the optical axis.

18 Claims, 46 Drawing Sheets

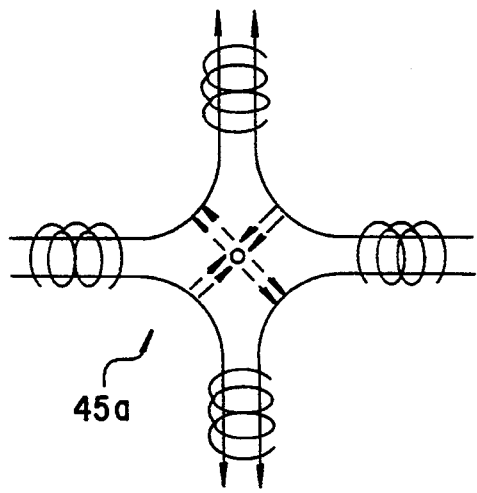
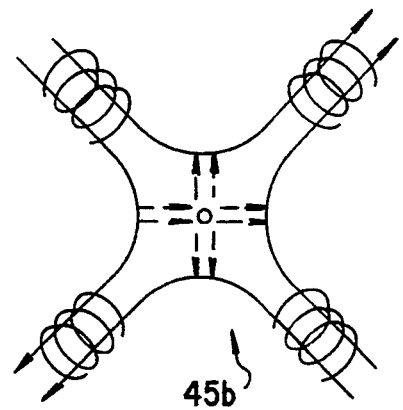
FIG.5(A)　　　　　　　　FIG.5(B)
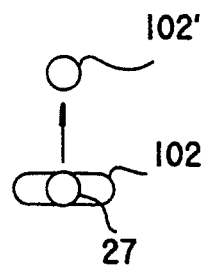
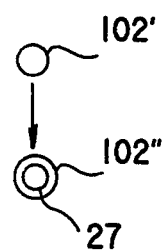
FIG.6(A)　　　　　　　　FIG.6(B)

FIG.10(A)
PRIOR ART
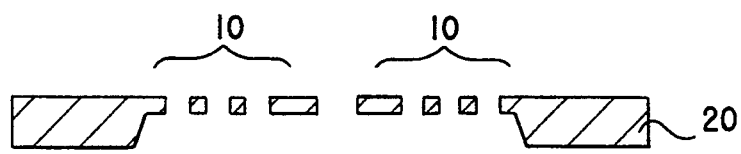
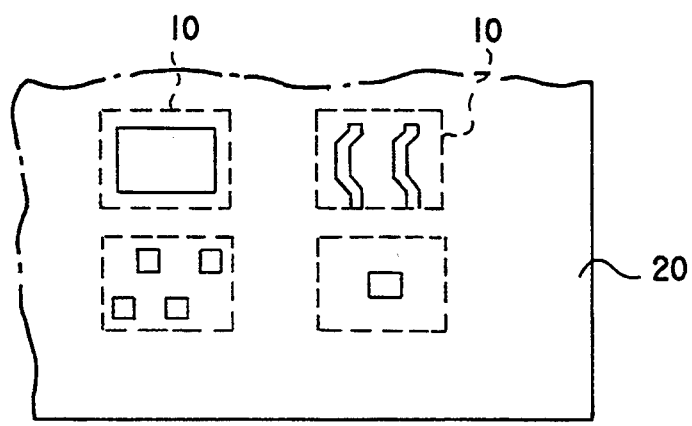
FIG.10(B)
PRIOR ART
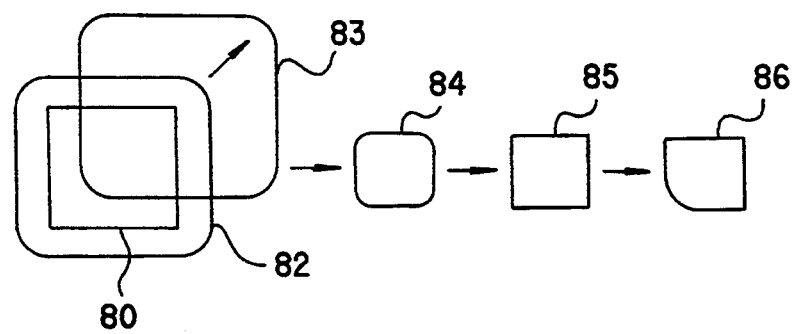
FIG.11

$$\begin{bmatrix} BSX_i \\ BSY_i \end{bmatrix} = \begin{bmatrix} Obsx_i & Gbsx_i & Rbsx_i & Hbsx_i & D20bsx_i & D02bsx_i & D21bsx_i & D12bsx_i & D30bsx_i & D03bsx_i \\ Obsy_i & Rbsy_i & Gbsy_i & Hbsy_i & D20bsy_i & D02bsy_i & D21bsy_i & D12bsy_i & D30bsy_i & D03bsy_i \end{bmatrix} \times \begin{bmatrix} 1 \\ xm \\ ym \\ xm \cdot ym \\ xm \cdot xm \\ ym \cdot ym \\ xm \cdot xm \cdot ym \\ xm \cdot ym \cdot ym \\ xm \cdot xm \cdot xm \\ ym \cdot ym \cdot ym \end{bmatrix}$$

$i = 1 \sim 4$

FIG.16

$$\begin{Bmatrix} BSXi \\ BSYi \end{Bmatrix} = \begin{Bmatrix} Obsxi & Gbsxi & Rbsxi & Hbsxi & D20bsxi & D02bsxi & D2Ibsxi & D12bsxi & D30bsxi & D03bsxi \\ Obsyi & Rbsyi & Gbsyi & Hbsyi & D20bsyi & D02bsyi & D2Ibsyi & D12bsyi & D30bsyi & D03bsyi \end{Bmatrix}_{A} \times \begin{Bmatrix} 1 \\ yma \\ yma \\ xma \cdot yma \\ xma \cdot xma \\ yma \cdot yma \\ xma \cdot xma \cdot yma \\ xma \cdot yma \cdot yma \\ xma \cdot xma \cdot xma \\ yma \cdot yma \cdot yma \end{Bmatrix}$$

$$\begin{bmatrix} BSX_i \\ BSY_i \end{bmatrix} = \underbrace{\begin{bmatrix} Omax & Gmax & Rmax & Hmax & D20max & D02max & D21max & D12max & D30max & D03max \\ Omay & Gmay & Rmay & Hmay & D20may & D02may & D21may & D12may & D30may & D03may \end{bmatrix}}_{D} \times \begin{Bmatrix} 1 \\ xm \\ ym \\ xm \cdot xm \\ xm \cdot xm \\ ym \cdot ym \\ xm \cdot xm \cdot ym \\ xm \cdot ym \cdot ym \\ xm \cdot xm \cdot xm \\ ym \cdot ym \cdot ym \end{Bmatrix} = \begin{Bmatrix} xma \\ yma \end{Bmatrix}$$

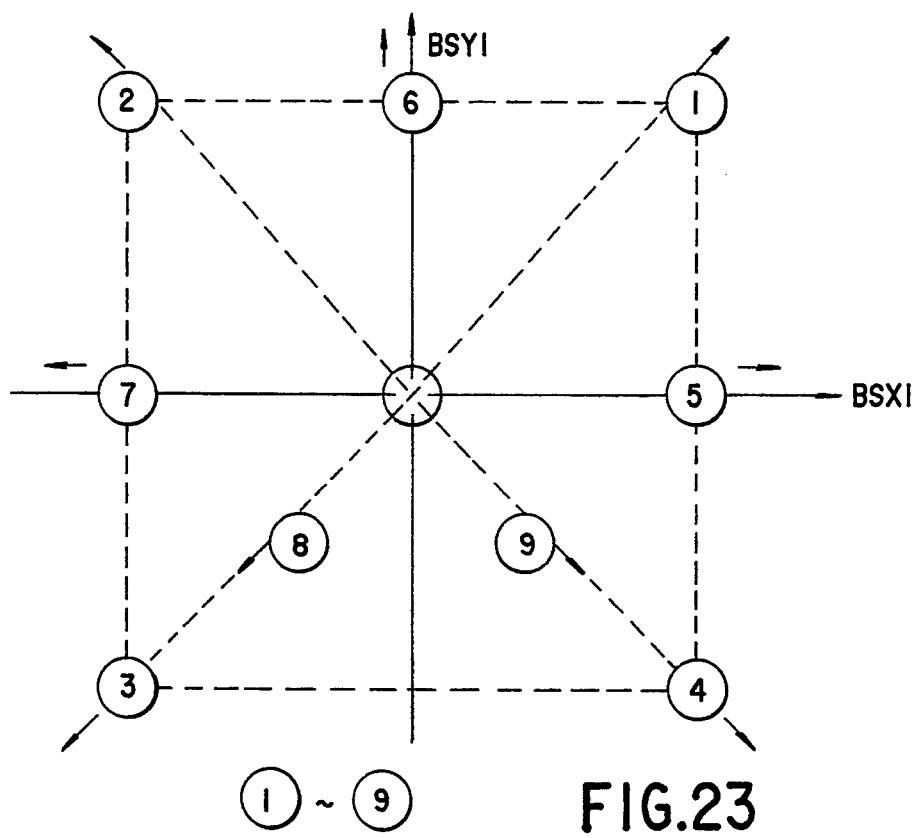
①~⑨  FIG.23
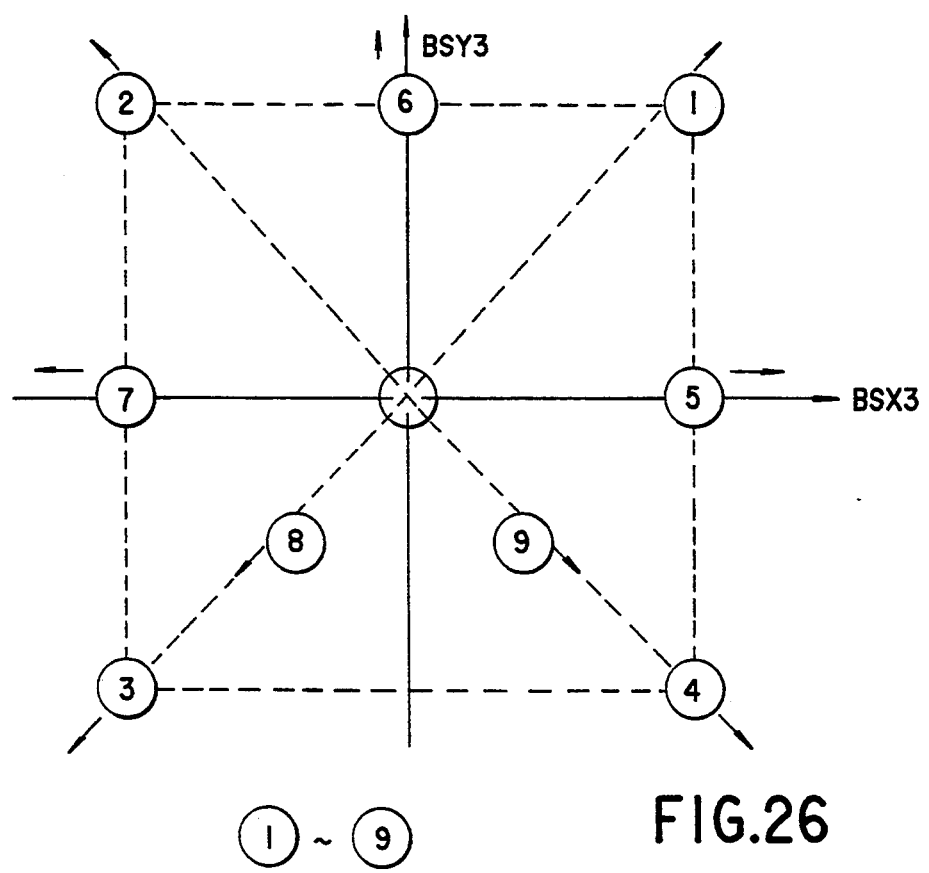
①~⑨  FIG.26

$$\begin{pmatrix} BSX1 \\ BSY1 \end{pmatrix} = \begin{pmatrix} D \end{pmatrix} \times \begin{pmatrix} xm \\ ym \end{pmatrix}$$

$$\begin{pmatrix} BSX2 \\ BSY2 \end{pmatrix} = \begin{pmatrix} A \end{pmatrix} \times \begin{pmatrix} xma \\ yma \end{pmatrix}$$

$$\begin{pmatrix} BSX3 \\ BSY3 \end{pmatrix} = \begin{pmatrix} B \end{pmatrix} \times \begin{pmatrix} xma \\ yma \end{pmatrix}$$

$$\begin{pmatrix} BSX4 \\ BSY4 \end{pmatrix} = \begin{pmatrix} C \end{pmatrix} \times \begin{pmatrix} xma \\ yma \end{pmatrix}$$

$$\begin{pmatrix} BSX_1 \\ BSY_1 \end{pmatrix} \equiv \begin{pmatrix} xma \\ yma \end{pmatrix}$$

FIG.31

$$\begin{Bmatrix} \Delta \text{0max} \\ \Delta \text{0may} \end{Bmatrix} = \begin{bmatrix} BSX1 \\ BSY1 \end{bmatrix} - \begin{bmatrix} \text{0max} & \text{Gmax} & \text{Rmax} & \text{Hmax} & \text{D20max} & \text{D02max} & \text{D21max} & \text{D12max} & \text{D30max} & \text{D03max} \\ \text{0may} & \text{Gmay} & \text{Rmay} & \text{Hmay} & \text{D20may} & \text{D02may} & \text{D21may} & \text{D12may} & \text{D30may} & \text{D03may} \end{bmatrix} \times \begin{Bmatrix} 1 \\ xm \\ ym \\ xm \cdot ym \\ xm \cdot xm \\ ym \cdot ym \\ xm \cdot xm \cdot ym \\ xm \cdot ym \cdot ym \\ xm \cdot xm \cdot xm \\ ym \cdot ym \cdot ym \end{Bmatrix}$$

FIG. 32

$$\begin{bmatrix} MDSX \\ MDSY \end{bmatrix} = \begin{bmatrix} Omdsx & Gmdsx & Rmdsx & Hmdsx & D20mdsx & D02mdsx & D21mdsx & D12mdsx & D30mdsx & D03mdsx \\ Omdsy & Rmdsy & Gmdsy & Hmdsy & D20mdsy & D02mdsy & D21mdsy & D12mdsy & D30mdsy & D03mdsy \end{bmatrix}_{E}$$

$$\times \begin{Bmatrix} 1 \\ xma \\ yma \\ xma \cdot yma \\ xma \cdot xma \\ yma \cdot yma \\ xma \cdot xma \cdot yma \\ xma \cdot yma \cdot yma \\ xma \cdot xma \cdot xma \\ yma \cdot yma \cdot yma \end{Bmatrix}$$

FIG. 34

$$\begin{bmatrix} Ax_i(k) \\ Ay_i(k) \end{bmatrix} = \begin{bmatrix} BSX(k) \\ BSY(k) \end{bmatrix} - \begin{bmatrix} D20bsxi & D02bsxi & D21bsxi & D12bsxi & D30bsxi & D03bsxi \\ D20bsyi & D02bsyi & D21bsyi & D12bsyi & D30bsyi & D03bsyi \end{bmatrix} \times \begin{Bmatrix} \{BSX(k)\}^2 \\ \{BSY(k)\}^2 \\ \{BSX(k)\}^2 \cdot BSY(k) \\ BSY(k) \cdot \{BSX(k)\}^2 \\ \{BSX(k)\}^3 \\ \{BSY(k)\}^3 \end{Bmatrix}$$

$$\begin{bmatrix} Obsxi & Gbsxi & Rbsxi & Hbsxi \\ Obsyi & Rbsyi & Gbsyi & Hbsyi \end{bmatrix} = \begin{bmatrix} Axi(0) & Axi(1) & Axi(2) & Axi(3) \\ Ayi(0) & Ayi(1) & Ayi(2) & Ayi(3) \end{bmatrix}$$

$$\times \begin{bmatrix} BSX(0) & BSX(1) & BSX(2) & BSX(3) \\ BSY(0) & BSY(1) & BSY(2) & BSY(3) \\ BSX(0) \cdot BSY(1) & BSX(1) \cdot BSY(1) & BSX(2) \cdot BSY(2) & BSX(3) \cdot BSY(3) \end{bmatrix}^{-1}$$

FIG. 48(B)

$$\begin{bmatrix} Omax & Gmax & Rmax & Hmax \\ Omay & Gmay & Rmay & Hmay \end{bmatrix} = \begin{bmatrix} Cx(0) & Cx(1) & Cx(2) & Cx(3) \\ Cy(0) & Cy(1) & Cy(2) & Cy(3) \end{bmatrix} \times \begin{bmatrix} xm(0) & xm(1) & xm(2) & xm(3) \\ ym(0) & ym(1) & ym(2) & ym(3) \\ xm(0) \, ym(0) & xm(1) \, ym(1) & xm(2) \, ym(2) & xm(3) \, ym(3) \end{bmatrix}^{-1}$$

FIG.49(B)

$$\begin{bmatrix} Cx(k) \\ Cy(k) \end{bmatrix} = \begin{bmatrix} D20max & D02max & D21max & D12max & D30max & D03max \\ D20may & D02may & D21may & D12may & D30may & D03may \end{bmatrix} \times \begin{Bmatrix} xm^2 \\ ym^2 \\ xm^2 \cdot ym \\ xm^2 \cdot ym^2 \\ xm^3 \\ ym^3 \end{Bmatrix}$$

CHARGED PARTICLE BEAM EXPOSURE SYSTEM AND METHOD OF EXPOSING A PATTERN ON AN OBJECT BY SUCH A CHARGED PARTICLE BEAM EXPOSURE SYSTEM

CROSS REFERENCE TO RELATED APPLICATIONS

The present invention is a continuation-in-part application of the U.S. patent application Ser. No. 07/897,050, now U.S. Pat. No. 5,304,811.

BACKGROUND OF THE INVENTION

1. Field of the Invention

The present invention generally relates to fabrication of semiconductor devices and more particularly to a charged particle beam exposure system for exposing patterns such as a pattern of an integrated circuit, on an object such as a semiconductor substrate. More particularly, the present invention relates to a charged particle beam exposure system wherein a charged particle beam is deflected to pass through a selected shaping aperture provided on a stencil mask to form a shaped beam, and wherein such a shaped beam is used for exposing a pattern corresponding to the pattern of the selected aperture, on a substrate.

2. Description of the Related Art

An exposure system using a charged-particle beam, particularly the system using an electron beam, has been used for fabricating a high precision mask or a reticle, or for patterning an electron beam provided on a semiconductor substrate. Generally, a conventional electron beam exposure system utilizes a shaped electron beam having a rectangular cross section for the exposure, wherein such a shaped electron beam is produced by causing the electron beam to pass through a pair of rectangular shaping apertures successively. Such a pair of rectangular shaping apertures are disposed to overlap with each other partially when viewed in the traveling direction of the electron beam, and the size of the rectangular beam is adjusted by changing the overlapping relationship of the apertures. The rectangular-shaped electron beam thus produced is deflected over the substrate by a deflector under a control of a pattern generation unit. As a result, a desired pattern is drawn on the substrate as a succession of the rectangular patterns. Thus, the electron beam exposure system has established an important position in the fabrication technology of semiconductor devices due to its extremely high precision of exposure. By using the electron beam exposure process, one can fabricate submicron semiconductor devices without difficulty.

When the pattern to be exposed on the substrate becomes more intricate and minute, on the other hand, the number of the exposure shots increases sharply, and such an increase in the number of the exposure shots inevitably causes a problem in that the throughput of the exposure process is reduced. It will be easily understood that an exposure process for exposing a complicated semiconductor pattern on a substrate by moving a single focused electron beam, requires a substantial time. In order to improve the throughput of exposure, particularly the exposure of semiconductor devices that have superfine, submicron patterns, a block exposure process has been proposed. For example, the U.S. Pat. Nos. 5,051,556 and 5,173,582 describe such a block exposure process. Thus, the foregoing references are incorporated herein as reference. Generally, a typical LSI pattern includes a repetition of basic, or fundamental patterns. Thus, by shaping the electron beam according to one of such basic patterns of which number is limited and by repeating the exposure or shot of such a shaped electron beam a number of times, one can improve the throughput of the exposure significantly.

In order to achieve such a block exposure process, the electron beam exposure system mentioned above uses a stencil mask that carries thereon a plurality of apertures in correspondence to the basic patterns of the integrated circuit, and the stencil mask is disposed to interrupt the charged particle beam that travels form a beam source to the substrate along an optical axis. When an electron beam hits a selected aperture while traveling toward the substrate, the electron beam is shaped according to the shape of the selected aperture, and such a shape of the aperture is projected upon the substrate with a demagnification. Thereby, an exposure of the fundamental device pattern is achieved by a single shot of the electron beam thus shaped. By repeating the exposure shots a number of times while moving the electron beam over the substrate, the necessary pattern of the integrated circuit is exposed with a substantially reduced time.

In such a construction of the electron beam exposure system, the stencil mask carries thereon a large number of apertures, and the electron beam is deflected by a deflector to hit the selected aperture. A typical aperture may have a size of 500 $\mu$m square on the stencil mask, and about one hundred such apertures are formed on the stencil mask. Thereby, it is necessary to deflect the electron beam over an area of as much as 6 mm square on the stencil mask by means of the deflector.

When implementing such a block exposure process, it is preferred that the electron beam exposure system satisfies the following conditions. First, the electron beam, deflected to hit the specific aperture on the stencil mask as described above, should impinge substantially perpendicularly upon the stencil mask. Second, the electron beam thus impinged upon the stencil mask has to create a sharp focused image thereon. Third, the electron beam deflected away from a central optical axis as a result of the deflection, should be deflected back to the optical axis after passage through the stencil mask. Fourth, a sharp focused image of the shaping aperture should be formed on the substrate.

In order to satisfy the foregoing requirements, particularly with respect to the first and third requirements, the foregoing U.S. Patents propose an electron beam exposure system wherein four deflectors are disposed along the optical axis of the electron beam for causing the foregoing addressing of the aperture of the stencil mask by the electron beam. More specifically, the first two deflectors are located at the upstream side of the stencil mask and the remaining two deflectors are located at the downstream side of the stencil mask, wherein the deflectors may either be an electrostatic deflector or an electromagnetic deflector. The first deflector deflects the electron beam away from the optical axis and the second deflector deflects the electron beam again such that the electron beam travels parallel to the optical axis. Thereby, the electron beam thus deflected by the second deflector impinges upon the stencil mask perpendicularly and is shaped according to the shape of the selected aperture on the stencil mask. The electron beam thus passed through the stencil mask is then deflected by the third deflector toward the optical axis, and the fourth deflector deflects the electron beam further such that the electron beam travels substantially coincident to the optical axis.

In such a block exposure system, however, due to the large beam displacement from the optical axis, there is a tendency that the electron beam exhibits aberration such as astigmatism or field curvature effect. When astigmatism occurs, the cross section of the shaped electron beam is modified and the image of the selected aperture is distorted on the substrate accordingly. When field curvature effect occurs, on the other hand, the focusing of the electron beam is modified and the exposed image tends to be blurred. Therefore, there has been a demand for a compensation mechanism that compensates for such a modification of the electron beam caused as a result of the electron beam traveling offset from the optical axis.

In the electron beam exposure system that uses the stencil mask, it should also be noted that the deflectors disposed at the upstream side and the downstream side of the stencil mask are driven simultaneously such that the electron beam hits the selected aperture on the stencil mask and returns to the optical axis again after passing through the mask. Thereby, it will be noted that the driving of the individual deflectors that causes such a deflection cannot be independent from each other. When the energization of one of the deflector is determined such that the electron beam hits a selected aperture, the energization of the rest of the deflectors is determined uniquely. This means that, in order to achieve the desired operation of the electron beam exposure system mentioned above, one has to obtain a function describing the relative driving energy of the four deflectors that are disposed above and below the stencil mask. However, the process for determining such a function includes an extremely complicated calibration process of the deflectors that includes a step of driving the four deflectors simultaneously while changing the combination of the driving energy variously for seeking an arrival of the electron beam on the substrate with a maximum intensity. Because of the fact that such a calibration has to be conducted periodically or whenever a stencil mask is changed, there has been a problem in the conventional electron beam exposure system in that the block exposure process requires a long calibration time and hence provides a low throughput, in spite of the increased efficiency of exposure associated with the efficient beam shaping. Further, the foregoing mechanism for compensating for the astigmatism or the field curvature effect has to be calibrated as a function of the energization of the deflectors, as such a modification of the electron beam occurs as a result of the offset of the electron beam from the optical axis and hence as a result of the energization of the deflectors.

SUMMARY OF THE INVENTION

Accordingly, it is a general object of the present invention to provide a novel and useful process for exposing a pattern on an object by means of a charged particle beam exposure process, wherein the foregoing problems are eliminated.

Another and more specific object of the present invention is to provide a process for exposing a pattern on an object by a charged particle beam exposure system, wherein the time needed for calibrating the exposure system with respect to the energization of deflectors that is used for shaping the charged particle beam is minimized.

Another object of the present invention is to provide a process for calibrating a compensation mechanism used in a charged particle beam exposure system wherein a charged particle beam is deflected away from an optical axis for shaping, said compensation mechanism being used for compensating for a modification of the charged particle beam caused as a result of an offset of said beam from the optical axis.

Another object of the present invention is to provide a process for exposing a pattern on an object by means of a focused charged particle beam, comprising the steps of: forming a charged particle beam in a beam source such that said charged particle beam travels toward said object along an optical axis; focusing said charged particle beam upon said object; shaping said charged particle beam in a region between said beam source and said object to form a shaped charged particle beam, said step of shaping comprising a step of deflecting said charged particle beam away from said optical axis by energizing deflection means that includes a plurality of deflectors, such that said charged particle beam passes one of a plurality of apertures provided on a beam shaping mask; deflecting back said shaped charged particle beam again upon said optical axis; radiating said shaped charged particle beam along said optical axis upon a shielding plate that is formed with a pinhole having a size generally corresponding to a diameter of said charged particle beam, said shielding plate being provided on said optical axis at a location between said beam shaping mask and said object; and selectively causing a turning off of said charged particle beam on said object by selectively deflecting said charged particle beam that has been radiated upon said shielding plate, away from said pinhole, said plurality of deflectors including first through fourth deflectors wherein said first and second deflectors are disposed at a side close to said beam source with respect to said beam shaping mask and such that said third and fourth deflectors are disposed at a side close to said object;

said method further comprising the steps of:

(a-1) energizing a first deflector forming said deflection means to cause a deflection of said charged particle beam to a plurality of calibration points that are located offset from said optical axis; and energizing, in each of said calibration points, the remaining deflectors forming said deflection means;

(a-2) detecting an intensity of said charged particle beam arriving at said object while energizing said remaining deflectors in said step (a-1), for each of said calibration points; and obtaining optimized energization of said remaining deflectors by optimizing energization of said remaining deflectors such that the charged particle beam, deflected in said step (a-1) and arriving at said object after passing through said pinhole, has a maximum intensity;

(a-3) obtaining a relativistic correction function that describes said optimized energization of said remaining deflectors obtained in said step (a-2) as a function of the energization of said first deflector;

(a-4) energizing said first deflector to cause a deflection of said charged particle beam such that said charged particle beam passes a selected aperture on said beam shaping mask; energizing said remaining deflectors according to said relativistic correction function, simultaneously to said first deflector that is deflecting said charged particle beam to said selected aperture; and obtaining optimized energization of said first deflector such that said charged particle beam, arriving at said object after passing through said pinhole, has a maximum intensity; and (a-5) obtaining an absolute correction function that describes said optimized energization of said first deflector obtained in said step (a-4), as a function of a position of said selected aperture on said beam shaping mask; and (b) deflecting said charged particle beam by energizing said first deflector according to said absolute correction function and said remaining deflectors according to said relativistic correction function, based upon energization of said first deflector, such that said electron beam hits a selected aperture on said beam shaping mask;

said step (a-2) further comprising the steps of:

(a-2-1) obtaining optimized energization of said second deflector with respect to energization of said first deflector by energizing said first and second deflectors simultaneously, such that said charged particle beam arriving at said object has a maximum intensity; and (a-2-2) obtaining optimized energization of said third deflector with respect to the energization of said fourth deflector by energizing said third and fourth deflectors simultaneously, such that said charged particle beam arriving at said object has a maximum intensity.

According to the present invention, the calibration of the first through fourth deflectors is achieved by dividing the calibration process into two steps, the first step for calibrating the relationship between the first and second deflectors and the second step for calibrating the relationship between the third and fourth deflectors. Thereby, the time needed for determining the correction function is substantially reduced as compared with the case wherein the four deflectors are driven independently and simultaneously for seeking the maximum intensity of the charged particle beam on the object.

Another object of the present invention is to provide a process for exposing a pattern on an object by means of a focused charged particle beam, comprising the steps of: forming a charged particle beam in a beam source such that said charged particle beam travels toward said object along an optical axis; focusing said charged particle beam upon said object; shaping said charged particle beam in a region between said beam source and said object to form a shaped charged particle beam, said step of shaping comprising a step of deflecting said charged particle beam away from said optical axis by energizing deflection means that includes a plurality of deflectors, such that said charged particle beam passes one of a plurality of apertures provided on a beam shaping mask; deflecting back said shaped charged particle beam again upon said optical axis; radiating said shaped charged particle beam along said optical axis upon a shielding plate that is formed with a pinhole having a size generally corresponding to a diameter of said charged particle beam, said shielding plate being provided on said optical axis at a location between said beam shaping mask and said object; and selectively causing a turning off of said charged particle beam on said object by selectively deflecting said charged particle beam that has been radiated upon said shielding plate, away from said pinhole;

said method further comprising the steps of:

(a-1) energizing a first deflector forming said deflection means to cause a deflection of said charged particle beam to a plurality of calibration points that are located offset from said optical axis; and energizing, in each of said calibration points, the remaining deflectors forming said deflection means;

(a-2) detecting an intensity of said charged particle beam arriving at said object while energizing said remaining deflectors in said step (a-1), for each of said calibration points; and obtaining optimized energization of said remaining deflectors by optimizing energization of said remaining deflectors such that the charged particle beam, deflected in said step (a-1) and arriving at said object after passing through said pinhole, becomes maximum;

(a-3) obtaining a relativistic correction function that describes said optimized energization of said remaining deflectors obtained in said step (a-2) as a function of the energization of said first deflector;

(a-4) energizing said first deflector to cause a deflection of said charged particle beam such that said charged particle beam passes a selected aperture on said beam shaping mask; energizing said remaining deflectors according to said relativistic correction function, simultaneously to said first deflector that is deflecting said charged particle beam to said selected aperture; and obtaining optimized energization of said first deflector such that said charged particle beam, arriving at said object after passing through said pinhole, has a maximum intensity; and (a-5) obtaining an absolute correction function that describes said optimized energization of said first deflector obtained in said step (a-4), as a function of a position of said selected aperture on said beam shaping mask;

(b-1) energizing said first deflector and simultaneously an astigmatic compensation coil provided along said optical axis at a side close to said beam source with respect to said shielding plate, said astigmatic compensation coil compensating for astigmatism upon energization;

(b-2) obtaining optimized energization of said astigmatic compensation coil, by optimizing said energization of said astigmatic compensation coil such that said charged particle beam has a maximum intensity on said object, while simultaneously detecting said intensity of said charged particle beam on said object;

(b-3) obtaining an astigmatic correction function describing said optimized energization of said astigmatic compensation coil as a function of the energization of said first deflector;

(c-1) energizing said first deflector and simultaneously a focusing compensation coil provided along said optical axis at a side close to said beam source with respect to said shielding plate, said focusing compensation coil adjusting a focal point of said charged particle beam;

(c-2) obtaining optimized energization of said focusing compensation coil, by optimizing said energization of said focusing compensation coil such that said charged particle beam has a maximum intensity on said object, while simultaneously detecting said intensity of said charged particle beam on said object;

(c-3) obtaining a focusing correction function describing said optimized energization of said focusing compensation coil as a function of the energization of said first deflector; and (d) deflecting said charged particle beam to hit a selected aperture on said beam shaping mask by energizing said deflectors of the deflection means, said astigmatic compensation coil, and said focusing correction coil according to said absolute correction function, said relativistic correction function, said astigmatic correction function, and said focusing correction function respectively, based upon the energization of said first deflector such that said charged particle beam is shaped by said selected aperture.

According to the present invention, one can calibrate the astigmatic compensation coil as well as the focusing compensation coil, simultaneously to the calibration of the deflectors. Thereby, the problem of astigmatism and the field curvature of the charged particle beam is effectively eliminated when exposing a pattern on the object.

Another object of the present invention is to provide a charged particle exposure system for exposing a pattern on an object, comprising: beam source means for producing a charged particle beam and emitting the same toward said object along an optical axis; focusing means provided on said optical axis for focusing said charged particle beam upon said object; a beam shaping mask provided on said optical axis between said object and said beam source means, said beam shaping mask carrying a plurality of apertures for shaping said charged particle beam; beam deflection/shaping means provided along said optical axis between said object and said beam source means for deflecting said charged particle beam away from said optical axis such that said charged particle beam passes a selected aperture on said beam shaping mask; a beam interruption plate provided on said optical axis between said object and said beam shaping mask for interrupting said charged particle beam, said beam interruption plate having a pinhole in correspondence to said optical axis for passing said charged particle beam; deflection means provided along said optical axis between said beam source means and beam interruption plate, for selectively causing an offset in said charged particle beam away from said optical axis upon energization, for causing a turning on and turning off of said charged particle beam on said object; astigmatic correction means provided along said optical axis between said beam interruption plate and said beam source means, for compensating for astigmatism of said charged particle beam when said charged particle beam is deflected away from said optical axis; and focusing correction means provided along said optical axis between said beam interruption plate and said beam source means, for adjusting a focal point of said charged particle beam such that said focal point coincides to said beam interruption means when said charged particle beam is deflected away from said optical axis;

wherein said charged particle beam exposure system further comprises:

pattern selection means supplied with exposure data corresponding to a pattern to be exposed on said object, for producing a positional selection signal that specifies the position of a selected aperture on said beam shaping mask;

deflection signal outputting means supplied with said positional selection signal from said pattern selection means for producing a first driving signal for energizing said deflection/shaping means;

astigmatic correction signal outputting means supplied with said first driving signal from said deflection signal outputting means for producing a second driving signal for energizing said astigmatic correction means; and focusing correction signal outputting means supplied with said first driving signal from said deflection signal outputting means for producing a third driving signal for energizing said focusing correction means;

said deflection signal outputting means storing therein a first function for converting said positional selection signal to said first driving signal for driving said deflection/shaping means;

said astigmatic correction signal outputting means storing therein a second function for converting said positional selection signal to said second driving signal;

said focusing correction signal outputting means storing therein a third function for converting said positional selection signal to said third driving signal.

According to the present invention, one can expose a desired pattern on the object while shaping the charged particle beam variously, without causing a deviation in the exposed pattern that otherwise occurs due to the astigmatism or the field curvature effect.

Other objects and further features of the present invention will become apparent from the following detailed description when read in conjunction with the attached drawings.

BRIEF DESCRIPTION OF THE DRAWINGS

FIGS. 5(A) and 5(B) are diagrams showing the action of an astigmatic compensation coil used in the exposure system of FIG. 1;

FIGS. 6(A) and 6(B) are diagrams showing the displacement of the electron beam on the substrate associated with the astigmatic correction;

FIGS. 10(A) and 10(B) are diagrams respectively showing the stencil mask used in the exposure system of FIG. 1 in a cross sectional view and a plan view;

FIG. 11 shows the astigmatic aberration occurring in the electron beam that has been shaped by the stencil mask of FIGS. 10(A) and 10(B);

FIG. 16 is a diagram showing the principle of energization of the mask deflectors in the electron beam exposure system of FIG. 1 for causing a desired deflection of the electron beam;

FIG. 17 is a diagram showing a relativistic correction function describing the relationship between the driving energy of a first mask deflector and the driving energy of other first mask deflectors for achieving a desired deflection of the electron beam;

FIG. 19 is a diagram showing an absolute correction function describing the relationship between the driving energy of the first mask deflector and the deflection of the electron beam;

FIG. 23 is a diagram showing the expansion of calibration area during the optimization process of FIG. 22 for increasing the accuracy of calibration of the mask deflectors;

FIG. 26 is a diagram showing the expansion of calibration area during the optimization process of FIG. 25(A);

FIG. 31 is a diagram showing the algorithm for obtaining the driving energy of the mask deflectors in the electron beam exposure system of FIG. 1;

FIG. 32 is a diagram showing the algorithm for updating the correction coefficients;

FIG. 34 is a diagram showing the algorithm used in a third embodiment of the present invention for correcting the astigmatic compensation;

FIGS. 48(A) and 48(B) are diagrams showing the algorithm for updating the lower order terms of the relativistic correction function during the process of FIG. 46;

FIGS. 49(A) and 49(B) are diagrams showing the algorithm for updating the lower order terms of the absolute correction function during the process of FIG. 46;

DETAILED DESCRIPTION OF THE PREFERRED EMBODIMENTS

1. General Constitution of Embodied Exposure System

Figure 1:
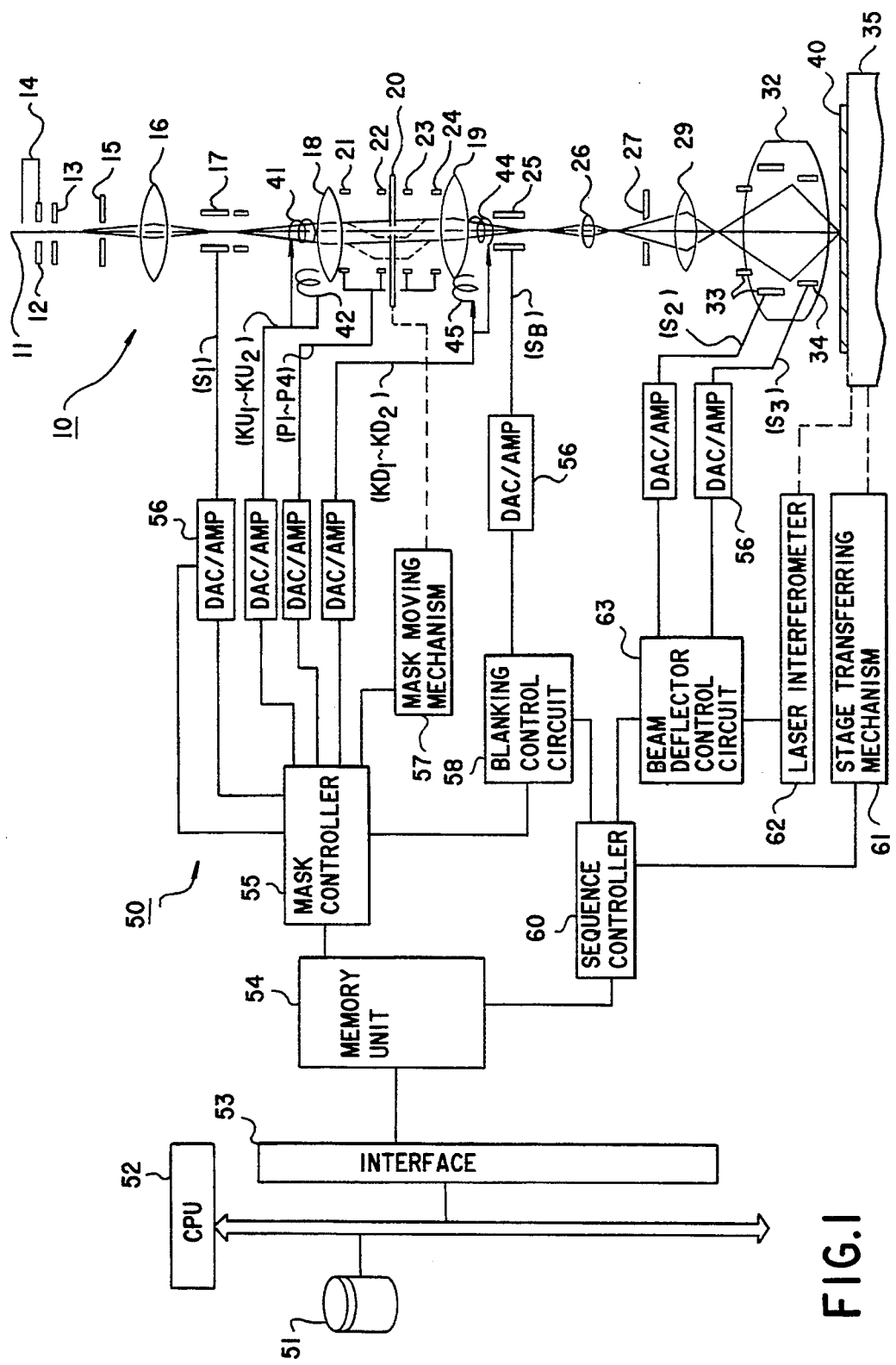
FIG. 1 is a diagram showing the construction of an electron beam exposure system according to a first embodiment of the present invention.

FIG. 1 shows schematically a charged particle beam exposure system in accordance with the present invention. The system is divided into two main units, namely, an exposure unit 10 and a control unit 50. In the exposure unit 10, an object is subjected to an exposure of a charged particle beam, wherein the beam is shaped to have a specified cross section corresponding to the shape of the aperture provided on a stencil mask. The charged particle beam thus shaped is focused upon the object after demagnification. The control unit 50, on the other hand, controls the operation of the exposure unit 10.

First, the exposure unit 10 will be described. In the exposure unit 10, the charged particle beam such as an electron beam is produced by a beam source 14, wherein the beam source 14 typically includes a cathode 11 for emitting electrons, a grid 12 for controlling the flow of electrons and an anode 13 for accelerating the electrons, and the beam source 14 emits the electrons in the form of an electron beam such that the electron beam travels toward an object or substrate 40 along an optical axis. The electron beam thus produced is passed through a beam shaping aperture 15 that shapes the electron beam to have a rectangular cross section, and the electron beam thus shaped enters into a magnetic lens 16, wherein the magnetic lens 16 converges the electron beam upon the optical axis. In correspondence to the point of convergence of the electron beam caused by the lens 16, there is provided a deflector 17 for effecting a minor correction of the beam shape as will be described later. The electron beam thus passed through the deflector 17 forms a divergent electron beam and enters into a magnetic lens 18 that forms a parallel electron beam from the divergent electron beam. The parallel electron beam thus formed impinges upon a stencil mask 20.

The stencil mask 20 is formed with a plurality of shaping apertures 10 as shown in FIGS. 10(A) and 10(B), wherein FIG. 10(A) shows the stencil mask 20 in a cross sectional view while FIG. 10(B) shows the mask 20 in a plan view. Upon passage through the aperture 10, the electron beam is shaped to have a cross section corresponding to the shape of the aperture through which the electron beam has passed. Typically, the shaping aperture 10 has a size of 300 $\mu m \times 300$ $\mu m$, and the electron beam thus shaped by the shaping aperture is projected upon the object with a demagnification. For example, the electron beam thus shaped may have a size of 3 $\mu m \times 3$ $\mu m$ on the substrate 40. The stencil mask 20 may include several tens to a few hundreds of such apertures 10.

In the electron beam exposure system of FIG. 1, the electron beam is controlled to impinge upon the stencil mask 20 substantially perpendicularly. In order to achieve this, the electron exposure system includes a first mask deflector 21 and a second mask deflector 22 both disposed at the upstream side of the mask 20 between the magnetic lens 18 and the stencil mask 20, wherein the mask deflector 21 deflects the electron beam away from the optical axis toward a selected aperture 10, while the mask deflector 22 deflects the electron beam again in a direction parallel to the optical axis of the electron optical system such that the electron beam impinges perpendicularly to the stencil mask 20. Upon passage through the selected aperture 10, the electron beam is shaped according to the shape of the selected aperture, and reaches a third mask deflector 23 that is provided below the stencil mask 20. Thereby, the mask deflector 23 deflects the electron beam that has passed through the selected aperture 10 on the stencil mask 20 toward the optical axis, and the electron beam thus deflected by the mask deflector 23 is further deflected by a fourth mask deflector 24 such that the electron beam travels toward the substrate 40 substantially coincident to the optical axis. The electron beam thus deflected away and returned again to the optical axis enters to another electron lens 19 that converges the parallel electron beam on the optical axis.

Thereafter, the electron beam passes consecutively through: a blanking electrode 25 for controlling a turning on and turning off of the electron beam on the substrate 40, a demagnification lens 26 for demagnifying the electron beam thus shaped, a round aperture 27 provided on a blanking plate for interrupting the electron beam that is offset from the optical axis, objective lenses 29 and 32 for focusing the electron beam upon the substrate 40, and a main deflector 33 and a sub-deflector 34 for causing the electron beam to move over the substrate 40, wherein the magnetic lenses 26, 29 and 32 form a demagnification optical system for projecting an image of the selected aperture 10 on the stencil mask 20 upon the substrate 40 with a predetermined rate of demagnification. The substrate 40 is held on a movable stage 35 that moves the substrate 40 in the X- and Y-directions as well as in Z-direction, wherein the X- and Y-directions define a plane perpendicular to the optical axis of the electron beam while the Z-direction is set parallel to the direction of the optical axis. The exposure unit 10 further includes coils not illustrated for precise alignment and focusing adjustment of the electron beam as usual in the electron beam exposure system.

The specific feature of the exposure unit 10 of the present invention is that a focusing compensation coil 41 as well as an astigmatic compensation coil 42 are provided on or along the optical axis at the upstream side of the stencil mask 20. The focusing compensation coil 41 is used to compensate for the field curvature effect (image plane being deformed to define a spherical surface), while the astigmatic compensation coil 42 is used for correcting the astigmatic aberration. Similarly, the exposure unit 10 of FIG. 1 includes another focusing compensation coil 44 and another astigmatic compensation coil 45 disposed at the downstream side of the stencil mask 20. The detailed structure and function of these coils will be described later.

The control unit 50 produces all the necessary signals for controlling the exposure unit 10. Referring to FIG. 1 again, the control unit 50 includes a CPU 52 for controlling the overall operation of the exposure system, and there is provided a storage device 51 for storing the data related to the pattern of the semiconductor device or integrated circuit to be exposed, mask information related to the stencil mask 20 used in the exposure unit 10, and other information necessary for the exposure process. The CPU 52 reads out the information stored in the storage device 51 and transfers the same to a data memory 54 via an interface 53 in the form of exposure data, after data decompression.

Upon receipt of the exposure data by the data memory 54, a mask controller 55 produces signals $P_1$–$P_4$ and supplies the same respectively to the first through fourth mask deflectors 21–24 after digital-to-analog conversion, wherein the first deflector 21 deflects the electron beam away from the optical axis as described previously in response to the signal $P_1$, while the second deflector 22 deflects the electron beam in the direction perpendicularly to the stencil mask 20 in response to the signal $P_2$. Further, the third deflector 23 deflects back the electron beam toward the optical axis in response to the signal $P_3$ and the fourth deflector 24 deflects the electron beam in the direction parallel to the optical axis in response to the signal $P_4$.

The mask controller 55 further produces correction signals $KU_1$ and $KU_2$ such that the correction signals $KU_1$ and $KU_2$ are supplied respectively to the coils 41 and 42 after conversion to an analog signal for energizing the same. Similarly, the mask controller produces correction signals $KD_3$ and $KD_4$ and supply the same to the coils 44 and 45 respectively, after conversion to an analog signal. In addition, the mask controller 55 produces another control signal $S_1$ and supplies the same to the deflector 17 after conversion to an analog signal in a D/A converter 56 such that the electron beam moves over the stencil mask 20 with a minute distance. Further, the mask controller 55 moves the stencil mask 20 in the X- and Y-directions via a mask moving mechanism 57, and drives the blanking electrode 25 via a blanking control circuit 58 as well as via a D/A converter 56 that cooperates with the circuit 58, wherein the D/A converter 56 produces an analog blanking control signal $S_B$.

In order to control the exposure sequence, there is provided a sequence controller 60 connected to the data memory 54, wherein the sequence controller 60 decodes the exposure sequence from the exposure data and controls the sequence of the exposure process. To the sequence controller 60 is connected a stage moving mechanism 61 for moving a stage 35, and a laser interferometer 62 detects the position of the stage 35. Further, the sequence controller controls a beam deflection controller 63 that energizes a main deflector 33 as well as a sub-deflector 34 via respective D/A converters 56 that produces drive signals $S_2$ and $S_3$.

In such an exposure system, there appears aberration associated with the deviation of the electron beam from the optical axis of the electron beam, wherein such an aberration arises from two sources, the one caused by the deflection of the electron beam by the first and second deflectors 21 and 22 located at the upstream side of the stencil mask 20 and the other caused by the deflection of the electron beam by the third and fourth deflectors 23 and 24 located at the downstream side of the stencil mask 20. As described previously, the embodiment of the present invention includes astigmatic compensation coils 42 and 45 and focusing compensation coils 41 and 44, disposed in an opposed relationship with respect to the stencil mask 20, wherein the focusing compensation coil 41 and the astigmatic compensation coil 42 are used for compensating for the aberration of the electron beam impinging upon the stencil mask 20, while the focusing compensation coil 44 and the astigmatic compensation coil 45 are used for compensating for the aberration of the electron beam that has passed through the stencil mask 20 and traveling toward the substrate 40.

FIG. 11 shows an example of the distortion of the electron beam on the substrate 40 as a result of the aberration of the electron beam occurring at both sides of the stencil mask 20. Referring to FIG. 11 showing the variable shaping process of the electron beam, an electron beam 82 having a rounded square cross section as a result of the aberration occurred in the upstream side of the stencil mask 20, is shaped by a square aperture 80 on the stencil mask 20 to have a square cross section. While the electron beam thus shaped has an exactly square cross section immediately after the shaping, the image of the electron beam projected on the substrate 40 shows a rounded edge as shown by a reference numeral 84, as a result of the aberration. Although such an effect of the aberration can be satisfactorily compensated for by activating the focusing compensation coil 44 and the astigmatic compensation coil 45 at the downstream side of the stencil mask 20, the displacement of the electron beam with respect to the aperture 80 for the variable shaping of the electron beam as indicated by a reference numeral 83, inevitably results in the exposure of an electron beam having a rounded corner, reflecting the effect of the aberration occurred in the electron beam at the upstream side of the stencil mask 20. Thus, the electron beam exposure system of FIG. 1 employs the focusing compensation coil 41 and the astigmatic compensation coil 42 on the upstream side of the stencil mask 20, in addition to the focusing compensation coil 44 and the astigmatic compensation coil 45 at the downstream side of the mask 20, for compensating for the aberration of the electron beam that impinges upon the stencil mask 20.

In the electron beam exposure system that uses the focusing compensation coil and the astigmatic compensation coil at both the upstream side and the downstream side of the stencil mask 20, there is a need for a simple adjusting process for adjusting the energization of the coils 44 and 45 as well as the coils 41 and 42 such that the distortion of the electron beam caused by such aberration is effectively suppressed. Hereinafter, the adjusting process of these compensation coils will be described, wherein the present invention achieves the adjustment in three stages, the first stage (Step I) for roughly adjusting the compensation coils 44, 45 and then 41, 42 respectively on the downstream and upstream sides of the stencil mask 20, the second stage (Step II) for adjusting the compensation coils 44 and 45 at the downstream side of the mask 20 with a high precision, and the third stage (Step III) for adjusting the compensation coils 41 and 42 at the upstream side of the mask 20 with a high precision.

2. Compensation Step I

In the compensation step I, a calibration stencil mask, which carries thereon a plurality of first calibration apertures and a plurality of second calibration apertures, is used in place of the stencil mask 20, wherein each of the first and second calibration apertures has a rectangular shape, the first calibration aperture having a smaller size and the second calibration aperture having a larger size. One may also use two separate calibration stencil masks, the first calibration stencil mask carrying solely the first calibration apertures and the second calibration stencil mask carrying solely the second calibration apertures.

In the step I, the upstream side deflectors 21 and 22 are energized such that the electron beam is projected upon the calibration stencil mask to hit a selected, first calibration aperture such that the electron beam is shaped to have a rectangular shape. Thereby, the rectangular shape of the first calibration mask is projected, after passing through the round aperture 27, upon the substrate 40. During this process, the energization of the compensation coils 44 and 45 at the downstream side of the calibration mask is adjusted such that the electron beam projects a sharp rectangular pattern corresponding to the pattern of the selected aperture on the substrate 40. The sharpness of the projected image is detected by a conventional process that uses a defector for detecting the electrons reflected from the substrate 40 upon irradiation by the electron beam. The foregoing process of calibration is repeated for different calibration apertures formed on the mask 20 at various distances from the optical axis of the electron optical system. The data indicative of the optimized drive current of the compensation coils thus obtained is stored in the memory unit 54.

Next, in a similar way as in the case of the first calibration apertures, the electron beam is projected on the calibration stencil mask to hit a selected, second calibration aperture while energizing the compensation coils 44 and 45 by the optimized drive currents, wherein the second calibration aperture has a size such that the entire electron beam passes therethrough. Because of the fact that the compensation coils 44 and 45 are energized by the optimized drive currents, the aberration caused in the electron beam after the beam has passed through the calibration stencil mask, has already been effectively eliminated in the foregoing exposure process. On the other hand, no compensation process is applied to the electron beam for the aberration that is caused in the upstream side of the mask, and the image projected on the substrate 40 generally contains the effect of such aberration. Thus, the energization of the compensation coils 41 and 42 on the upstream side of the calibration stencil mask is adjusted variously while monitoring the sharpness of the image on the substrate 40 such that the sharpness becomes maximum. The optimized drive current thus obtained is then stored in the memory unit 54, and the foregoing calibration process is repeated while selecting other calibration apertures provided with different distances from those calibration apertures employed previously. The data indicative of the optimized drive current thus obtained for the coils 41, 42, 44 and 45 is stored in the memory unit 54.

3. Compensation

Next, the second step II of the calibration process is conducted, wherein the aberration caused in the downstream side of the calibration stencil mask is eliminated with high precision in the step II by optimizing the energization of the compensation coils 44 and 45 with a high precision. In this step, the electron beam is shaped to have a cross section of 400 $\mu$m×400 $\mu$m and the electron beam thus shaped is projected upon a circular aperture provided on the calibration stencil mask. Typically, the circular aperture has a diameter of 300 $\mu$m. As a result of the shaping, the electron beam is shaped to have an exactly circular cross section.

Figure 2:
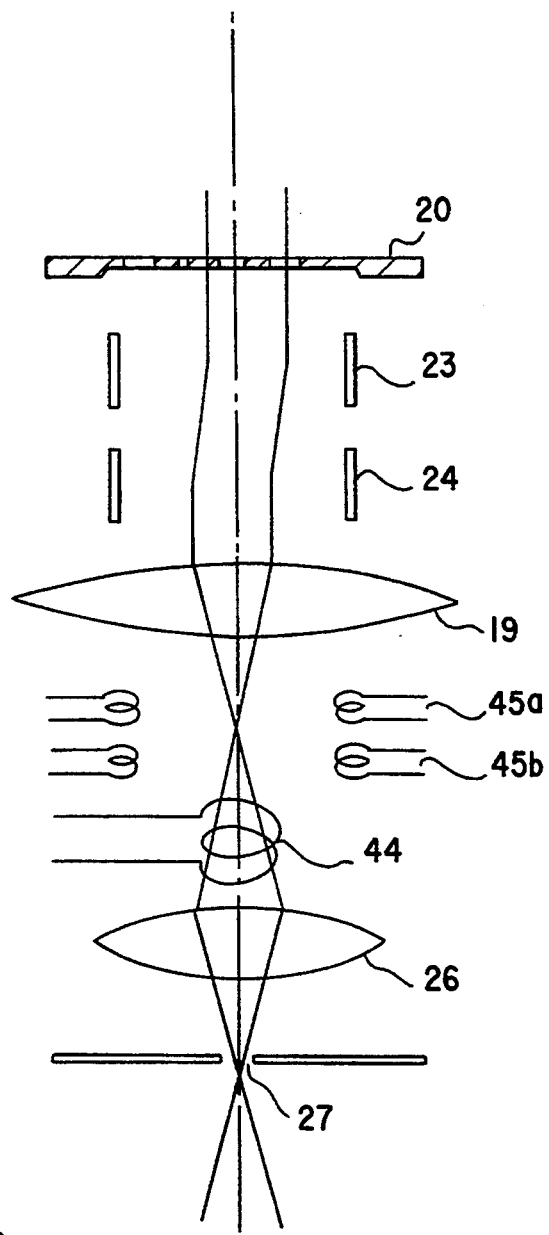
FIG. 2 is a diagram showing an essential part of the exposure system of FIG. 1.

FIG. 2 shows a schematical enlarged view of the portion of the electron beam exposure system of FIG. 1 located at the downstream side of the stencil mask 20. Referring to FIG. 2, it will be noted that the astigmatic compensation coil 45 is formed of first and second coils 45a and 45b, and the coil 44 as well as the coils 45a and 45b are disposed between the lens 19 and the lens 26.

Hereinafter, the operation of the compensation coils 44 and 45 will be described, wherein it is assumed that the electron beam shaped by the stencil mask 20 has a cross section exactly corresponding to the shape of the aperture that is used for shaping the electron beam. The electron beam shaped as such generally experiences a deformation as a result of the astigmatism associated with the beam deflection by the deflectors 23 and 24 that are located at the downstream side of the stencil mask 20, and the electron beam having such a distorted cross section is projected upon a blanking plate in which the round aperture 27 is provided.

Figure 3A:
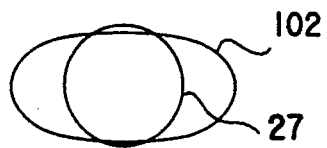
FIGS. 3(A) and 3(B) are diagrams showing the distortion of the electron beam as a result of the astigmatic aberration.
Figure 3B:
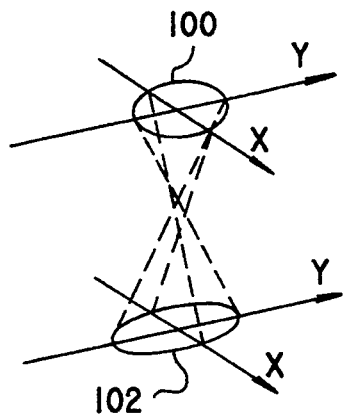

When the foregoing distortion occurs in the electron beam as a result of the astigmatism, it will be noted that an electron beam having a circular cross section 100 is deformed to have an elliptical cross section 102 on the blanking plate as indicated in FIG. 3(B), wherein the round aperture 27 on the blanking plate shapes the elliptical electron beam as indicated in FIG. 3(A). Thereby, a part of the electron beam is cut off by the blanking plate, resulting in a reduced intensity of the electron beam.

Figure 4A:
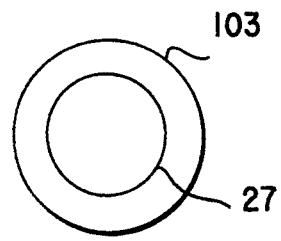
FIGS. 4(A) and 4(B) are diagrams showing the modification of the electron beam spot as a result of the field curvature effect.
Figure 4B:
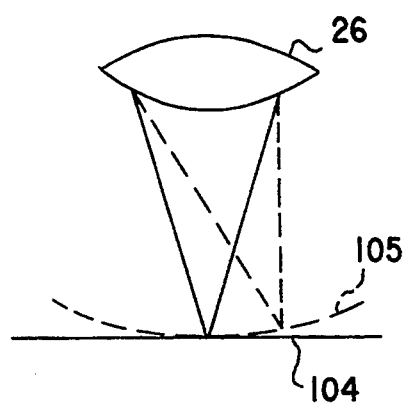

When the electron beam experiences a large deflection, on the other hand, the image surface of the electron beam, defined as a surface on which the focal point of the electron beam is located, is no longer flat but forms a curved surface 105 that is deviated from a flat plane 104 as indicated in FIG. 4(B). When the image surface of the electron beam is thus deformed, the electron beam is no longer focused properly and forms a diffused spot on the blanking plate with an increased beam diameter as indicated in FIG. 4(A). Thereby, a substantial part of the electron beam is cutoff by the round aperture 27 and the intensity of the electron beam of the substrate 40 is substantially reduced.

In order to eliminate the astigmatism, the foregoing coils 45a and 45b forming the astigmatic compensation coil 45 are energized as indicated in FIGS. 5(A) and 5(B), wherein FIG. 5(A) shows the action of the coil 45a while FIG. 5(B) shows the action of the coil 45b. In the drawings, the solid lines represent the magnetic flux and the dotted arrows show the direction of intentional deformation of the electron beam that is created to cancel out the deformation of the electron beam caused by the astigmatism. The astigmatic compensation step is achieved as follows.

(1) A current flowing through the astigmatic compensation coil is changed slowly such that the cross section of the electron beam changes from an elliptical shape 102 shown in FIG. 6(A) to a circular shape 102' shown also in FIG. 6(A). Generally, such a change in the beam cross section causes an associated displacement of the electron beam as indicated by an arrow in FIG. 6(A).

(2) Next, the original electron beam position is restored in coincidence to the round aperture 27 by slightly adjusting the energization of the deflectors 21–24 such that the electron beam returns to the original position as indicated by an arrow in FIG. 6(B). Associated with the energization of the deflectors 21–24, there may occur a slight deviation in the traveling direction of the electron beam with respect to the optical axis. When such a deviation of the electron beam occurs, the electron beam spot deviates also on the substrate 40. Such a deviation of the beam direction is compensated for by adjusting the deflectors further, such that the beam intensity and hence the beam current becomes maximum on the substrate 40 and such that the deviation of the beam spot on the substrate 40 becomes minimum.

Figure 7:
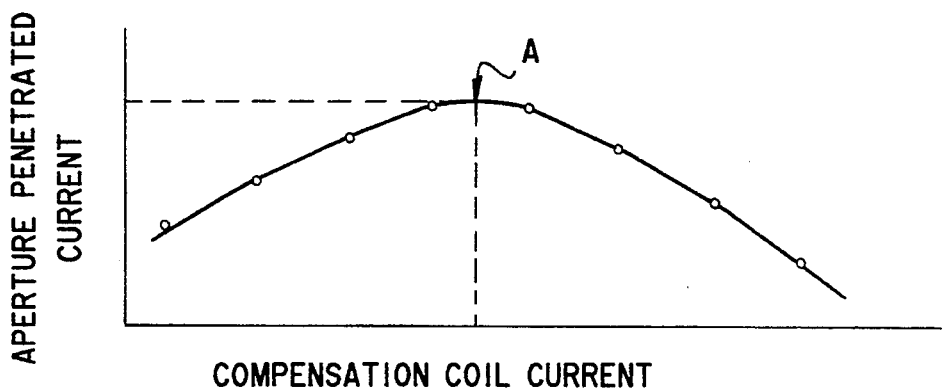
FIG. 7 is a diagram showing the optimization of the driving energy of the compensation coil during the astigmatic compensation process.

(3) Next, the relationship between the drive current of the compensation coils 45a and 45b and the intensity of the electron beam that arrives at the substrate 40 is determined for each of the apertures while repeating the steps (1) and (2) as indicated in FIG. 7, and an optimized drive current is obtained such that the beam intensity becomes maximum at the optimized drive current.

Figure 8:
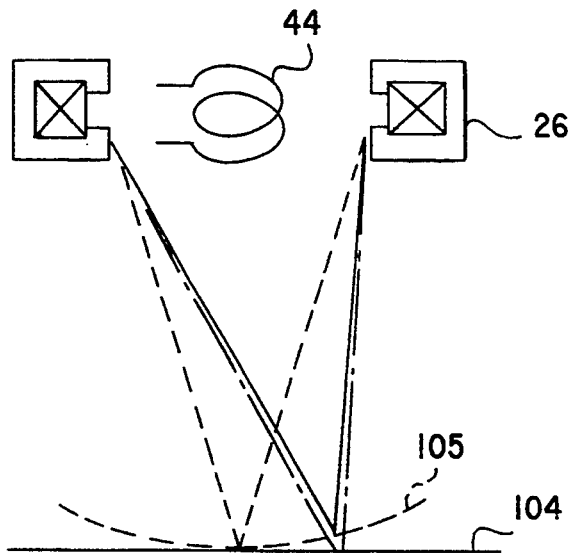
FIG. 8 is a diagram showing the action of a field curvature compensation coil used in the exposure system of FIG. 1.

Next, the compensation process for compensating for the field curvature effect is conducted by using the focusing compensation coil 44 shown in FIGS. 1 and 2. As already noted, the focal point of the electron beam moves over the curved surface 105 upon deflection of the electron beam away from the optical axis by the mask deflectors 21–24 as shown in FIG. 4(B), wherein the focusing compensation coil 44 modifies the focal length of the electron lens 26 as shown in FIG. 8 such that the electron beam is properly focused upon the plane 104 that is coincident to the blanking plate in which the round aperture 27 is formed. More specifically, the strength of the electron lens 26 is decreased for those electron beams that passes the lens 26 obliquely with respect to the optical axis. The compensation steps are similar as in the case of astigmatic compensation and includes the following steps.

Figure 9A:
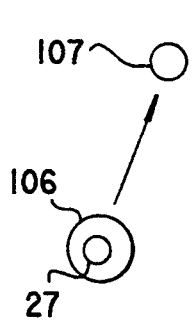
FIGS. 9(A) and 9(B) are diagrams showing the displacement of the electron beam on the substrate associated with the correction of the field curvature effect.

(1') The drive current of the coil 44 is changed slightly such that the electron beam is properly focused upon the blanking plate that carries the round aperture 27 thereon. As a result of such a change of the focusing of the electron beam, the electron beam may shift by a minute distance as shown in FIG. 9(A), wherein FIG. 9(A) shows the effect of decrease of the beam spot diameter of an electron beam 106 upon such a focusing adjustment as well as the shift of the electron beam associated with such a focusing adjustment. In FIG. 9(A), it will be noted that the electron beam shows a beam spot 107 of reduced beam diameter as compared with the beam 106, wherein the beam spot 107 is displaced with respect to the beam spot 106 and hence with respect to the round aperture 27 as indicated by an arrow.

Figure 9B:
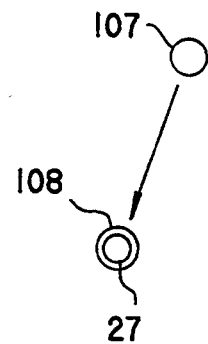

(2') The electron beam 107 thus displaced from the round aperture 27 in the step (1') is restored to the original beam position designated by a numeral 108 and coincident to the round aperture 27 as shown in FIG. 9(B), by energizing the mask deflectors 21-24 further. Such an adjustment of the energization of the deflectors 21-24 results in a slight change in the traveling direction of the electron beam, wherein the adjustment is conducted while monitoring the intensity of the electron beam on the substrate 40 such that the intensity becomes maximum and such that the amount of the beam shift detected on the substrate 40 becomes minimum.

(3') In this step, the relationship between the intensity of the electron beam arriving at the substrate 40 and the driving current of the focusing compensation coil 44 is obtained while changing the driving current variously, by repeating the steps (1') and (2') a number of times. The relationship thus obtained is plotted similarly to the curve of FIG. 7, and the optimized driving current is obtained in correspondence to the maximum of the electron beam strength.

The above steps (1) to (3) and the steps (1') to (3') are repeated for each of the apertures on the stencil mask, and the compensation current data thus obtained are stored in the data memory 54 and the storage device 51 that form a part of the control unit 50. Thus, when a specific aperture on the stencil mask 20 is selected, the compensation coils 44 and 45 are energized with respective, optimized drive currents that are obtained as a function of the location of the selected aperture on the mask 20.

4. Compensation Step III

Next, the compensation step III for optimizing the energization of the compensation coils 41 and 42 at the upstream side of the stencil mask 20 will be described.

Figure 12A:
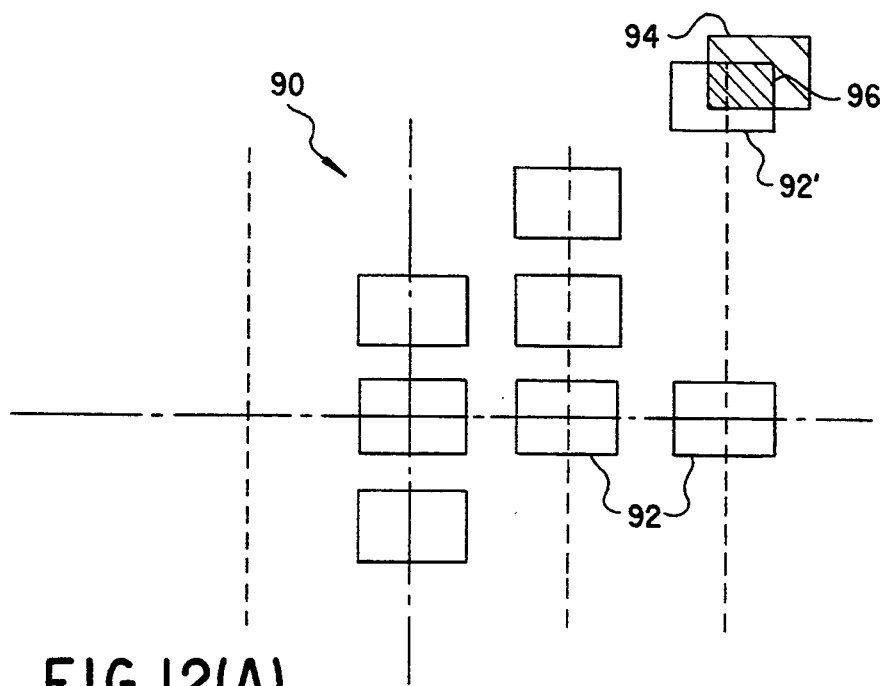
FIG. 12(A) is a diagram showing the principle of a variable beam shaping that is conducted in the electron beam exposure system of FIG. 1.
Figure 12B:
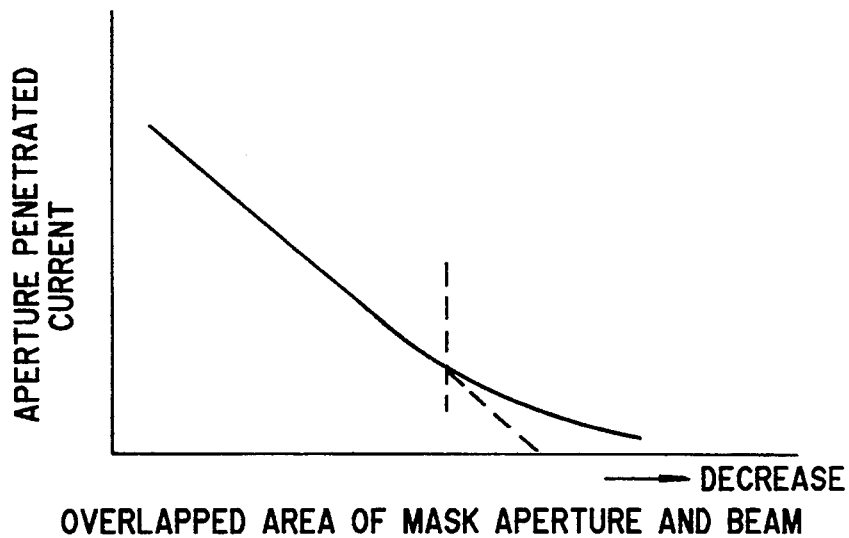
FIG. 12(B) is a diagram showing the change of the beam current at the substrate as a result of the variable shaping of the electron beam.

In the step III for the coils 41 and 42, a calibration stencil mask 90 shown in FIG. 12(A) is employed, wherein the mask 90 carries thereon a number of rectangular calibration apertures 92. The apertures 92 are formed within the area of the mask that can be covered by deflecting the electron beam. The electron beam is deflected to hit a selected aperture such as an aperture 92' shown in FIG. 12(A) and the intensity of the electron beam arriving at the substrate 40 after passing through the round aperture 27 is measured by detecting the substrate current while moving the electron beam gradually by energizing the mask deflectors 21-24. It should be noted that the intensity of the electron beam changes in response to the movement of the electron beam, depending upon the overlapping of the electron beam with the aperture 92' as indicated by a reference numeral 96 and hatched in FIG. 12(A). It should be noted that the electron beam has a rectangular cross section 94. As the electron beam 96 overlapping with the selected aperture 92' is projected upon the substrate 40, a beam current is caused to flow through the substrate 40 in correspondence to the electron beam reaching the substrate 40, wherein the beam current changes with the overlapping of the electron beam 94 with the aperture 92' as shown in FIG. 12(B). Referring to FIG. 12(B), it will be noted that the beam current decreases generally linearly with decreasing overlap area 96 except for a region wherein the overlap area 96 is very small.

Figure 14:
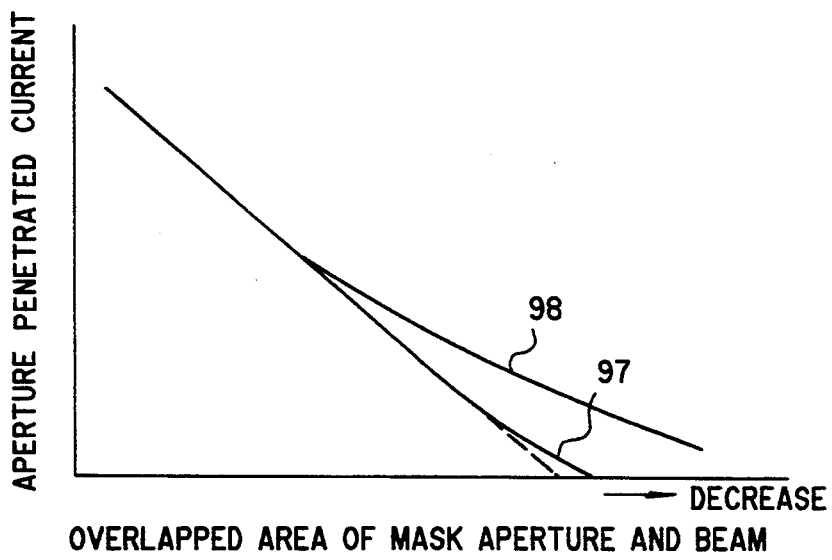
FIG. 14 is another diagram showing the effect of the beam deformation on the beam current during the variable shaping of the electron beam.
Figure 13A:
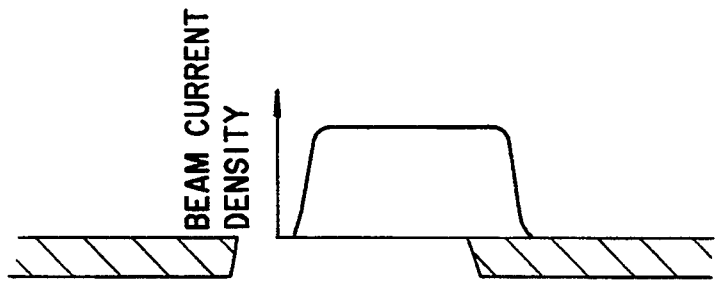
FIGS. 13(A) and 13(B) are diagrams showing the effect of the beam deformation on the beam current during the variable shaping of the electron beam.
Figure 13B:
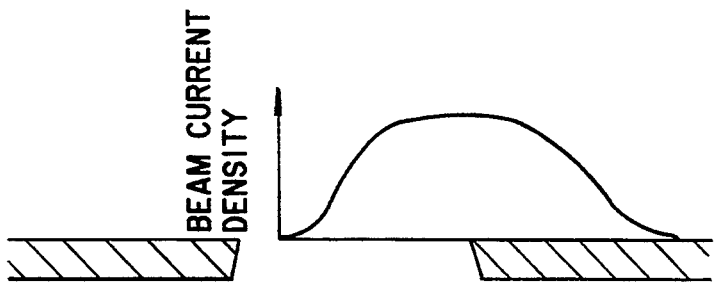

When the electron beam 94 shown in FIG. 12(A) has a sharp boundary in correspondence to the state wherein the electron beam is properly focused upon the stencil mask 90, the beam current changes sharply upon movement of the electron beam 94 over the stencil mask 90 with respect to the selected aperture 92', as indicated in FIG. 13(A). In correspondence to this, the beam current changes substantially linearly with the overlap area 96 as indicated in FIG. 14 by a continuous line 97. On the contrary, when the electron beam is diffuse on the stencil mask 90, there occurs a gradual change in the beam current as indicated in FIG. 13(B) in correspondence to the deviation from the linearly as indicated by a line 98 in FIG. 14. Thus, the energization of the focusing compensation coil 41 and the astigmatic compensation coil 42 is optimized such that the deviation from linearity shown in FIG. 14 is minimized.

The optimized drive currents for the coils 41 and 42 are obtained for each of the apertures on the mask 90, and based upon the optimized drive currents, the optimized driving currents of the coils 41 and 42 are obtained as a function of the location of the apertures on the mask 90. Thus, when a specific aperture on the stencil mask 20 is selected, the compensation coils 41 and 42 are energized by the optimized drive current.

5. Other Improvements

In the electron beam exposure system of FIG. 1, it should be noted that the magnetic lens 18 is disposed above the mask deflectors 21 and 22. Similarly, the magnetic lens 19 is disposed below the mask deflectors 23 and 24. Further, the compensation coils 41 and 42 are disposed above the magnetic lens 18 while the compensation coils 44 and 45 are disposed below the magnetic lens 19. As a result of the foregoing construction of the electron optical system, the electron beam exposure system inevitably has an increased length of the electron beam path, while such an increased length of the electron beam path causes a problem such as the electron beam is susceptible to external disturbances caused by stray magnetic field or charged contaminants depositing inside the evacuated column. In view of the foregoing problems, it is desired to construct the overall length of the electron optical system for the part extending from the coils 41 and 42 to the coils 44 and 45 as compact as possible.

Figure 15:
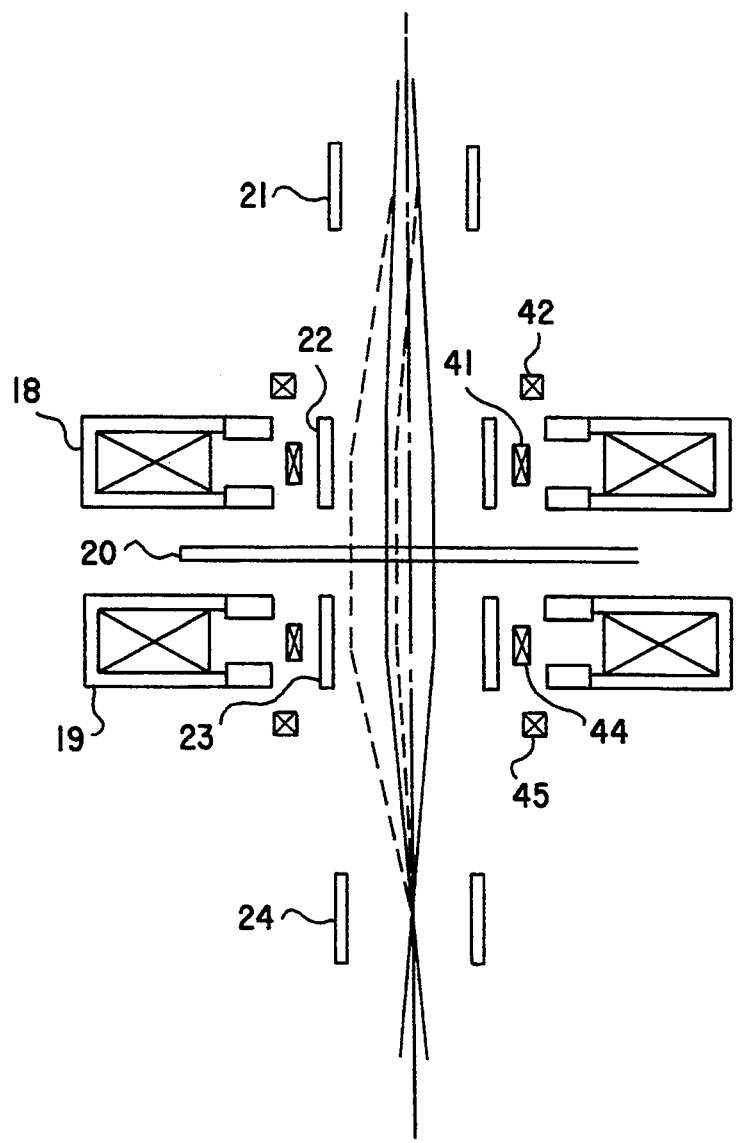
FIG. 15 is a diagram showing a modification of the arrangement of the compensation coils in the electron beam exposure system of FIG. 1.

FIG. 15 shows an improvement of the electron optical system for attaining the foregoing object, wherein the magnetic lenses 18 and 19 are disposed immediately adjacent to the stencil mask 20 and the mask deflector 22 is provided inside the lens 18. Similarly, the mask deflector 23 is provided inside the lens 19. In addition, the focusing compensation coil 41 is disposed inside the lens 18, the focusing compensation coil 44 disposed inside the lens 19. By constructing the electron optical system as such, one can reduce the length of the optical path of the electron beam substantially.

6. Calibration of the Mask Deflectors

Next, the second embodiment of the present invention for calibrating the electron beam exposure system of FIG. 1 will be described. In the electron exposure system of FIG. 1, it is necessary to obtain the relationship between the driving energy of the mask deflectors 21-24 and the deflection of the electron beam prior to the electron beam exposure process, such that the electron beam deflected by the deflector 21 is further deflected parallel to the optical axis by the deflector 22 and hits the selected aperture on the stencil mask 20, and such that the electron beam thus shaped by the mask 20 is deflected by the mask deflector 23 toward the optical axis and further by the mask deflector 24 in alignment with the optical axis. Further, it is necessary to obtain the optimum driving energy of the compensation coils 41 and 42 or 44 and 45 in advance to the actual exposure process. As the aberration of the electron beam is caused as a result of the deviation of the electron beam from the optical axis, which in turn is caused as a result of the deflection of the beam by the mask deflectors 21-24, it is necessary to calibrate also the compensation coils as a function of the driving energy of the mask deflectors such that the driving energy of the compensation coils is correlated to the driving energy of the mask deflectors.

Conventionally, the driving energy of the mask deflectors 21-24 has been determined according to the relationship shown in FIG. 16, wherein $BSX_i$ and $BSY_i$ ($i=1-4$) represent the driving energies of a mask deflector i respectively for deflecting the electron beam in the X-direction and for deflecting the electron beam in the Y-direction. The driving energy shown in FIG. 16 represents the driving current of the mask deflector when an electromagnetic deflector is used for the mask deflector 21-24. When an electrostatic deflector is used for the same purpose, the driving energy of FIG. 16 represents the driving voltage that is applied to the electrostatic deflector. Further, the X- and Y-coordinates of the electron beam on the stencil mask 20 is represented as xm and ym, respectively. In other words, the equation of FIG. 16 shows the relationship between the driving energy of the deflector and the amount of deflection of the electron beam in the form of a third order polynomial, wherein the twenty coefficients $Obsx_i, \ldots Obsy_i, \ldots$ forming a matrix in FIG. 16 represent the coefficient of the polynomial expansion. The coefficients $Obsx_i, \ldots, Obsy_i, \ldots$ are hereinafter called as correction coefficients. Thus, when conducting a block exposure process by using the electron beam exposure system of FIG. 1, it is necessary to determine the twenty correction coefficients $Obsx_i, \ldots, Obsy_i, \ldots$ in advance to the actual exposure process.

When deflecting the electron beam in the electron beam exposure system of FIG. 1 by energizing the mask deflectors 21-24, it is necessary to restore the electron beam, which has been deflected away from the optical axis by the deflector 21, again on the optical axis by energizing the rest of the deflectors 22-24. Thus, the drive energies $BSX_i$ and $BSY_i$ ($i=2-4$) for the mask deflectors 22-24 cannot be independent from the drive energies $BSX_1$ and $BSY_1$ for the mask deflector 21, as already described. In other words, once the driving energies $BSX_1$ and $BSY_1$ of the mask deflector 21 are determined as a result of selection of a specific aperture on the stencil mask 20, the driving energies $BSX_i, BSY_i$ ($i=2-4$) of the other mask deflectors 22-24 are determined uniquely according to the relationship of FIG. 16.

The coefficients $Obsx_i, Gbsx_i, \ldots, Obsy_i, Gbsy_i, \ldots$ for the mask deflectors 22-24 ($i=2-4$) are determined based upon the relationship shown in FIG. 17, which describes the relationship between the driving energies xma and yma of the mask deflector 21 and the driving energies $BSX_i$ and $BSY_i$ ($i=2-4$) of the remaining mask deflectors 22-24. In this process, the driving energies xma and yma are changed variously in correspondence to a plurality of calibration points, and, in each calibration point, the driving energies $BSX_i$ and $BSY_i$ are changed in search of a set of driving energies that provides a maximum intensity for the electron beam that arrives at the substrate 40 via the round aperture 27. The intensity of the electron beam on the substrate 40 is measured by detecting the beam current that flows through the substrate 40. Once the foregoing set of the driving energies $BSX_i$ and $BSY_i$ is obtained for ten such calibration points, the equation of FIG. 17 can be solved with respect to the twenty coefficients $Obsx_i, \ldots, Obsy_i, \ldots$ designated collectively as A. It should be noted that such a calibration process is carried out for each of the mask deflectors 22-24.

Figure 18:
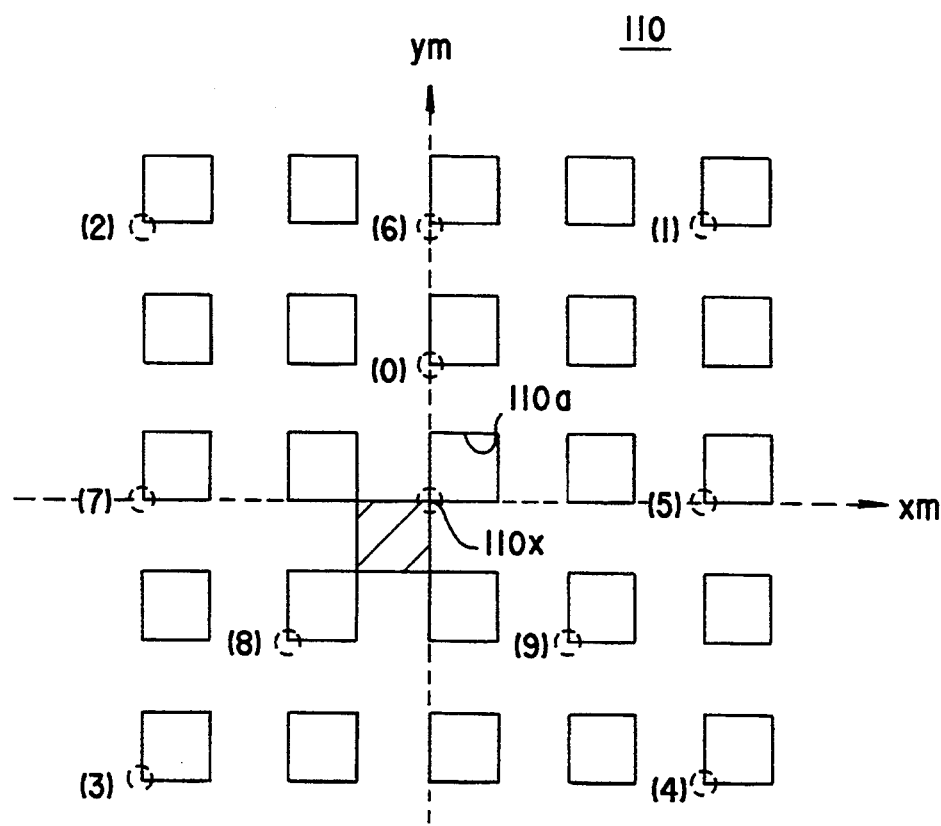
FIG. 18 is a diagram showing the construction of a calibration mask used in the electron beam exposure system of FIG. 1 for calibrating the deflection of the electron beam.

When the relative relationship of the driving energy of the mask deflectors 22-24 is thus obtained with respect to the driving energy of the mask deflector 21, the mask deflector 21 is driven further such that the electron beam passes through ten calibration apertures (0)-(9) that are formed on a calibration stencil mask 110 shown in FIG. 18. More specifically, the mask deflector 21 is driven by the drive energies $BSX_1$ and $BSY_1$ according to a relationship shown in FIG. 19 such that the electron beam passes through a selected calibration aperture 110a shown in FIG. 18, wherein the aperture 110a has a coordinate (xm, ym) on the calibration stencil mask 110. In FIG. 19, the coefficients Omax, Gmax, . . . , Omay, Gmay, . . . designated collectively as D are called mask area correction coefficient. During this process, the drive energies $BSX_1$ and $BSY_1$ are adjusted such that the intensity of the electron beam arriving at the substrate 40 via the round aperture 27 becomes maximum. Such a relationship is obtained for ten calibration apertures sufficient for determining the mask area correction coefficients Omax, Gmax, . . . , Omay, Gmay, . . . , and the mask area correction coefficients are determined by solving the equation of FIG. 19. As a result of such a process, an absolute calibration function, describing the absolute deflection (xm, ym) of the electron beam as a function of the driving energy ($BSX_i$, $BSY_i$), is obtained as represented in FIG. 19. In FIG. 18, each of the calibration apertures (0)-(9) has a rectangular shape and disposed on the calibration stencil mask 110 such that the coefficients Omax, Gmax, . . . , Omay, Gamy, . . . of FIG. 19 is determined with sufficient precision.

Figure 20:
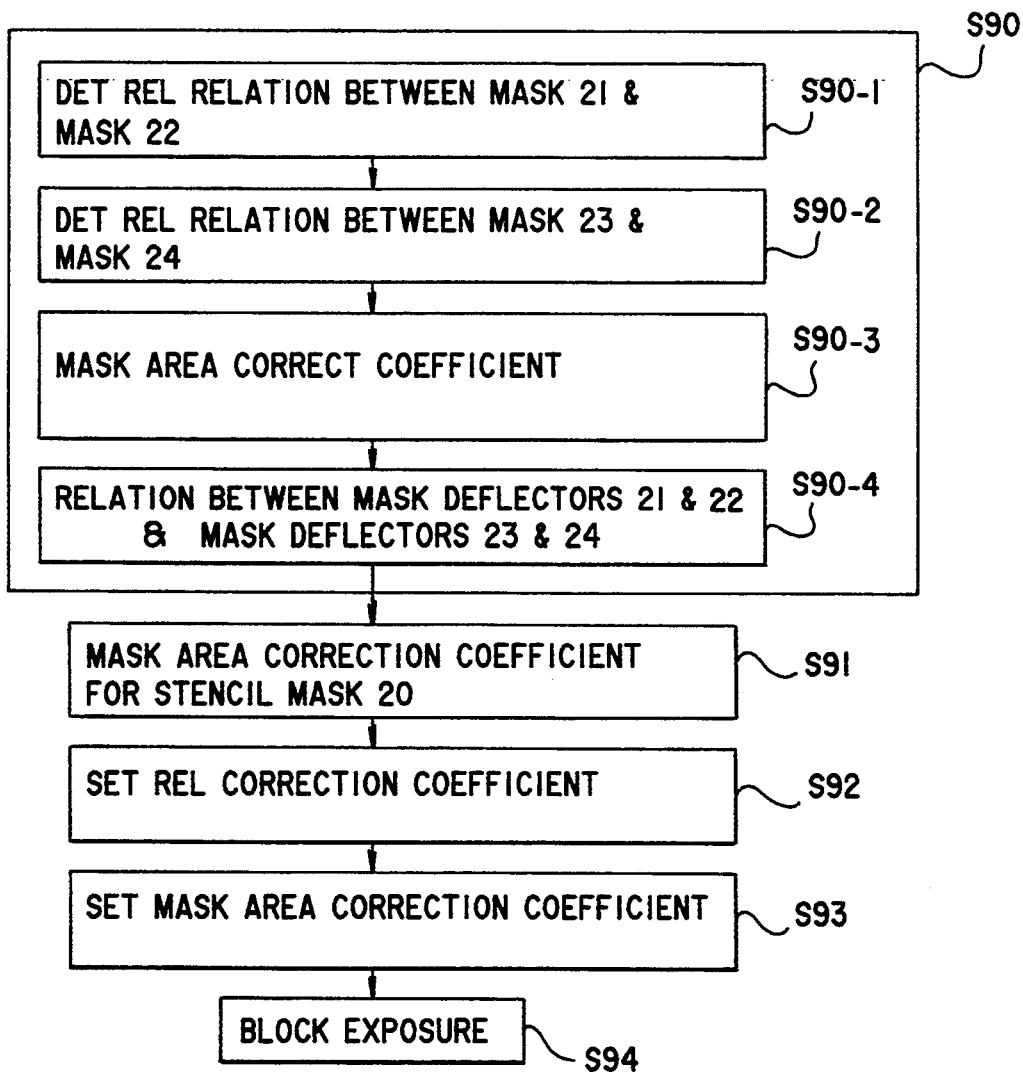
FIG. 20 is a flowchart showing the adjusting process of the mask deflectors achieved in a second embodiment of the present invention.

In the present embodiment, the calibration of the mask deflectors 21-24 is conducted according to a process S90 shown in the flowchart of FIG. 20 for minimizing the time needed for the calibration and for maximizing the throughput of exposure.

Referring to FIG. 20, the mask deflectors 21 and 22 are energized simultaneously in a step $S90_{-1}$ to cause a deflection of the electron beam, and the relative relationship of the driving energy between the mask deflector 21 and the mask deflector 22 is determined according to a relationship shown in FIG. 17, such that the intensity of the electron beam arriving at the substrate 40 after passing through the round aperture 27 becomes maximum. In FIG. 17, it should be noted that the quantities xma and yma correspond respectively to the drive voltages $BX_1$ and $BY_1$ of the mask deflector 21, as mentioned previously. In the step $S90_{-1}$, the stencil mask 20 or the calibration mask 110 is removed from the optical path of the electron beam, and the relativistic correction coefficients $Obsx_2, Gbsy_2, \ldots, Obsy_2, Gbsy_2, \ldots$ shown in FIG. 17 are determined by deflecting the electron beam to a plurality of virtual calibration points (0)–(9) by means of the mask deflector 21 and by solving the equation of FIG. 17 subsequently. Although the calibration points (0)–(9) are not necessarily be coincident to the calibration apertures (0)–(9) on the mask 110 of FIG. 18, the same designation is employed for the sake of mere convenience.

Next, a step $S90_{-2}$ is conducted after the step $S90_{-1}$, wherein the mask deflectors 23 and 24 are energized simultaneously to cause a deflection of the electron beam, wherein the relative driving energy of the mask deflectors 23 and 24 is changed variously such that the intensity of the electron beam that arrives at the substrate 40, passing through the round aperture 27, becomes maximum. Based upon the relative driving energy thus obtained for the mask deflectors 23 and 24, the relativistic correction coefficients $Obsx_4$, $Gbsx_4$, ..., $Obsy_4$, $Gbsy_4$, ... are obtained by solving the equation of FIG. 17. In this case, the parameters xma and yma represent the driving energy of the mask deflector 23, and the driving energy of the mask deflector 24 is represented as a function of the driving energies xma and yma.

Next, in a step $S90_{-3}$, the calibration mask 110 is set in the path of the electron beam, and the mask deflector 21 is energized to cause a deflection of the electron beam to a selected calibration aperture (0)–(9) on the mask 110. Simultaneously, the mask deflector 22 is energized as a function of the driving energy ($BSX_1$, $BSY_1$) of the mask deflector 21 according to the relationship of FIG. 17, and the electron beam is caused to pass successively through the foregoing calibration apertures (0)–(9) on the calibration mask 110. Simultaneously, the intensity of the electron beam arriving at the substrate 40 via the round aperture 27 is measured, and the optimized set of driving energy $BSX_1$ and $BSY_1$ of the deflector 21 that maximizes the intensity of the electron beam is searched for with respect to each of the calibration apertures (0)–(9). Based upon the optimized driving energy thus obtained, the mask area correction coefficients Omax, Gmax, ..., Omay, Gmay, ... are determined from the equation of FIG. 19.

Further, in a step $S90_{-4}$ of FIG. 20, the mask deflectors 21–24 are energized simultaneously according to the relationship obtained previously, wherein the mask deflector 21 is energized according to the relationship of FIG. 19 by using the mask area correction coefficients Omax, Gmax, ..., Omay, Gmay, ... determined in the step $S90_{-3}$, for selecting a calibration aperture (0)–(9) on the calibration mask 110. Further, the mask deflector 22 is energized according to the relationship of FIG. 17 with the relativistic correction coefficients $Obsx_2$, $Gbsx_2$, ..., $Obsy_2$, $Gbsy_2$, ... determined in the step $S90_{-1}$. Furthermore, the mask deflector 24 is energized according to the relationship of FIG. 17 with the relativistic correction coefficients $Obsx_4$, $Gbsx_4$, ..., $Obsy_4$, $Gbsy_4$ ... that are obtained in the step $S90_{-2}$. Thereby, the relative driving energy between the mask deflector 21 and the mask deflector 23 is determined in the step $S90_{-4}$ while changing the driving energy of the mask deflector 23 and hence the mask deflector 24 with respect to the mask deflector 21 variously in search of the maximum intensity of the electron beam that arrives at the substrate 40 after passing through the round aperture 27. Thereby, the relativistic coefficients $Obsx_3$, $Gbsx_3$, ..., $Obsy_3$, $Gbsy_3$, ... are obtained. Once the coefficients $Obsx_3$, $Gbsx_3$, ..., $Obsy_3$, $Gbsy_3$, ... are obtained as such, the driving energy of the mask deflector 22–24 is determined with respect to the driving energy of the mask deflector 21 according to the relationship of FIG. 19, and one can deflect the electron beam to a desired aperture on the stencil mask 110 and hence 20 by energizing the mask deflector 21 and simultaneously the rest of the mask deflectors 22–24.

In the electron beam exposure system of FIG. 1, the mask area correction coefficient changes when the stencil mask 20 or 110 is moved laterally in the direction perpendicular to the optical axis. Thus, the actual electron beam exposure process includes an updating process of the mask area correction coefficients that is represented in FIG. 20 by a step S91, wherein the step S91 is carried out whenever the calibration mask 110 is replaced by the stencil mask 20 after the calibration process in the steps $S90_{-1}$–$S90_{-4}$ are completed.

In the step S91, the mask deflector 21 is energized according to the relationship of FIG. 19 by using the mask area correction coefficients, and the driving energy of the deflector 21 is controlled such that the electron beam hits a plurality of calibration apertures that are provided on the stencil mask 20 together with the beam shaping apertures. In this process, the driving energy $BSX_1$ and $BSY_1$ of the mask deflector 21 is modified variously such that the intensity of the electron beam arriving at the substrate 40 becomes maximum, and the mask area correction coefficients Omax, Gmax, ..., Omay, Gmay, ... are updated based upon the adjusted driving energy. Further in a step S92, the relativistic correction coefficients $Obsx_i$, $Gbsx_i$, ..., $Obsy_i$, $Gbsy_i$, ... are set in the mask controller 55, and the updated mask area correction coefficients are set in the mask controller 55 in a step S93. Further, an exposure of a pattern is conducted upon the substrate 40 in a step S94 by using the correction coefficients thus set in the mask controller 55.

Figure 21:
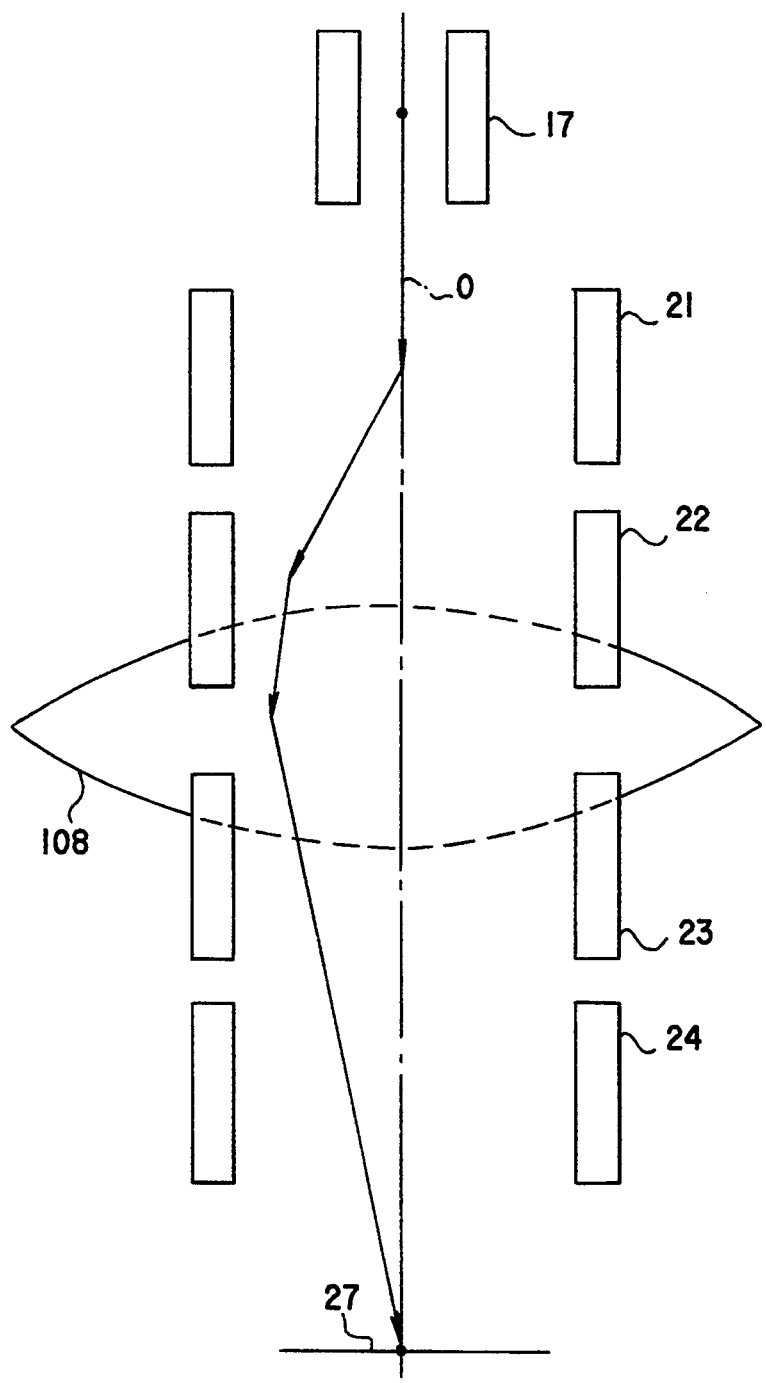
FIG. 21 is a diagram showing the deflection of the electron beam during an optimization process of the mask deflectors of FIG. 20.

FIG. 21 shows schematically the deflection of the electron beam caused in the step $S90_{-1}$.

Referring to FIG. 21, it will be noted that there is no stencil mask provided in the optical path of the electron beam, and only the mask deflectors 21 and 22 are energized in this step. Thereby, the electron beam thus deflected is deflected back on the optical axis designated as O in FIG. 21 as a result of the focusing action of an electron lens 108 that corresponds to the electron lens 19. Although the lens 108 is provided between the deflectors 22 and 23, contrary to the construction of the electron beam exposure system of FIG. 1, the difference in the operation of the electron beam exposure system arising from such a different construction is not substantial. By using a single electron lens 108 in place of two electron lenses 18 and 19, one can reduce the length of the column of the electron beam exposure system. As a result of the focusing action of the electron lens 108, the electron beam is focused at a position on the optical axis O corresponding to the blanking plate on which the round aperture 27 is formed.

Figure 22:
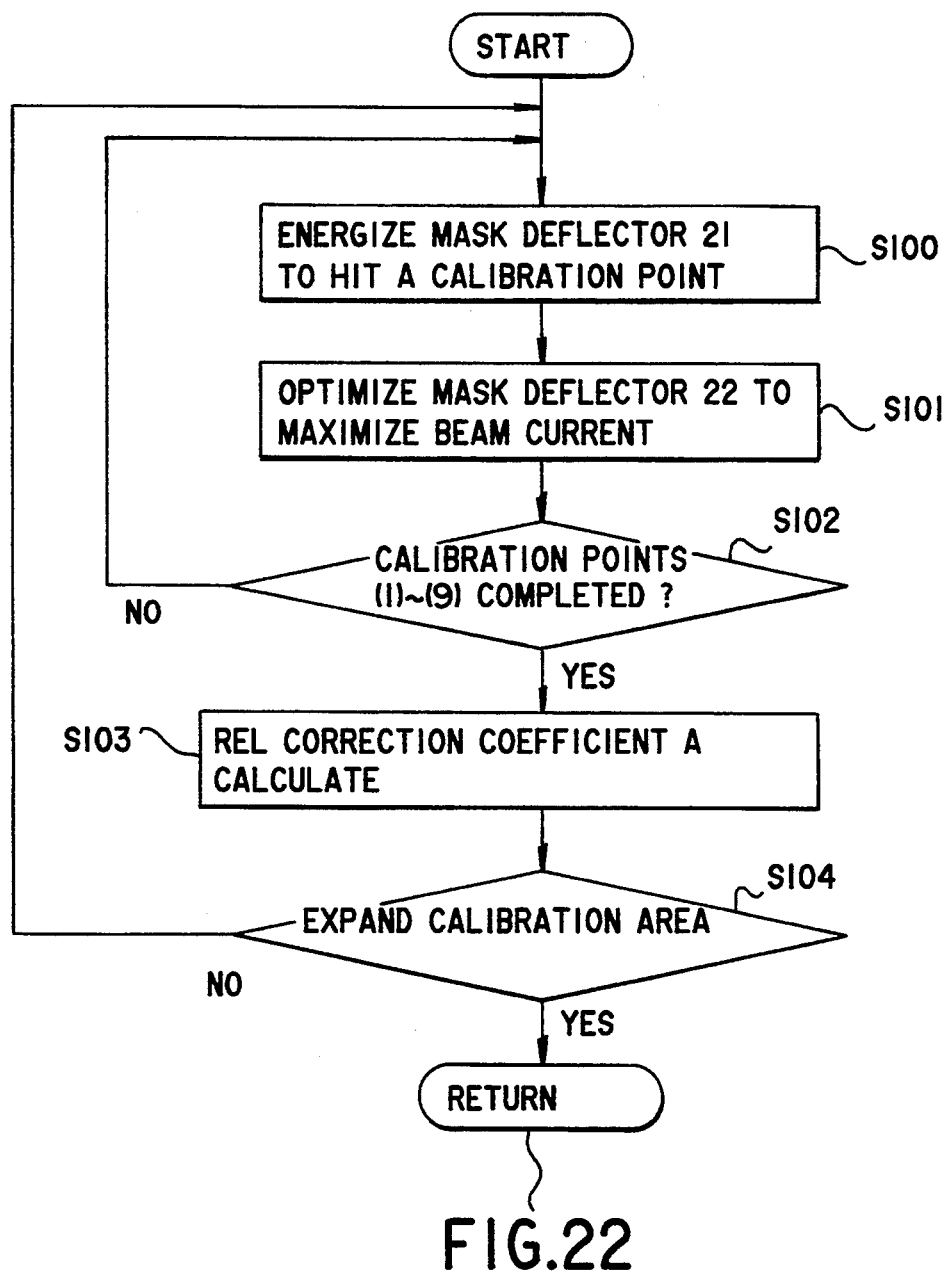
FIG. 22 is flowchart showing a process included in the process of FIG. 20.

FIG. 22 shows the flowchart for the step $S90_{-1}$, wherein the deflector 21 is energized in a step S100 such that the electron beam is deflected by a deflection angle corresponding to the first calibration point (0) described previously. Next, in a step S101, the driving energy of the mask deflector 22 is adjusted such that the intensity of the electron beam arriving at a Faraday cup provided on the substrate 40 after passing through the round aperture 27, is maximized. Further, a next calibration point is selected in a step S102, and the steps S100 and S101 are repeated. When it is decided that the driving energy of the mask deflector 22 is optimized with respect to all the calibration points (0)–(9), the relativistic correction coefficients A is determined in a step S103 by solving the equation of FIG. 17. Further, by increasing the area for the calibration points (0)–(9) gradually in a step S104 as indicated in FIG. 23, the accuracy of the relativistic coefficients is increased.

Figure 24:
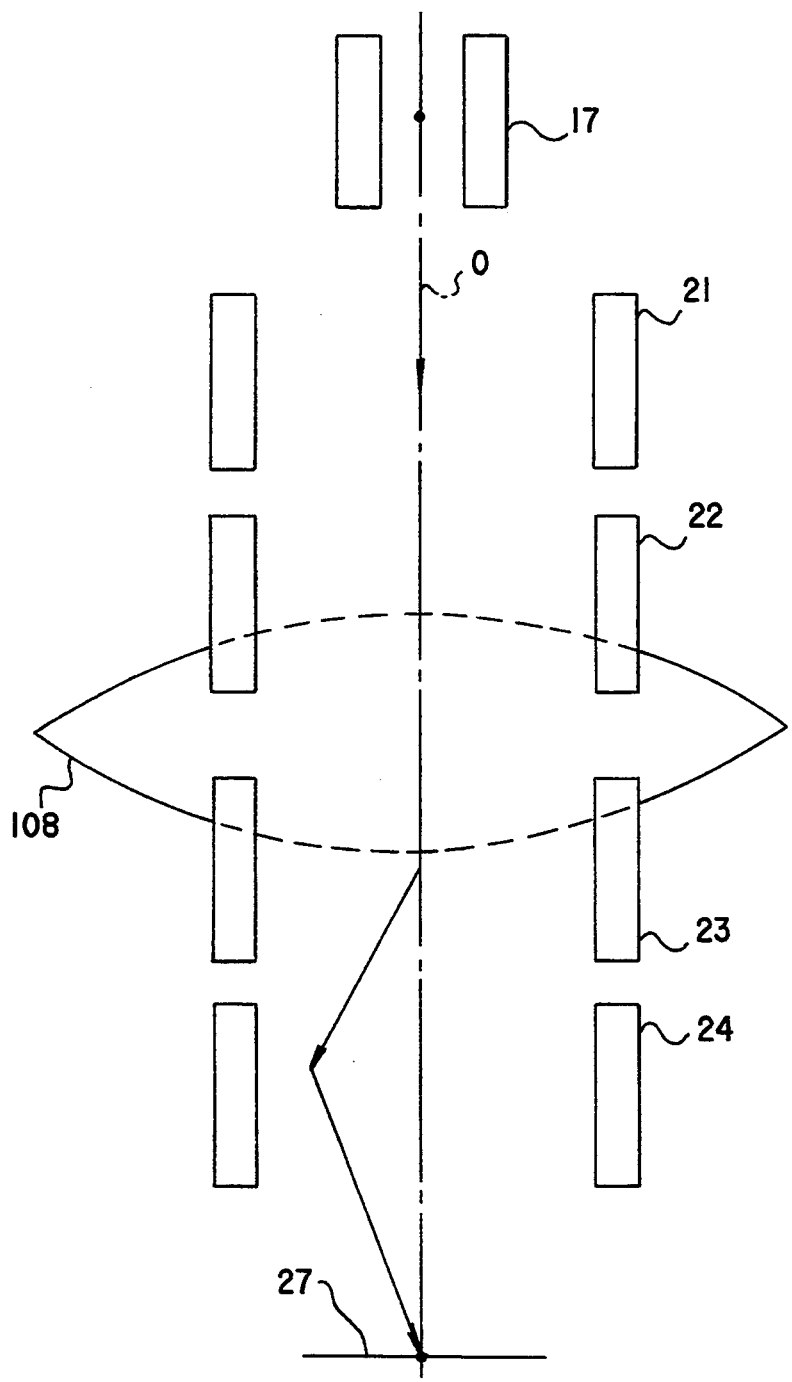
FIG. 24 is a diagram showing the deflection of the electron beam during an optimization process of the mask deflector of FIG. 20.

FIG. 24 shows the deflection of the electron beam in the step $S90_{-2}$ of FIG. 20.

Referring to FIG. 24, the electron beam traveling along the optical axis O is deflected to a selected calibration point such as the calibration point (0) by means of the mask deflector 23, and the electron beam thus deflected is deflected back to the round aperture 27 located on the optical axis O by the mask deflector 24. Thereby, the driving energy of the mask deflector 24 is adjusted such that the intensity of the electron beam arriving at the substrate 40 after passing through the round aperture 27 is maximized.

Figures 25A, 25B:
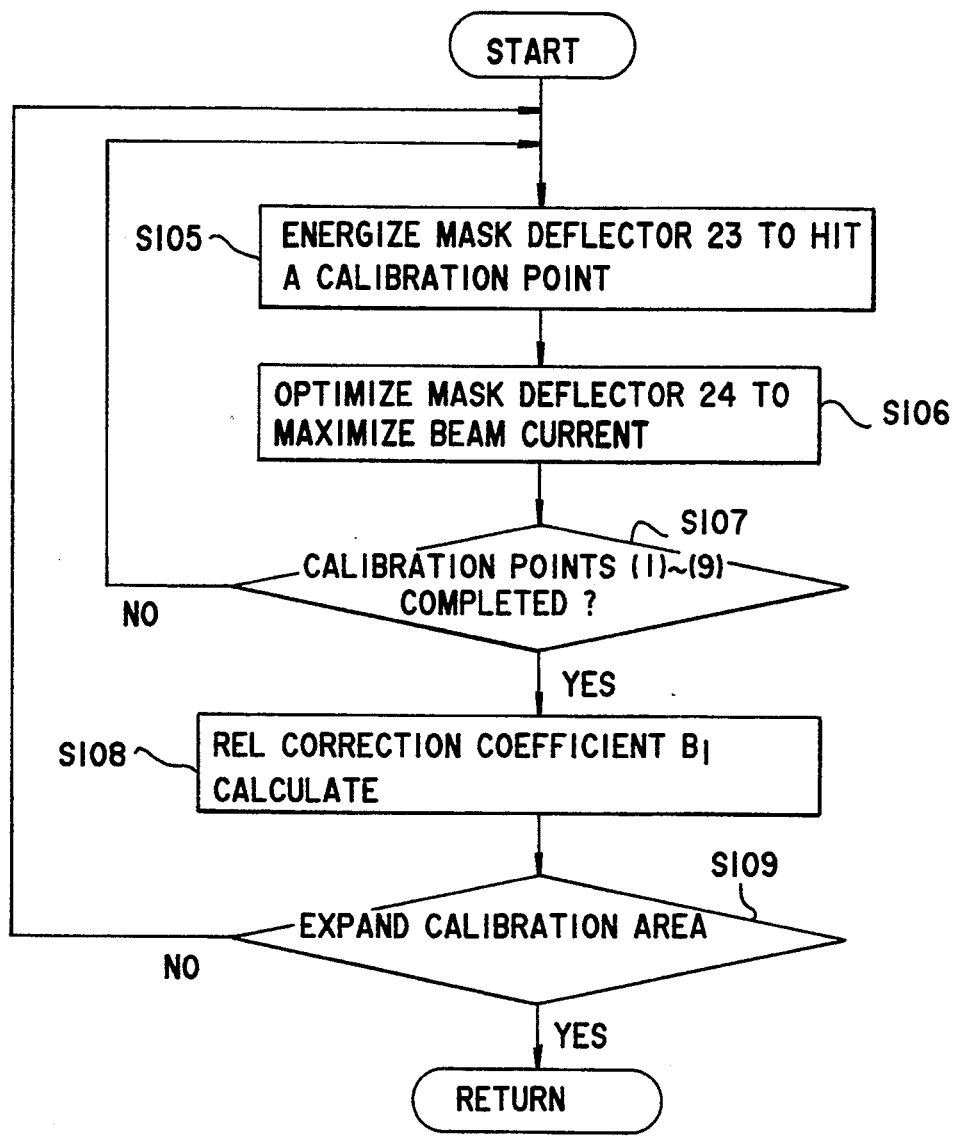
FIG. 25(A) is a flowchart showing the optimization process corresponding to FIG. 24.
FIG. 25(B) is a diagram showing a relativistic function describing the relationship between the driving energy of the third mask deflector and the driving energy of the fourth mask deflector.

FIG. 25(A) shows the flowchart of the process in the step $S90_{-2}$, wherein the electron beam is deflected to the foregoing calibration points (0)–(9) consecutively by energizing the mask deflector 23 in a step S105. Next, in a step S106, the mask deflector 23 is energized in each of the calibration points, and the driving energy of the mask deflector 24 is optimized such that the intensity of the electron beam, arriving at the substrate 40 after passing through the round aperture 27, is maximized. When it is discriminated in a step S107 that the driving energy of the mask deflector 24 is optimized for all of the calibration points (0)–(9), relativistic correction coefficients $B_1$ of the mask deflector 24 relative to the mask deflector 23 is determined according to the equation of FIG. 25(B) that corresponds to the relationship shown FIG. 17. Further, the area of the calibration points (0)–(9) is increased in a step S109 as shown in FIG. 26, and the accuracy of determination of the relativistic correction coefficients $B_1$ is increased. The relativistic correction coefficients $B_1$ thus obtained are converted to relativistic correction coefficients B that describes the relationship between the driving energy of the mask deflector 21 and the driving energy of the mask deflector 23 as will be described later with reference to FIG. 31.

Figure 27:
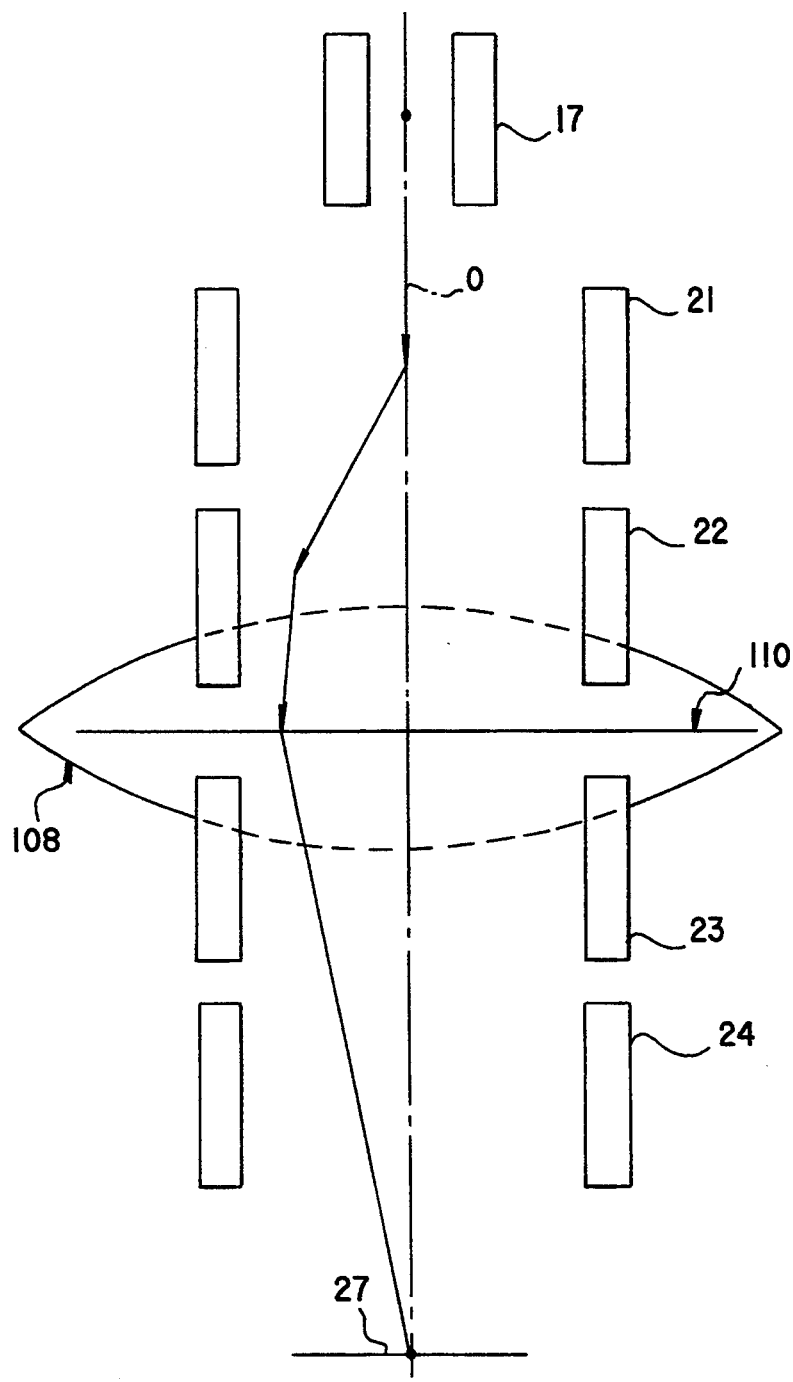
FIG. 27 is a diagram showing the deflection of the electron beam during an optimization process of the mask deflector of FIG. 20.

FIG. 27 shows the deflection of the electron beam in the step $S90_{-3}$.

Referring to FIG. 27, the calibration stencil mask 110 is set on the optical axis O in the process of the step $S90_{-3}$, and the electron beam is deflected successively by energizing the mask deflector 21 and further by energizing the mask deflector 22 with a driving energy corresponding to the driving energy of the mask deflector 21, such that the electron beam passes through a selected calibration aperture on the calibration stencil mask 110 (see FIG. 18). Further, the driving energy of the mask deflector 21 is optimized such that the intensity of the electron beam arriving at the object 40 after passing through the round aperture 27 is maximized.

Figure 28:
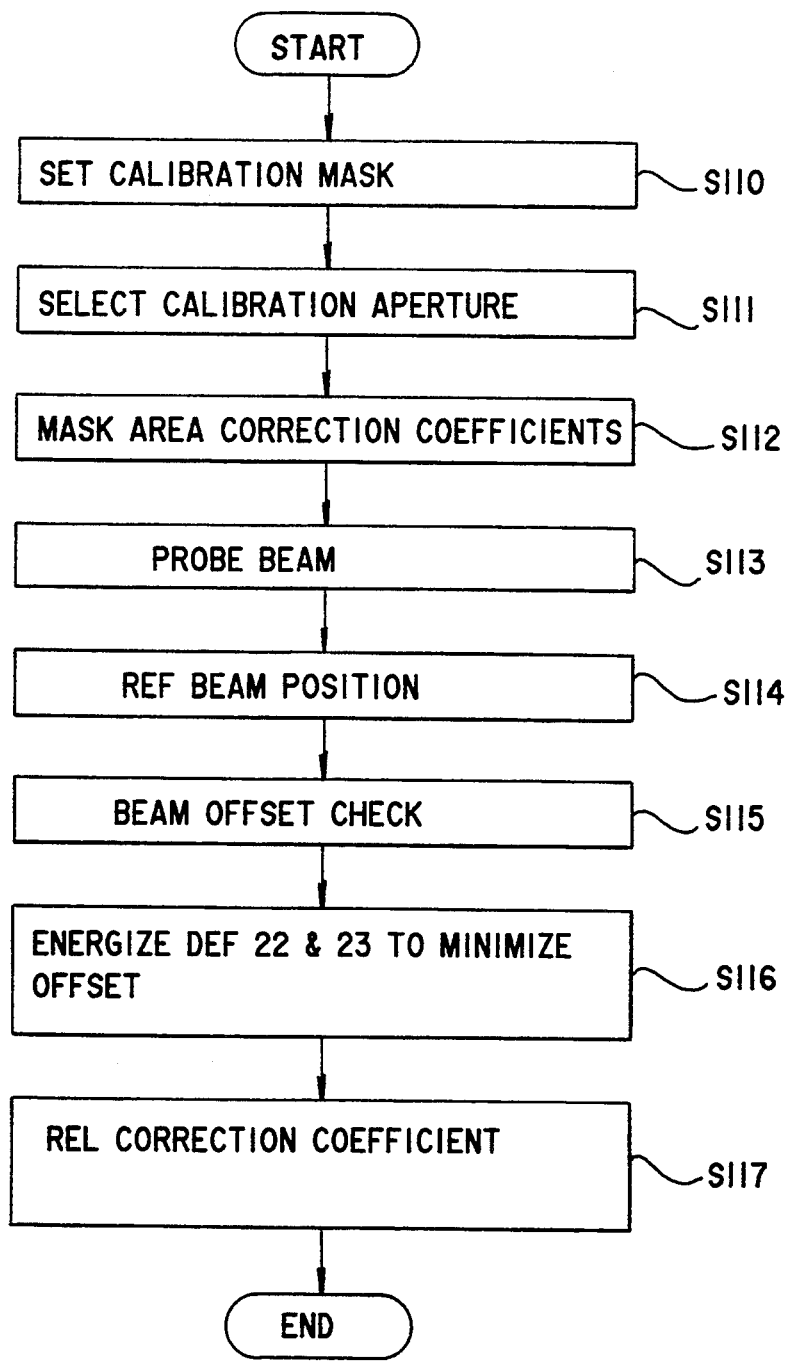
FIG. 28 is a flowchart showing the optimization process corresponding to FIG. 27.

FIG. 28 shows the flowchart of the steps $S90_{-3}$ and $S90_{-4}$, wherein the calibration stencil mask 110 is set on the optical axis O in a step S110, and the mask deflector 21 is energized in a step S111 such that the electron beam hits the selected calibration aperture on the mask 110. Thereby, the driving energy of the mask deflector 21 is optimized such that the electron beam arriving at the substrate 40 after passing through the selected calibration aperture on the mask 110 and the round aperture 27 has a maximum intensity. Further, in a step S112, mask area correction coefficients D are obtained by solving the equation of FIG. 19 based upon the coordinate of the selected calibration apertures and the optimized driving energies of the mask deflector 21.

Figure 29:
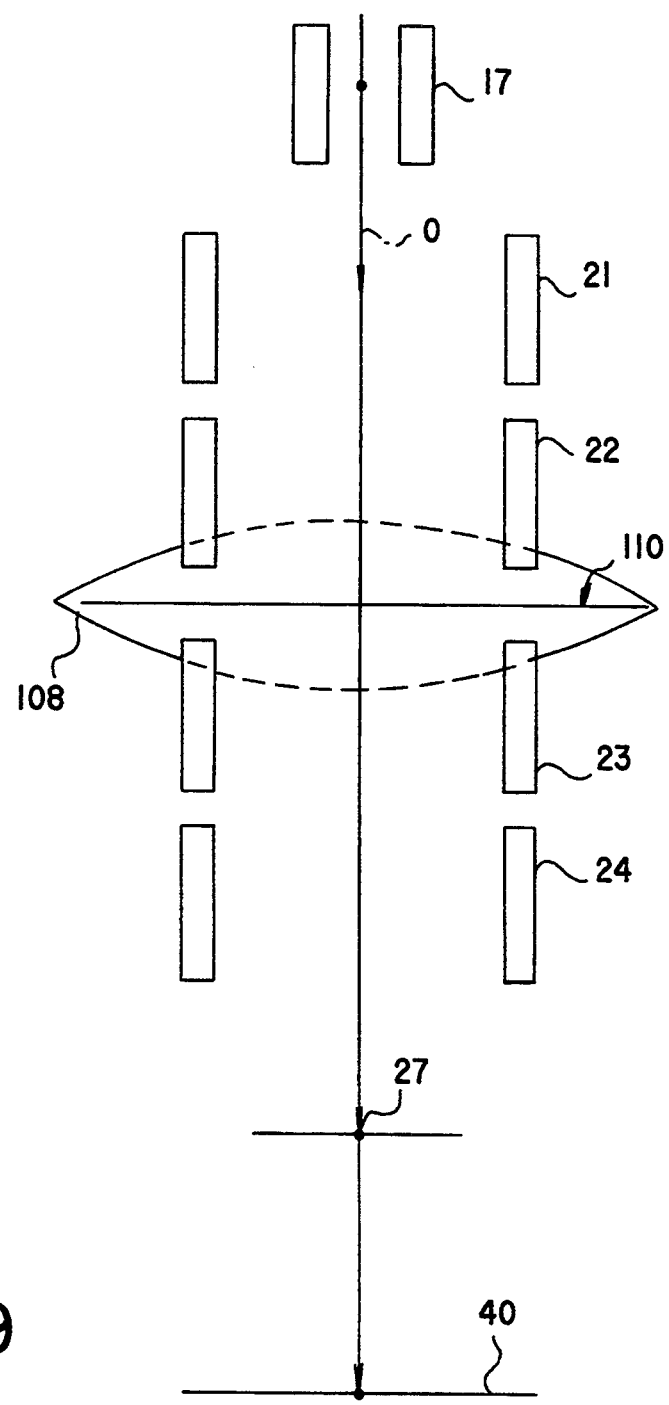
FIG. 29 is a diagram showing the detection of a reference position of the electron beam during the optimization process of FIG. 28.
Figure 30:
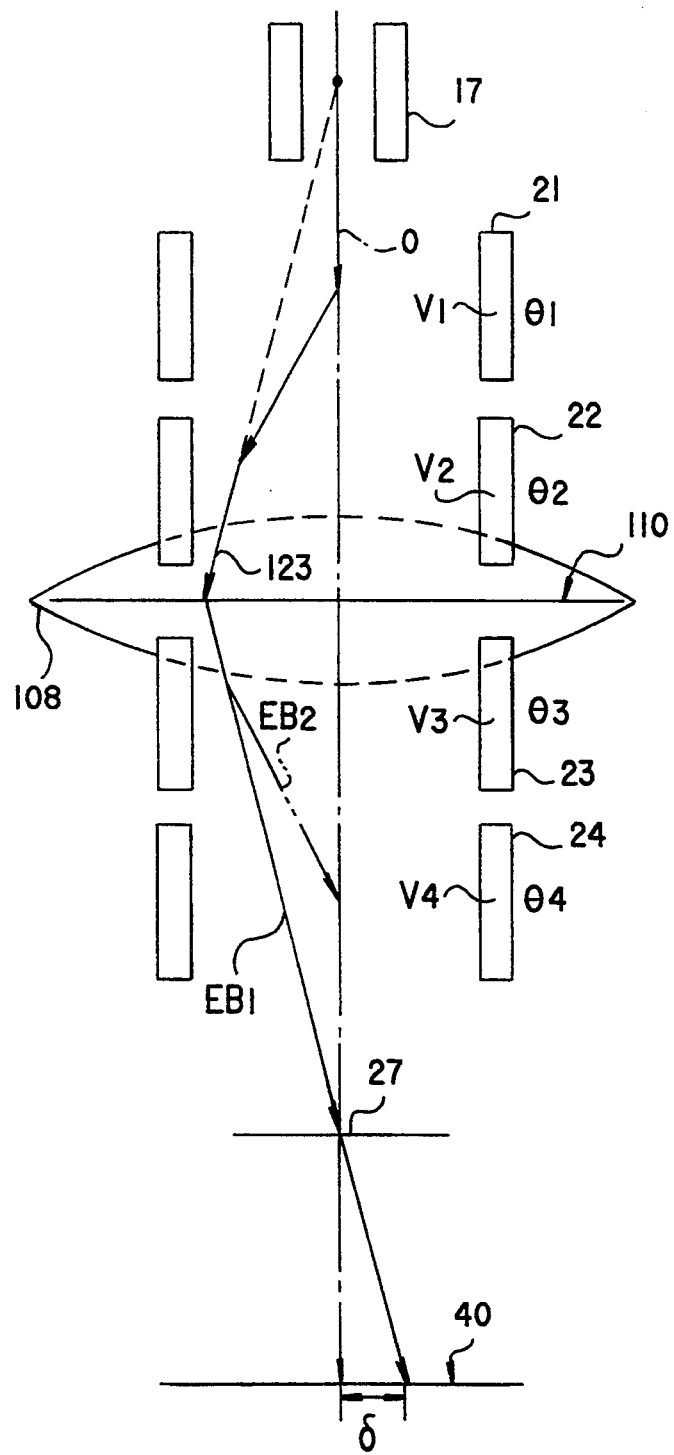
FIG. 30 is a diagram showing the detection of the beam position deviation during the optimization process of FIG. 28.

Next, the step $S90_{-4}$ is commenced in a step S113, wherein a very fine, probe electron beam is produced in the step S113. Further, in a step S114, the probe electron beam is set to a reference position as indicated in FIG. 29 by energizing the deflector 17, such that the probe electron beam passes through the round aperture 27 in the state that none of the mask deflectors 21–24 is energized. In the state of FIG. 29, the probe electron beam travels coincident to the optical axis O. Next, in a step S115 of FIG. 28, the mask deflectors 21–24 are energized simultaneously. Thereby, the path of the deflected electron beam changes as indicated in FIG. 30 from a path $EB_1$ for the electron beam that is deflected solely by the mask deflectors 21 and 22 to another path $EB_2$ wherein the electron beam travels coincident to the optical axis O after deflection by the mask deflectors 23 and 24. In correspondence to such an driving energy, the probe electron beam shifts, on the substrate 40, by a distance $\delta$. Thus, the driving energy of the mask deflectors 23 and 24 is optimized such that the distance $\delta$ becomes zero, and the relationship between the driving energy (xma, yma) of the mask deflector 21 and the driving energy ($BSX_3$, $BSY_3$) of the mask deflector 23 or the driving energy ($BSX_4$, $BSY_4$) of the mask deflector 24 is obtained as shown in FIG. 31, by using the relationship of FIG. 25(B).

FIG. 31 shows the algorithms employed in the steps $S90_{-3}$ and $S90_{-4}$ of FIG. 20 for determining the relativistic correction coefficients and the mask area correction coefficients. As will be understood from the relationship of FIG. 31, the driving energy ($BSX_i$, $BSY_i$, i=2–4) of the mask deflectors 22–24 is determined uniquely based upon the relativistic correction coefficients A–C and the driving energy xma and yma of the mask deflector 21. Further, the selection of a specific aperture on the mask 110 is achieved by converting the coordinates of the selected aperture on the mask to the drive energies $BSX_1$ and $BSY_1$ of the mask deflector 21 by using the mask area correction coefficient D, wherein it should be noted that the parameters $BSX_1$ and $BSY_1$ are identical with the parameters xma and yma, respectively.

When the relativistic correction coefficients A–C and the mask area correction coefficients D of FIG. 31 are obtained as such, the calibration stencil mask 110 is replaced by the stencil mask 20, and the value of the mask area correction coefficients is updated. In this process, one may move the stencil mask 110 laterally such that the beam shaping area formed on the stencil mask 110 with an offset from the calibration area on which the calibration apertures are formed, is located on the optical axis O. In the updating process, a process substantially similar to the process of the step $S90_{-3}$ is carried out, and deviations $\Delta Omax$ and $\Delta Omay$ respectively indicative of the deviation of the drive energies $BSX_1$ and $BSY_1$ of the mask deflector 21 from the optimized drive energies, are obtained, and the coefficients Omax, Omay in the mask area correction coefficients D are updated as Omax $<=$ Omax+$\Delta Omax$, Omay $<=$ Omay+$\Delta Omay$. Further, the relativistic correction coefficients thus obtained in the step S92 of FIG. 20 are set in the mask controller 55 of FIG. 1. Similarly, the mask area coefficients are set in the mask controller 55 in the step S93. Based upon the correction coefficients thus obtained, the exposure process is actually conducted in the step S94.

Figure 33:
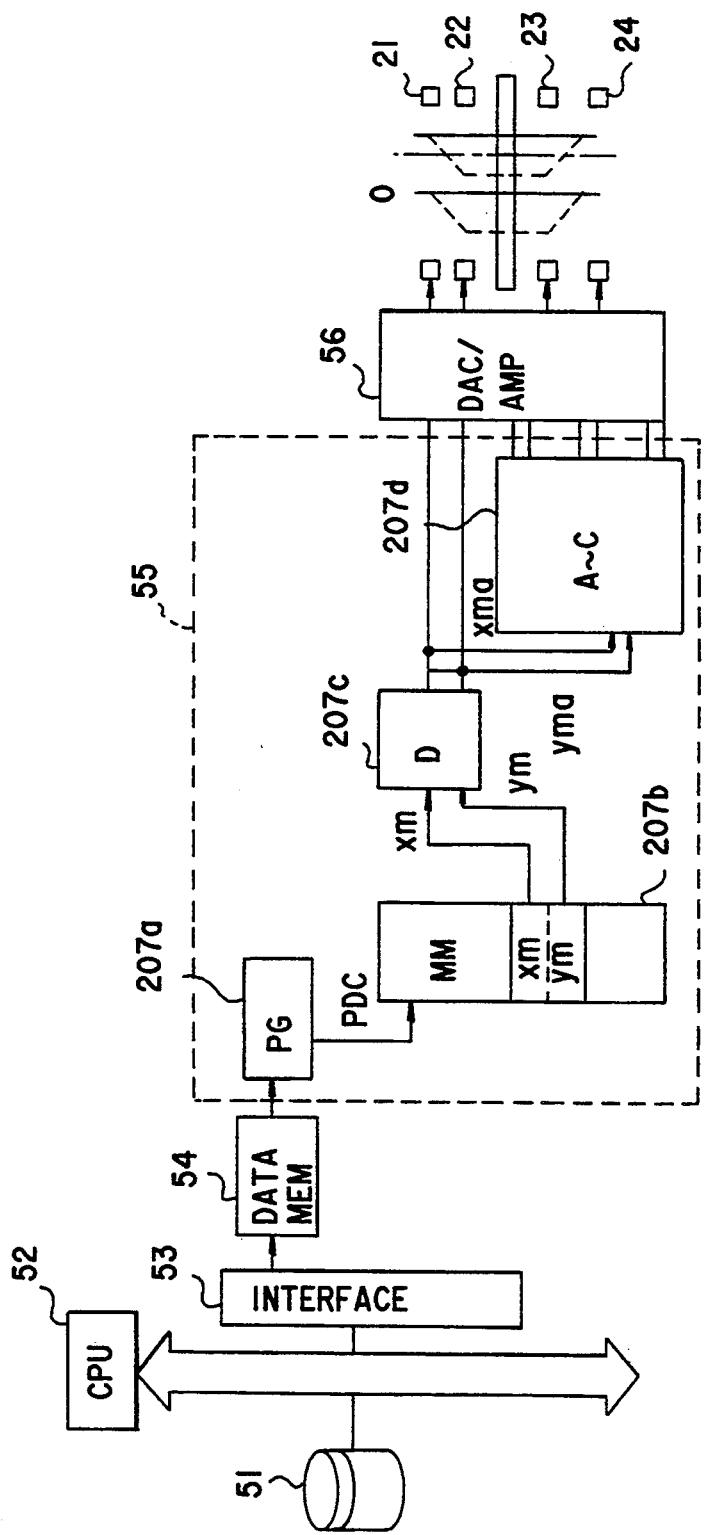
FIG. 33 is a block diagram showing a part of the electron beam exposure system of FIG. 1 that is used for the calibration process of the mask deflectors.

FIG. 33 is a block diagram showing a part of the electron beam exposure process of FIG. 1 for carrying out the block exposure process described previously.

Figure 46:
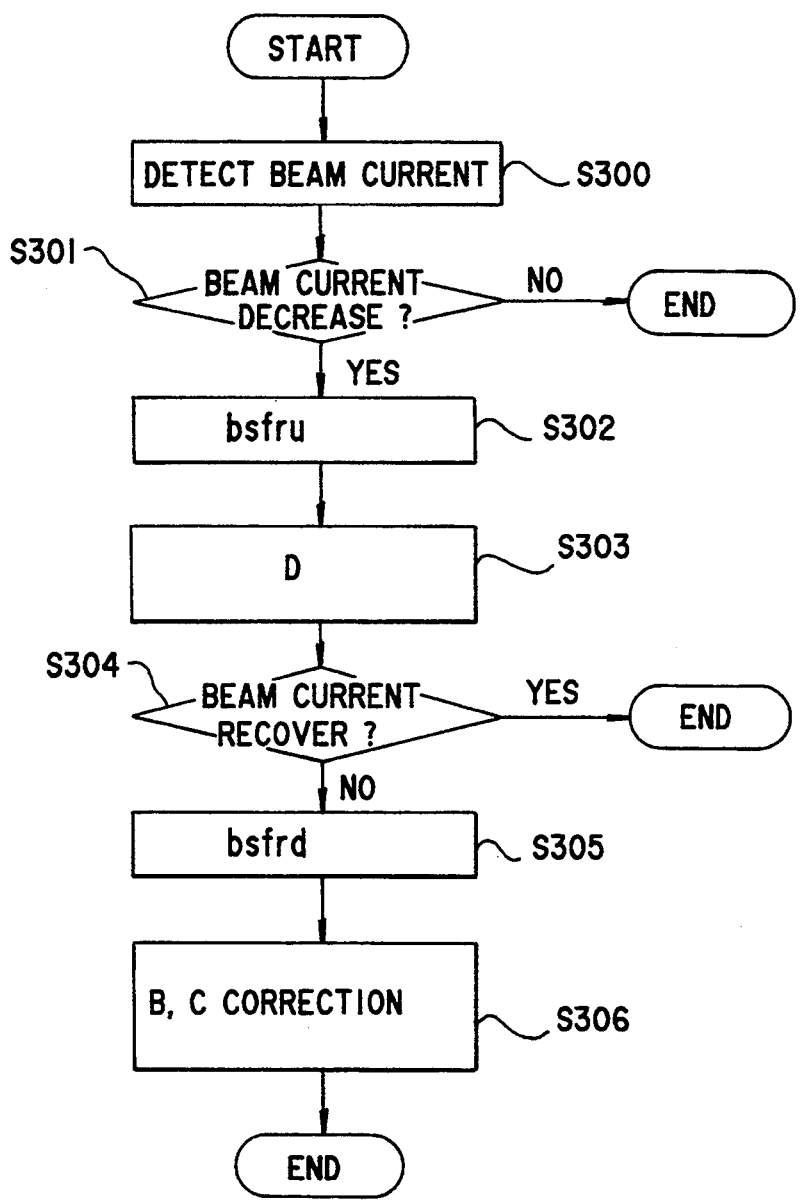
FIG. 46 is a flowchart showing a third embodiment of the present invention.

Referring to FIG. 46, the pattern data from the memory unit 54 is supplied to a pattern generator 207a provided in the mask controller 55, wherein the pattern generator 207a produces a pattern data code PDC and supplies the same to a mask memory 207b that is provided also in the mask controller 55. The pattern data code PDC contains information about the address of the mask memory 207b in which the desired exposure pattern is stored, and reads out the X-coordinate xm and the Y-coordinate ym of the selected aperture on the stencil mask 20. The coordinate data thus read out is supplied to a mask area correction circuit 207c, wherein the mask area correction circuit 207c produces the driving signals xma and yma of the mask deflector 21 in response to the supplied coordinate data xm and ym, according to the relationship of FIG. 16. The drive signals xma and yma are supplied on the one hand to the mask deflector 21 via the D/A converter 56 and on the other hand supplied to a relativistic correction circuit 207d also provided in the mask controller 55. Thereby, the mask controller 55 produces, in response to the input signals xma and yma, the output drive signals BSX$_2$–BSX$_4$ and BSY$_2$–BSY$_4$ for each of the mask deflectors 22–24, by carrying out the algorithm of FIG. 17, and the drive signals thus produced are supplied to the corresponding mask deflectors via the D/A converter 56. As a result, the electron beam hits the selected aperture on the stencil mask 20 and returns again to the optical axis after being shaped by the beam shaping aperture on the stencil mask 20.

7. Calibration of the Compensation Coils

Next, a third embodiment of the present invention for calibrating the correction coils in the electron beam exposure system of FIG. 1 will be described.

FIG. 34 shows the principle of the present embodiment for calibrating the astigmatic compensation coils 42 and 45 of FIG. 1, wherein FIG. 34 shows the relationship between the optimized driving energies MDSX and MDSY of the compensation coil 42 or 45 and the driving energies xma and yma of the mask deflector 21. Thus, the calibration process of the present embodiment is achieved to determine the coefficients Omdsx, Gmdsx, . . . , Omdsy, Gmdsy, . . . in the equation of FIG. 34.

In the calibration process, therefore, the mask deflector 21 is energized by the driving energies xma and yma such that the electron beam is deflected to the calibration points (0)–(9) described previously, and the driving energies MDSX and MDSY of the compensation coil 42 or 45 is optimized such that the electron beam that arrives at the substrate 40 after passing through the round aperture 27 has a maximum intensity. Further, based upon the relationship between the drive energy (MDSX and MDSY) and the driving energy (xma, yma), the equation of FIG. 34 is solved with respect to the coefficients Omdsx, Gmdsx, . . . , Omdsy, Gmdsy, . . .

Figure 35:
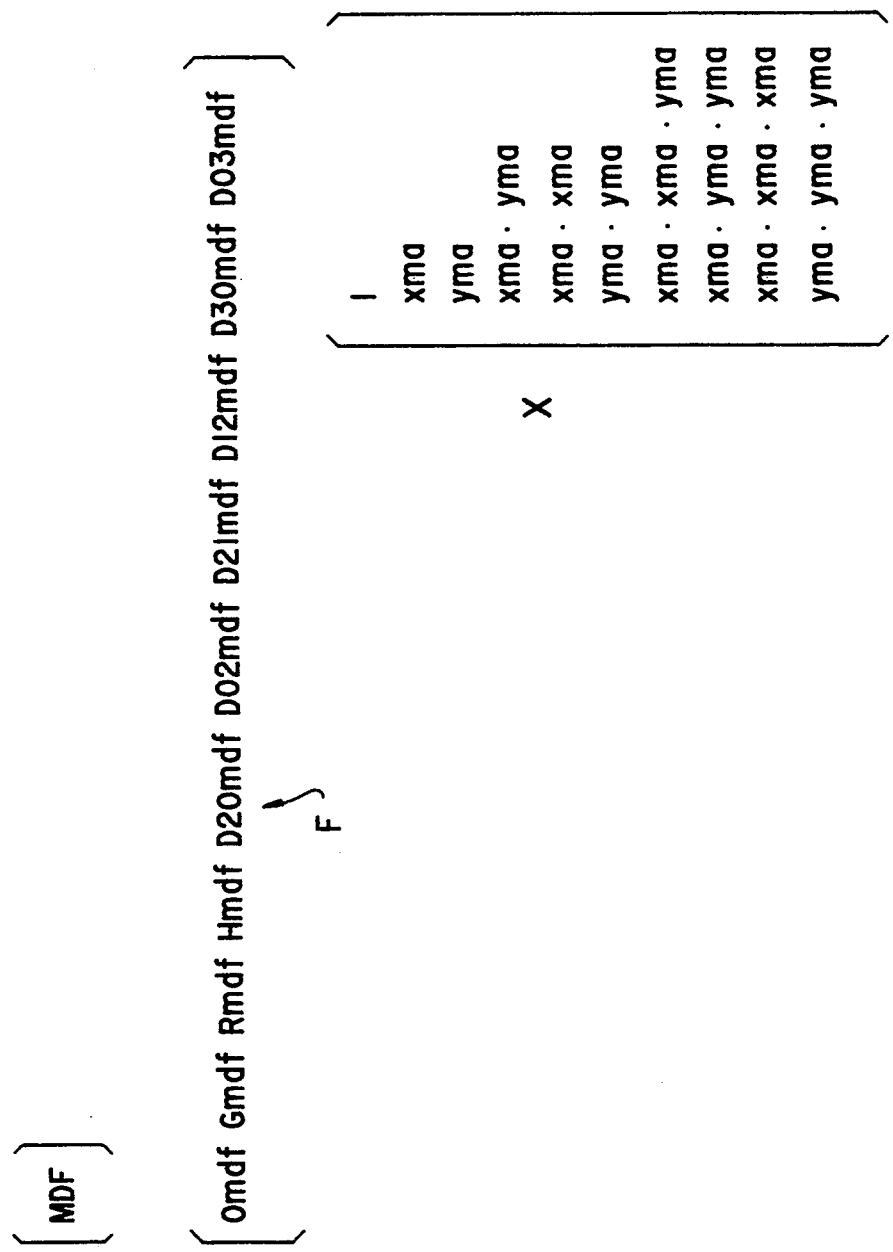
FIG. 35 is a diagram showing the algorithm used in the third embodiment of the present invention for correcting the field curvature effect.

FIG. 35 shows the principle of the present embodiment for calibrating the focusing compensation coil 41 or 44 of FIG. 1, wherein FIG. 35 shows the relationship between the driving energy (xma, yma) of the mask deflector 21 and the optimized driving energy MDF of the focusing compensation coil 41 or 44. In the calibration process of the present embodiment, therefore, the electron beam is deflected to the foregoing calibration points (0)–(9) successively by energizing the mask deflector 21 and optimizing the driving energy MDF of the compensation coil 41 or 44 such that the intensity of the electron beam that arrives at the substrate 40 after passing through the round aperture 27 becomes maximum. Based upon the optimized driving energy MDF thus obtained and the driving energies xma and yma of the mask deflector 21, the coefficients Omdf, Gmdf, . . . of FIG. 35 are determined by solving the equation of FIG. 35 with respect to these coefficients.

Figure 36:
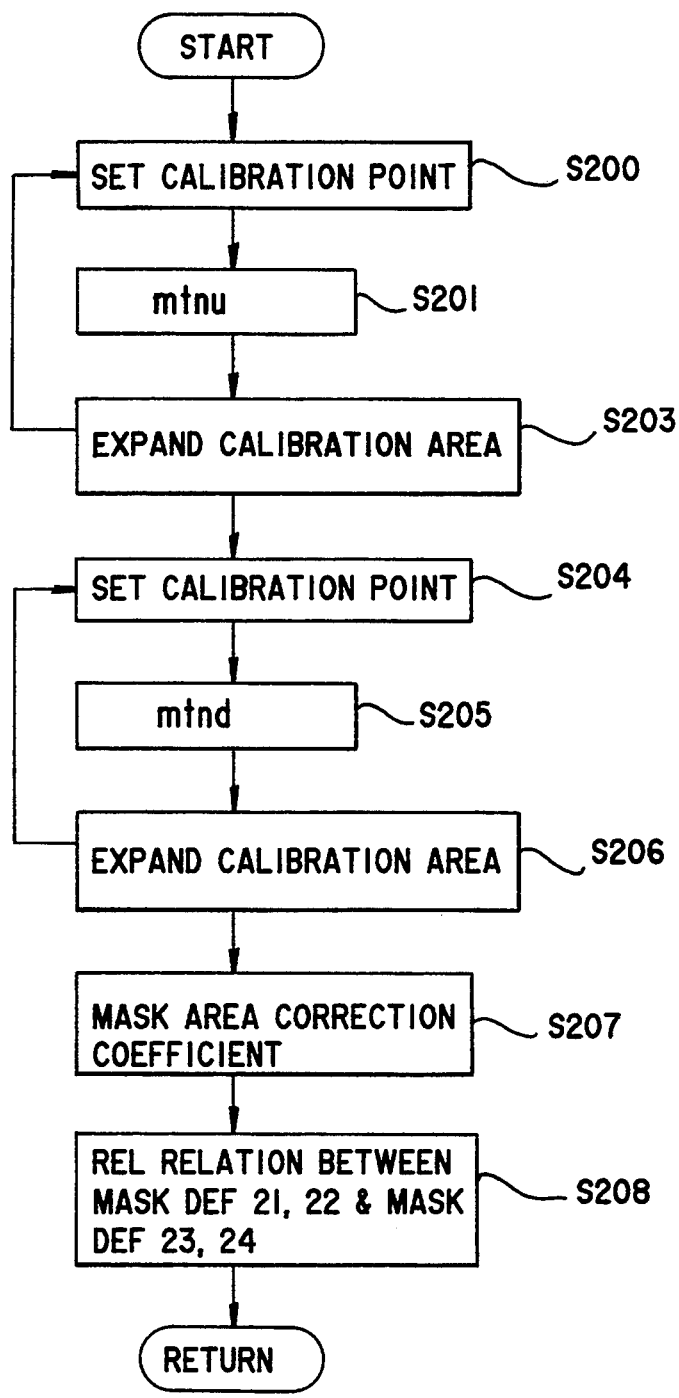
FIG. 36 is a flowchart showing the corresponding to the algorithm of FIG. 35.

FIG. 36 shows the process of the present embodiment.

Referring to FIG. 36, the calibration points (0)–(9) corresponding to the calibration points shown in FIG. 36 are selected one by one in a step S200, and a subroutine mtnu to be described later in detail is carried out in a step S201, wherein the mask deflector 21 is energized in the subroutine mtnu such that the electron beam is deflected to the foregoing calibration points (0)–(9) one by one. Further, the correction coefficients A, E and F that represent respectively the relationship between the driving energy of the mask deflector 22–24 and the driving energy of the mask deflector 21, the relationship between the driving energy of the astigmatic compensation coil 42 or 45 and the driving energy of the mask deflector 21, and the relationship between the driving energy of the focusing compensation coil 41 or 44 and the driving energy of the mask deflector 21, are determined according to the relationship of FIG. 31, FIG. 34 and FIG. 35, while deflecting the electron beam to the foregoing calibration points (0)–(9) by energizing the mask deflector 21. Further, in a step S203, the area of the calibration points (0)–(9) is expanded, and the accuracy of the coefficients A, E and F is improved by repeating the steps S200 and S201.

Next, in a step S204, the calibration points (0)–(9) previously selected in the step S200 are again selected one by one, and a subroutine mtnd to be described later in detail is carried out in a step S205. The subroutine mtnd corresponds to the previous step S90$_{-2}$, wherein the relativistic correction coefficients B$_1$ shown in FIG. 25(B) are obtained by energizing the mask deflector 24 with respect to the mask deflector 23. Further, the area for the calibration points (0)–(9) is expanded by a step S206, and the accuracy of the relativistic correction coefficients B$_1$ is increased.

Further, a step S207 corresponding to the step S90$_{-3}$ of FIG. 33 is carried out wherein the mask area correction coefficients D are obtained. Further, a step S208 corresponding to the step S909$_{-4}$ is carried out and the relationship shown in FIG. 31 is obtained.

Hereinafter, the subroutine mtnu called in the step S201 of FIG. 36 will be described with reference to FIG. 37.

Figure 37:
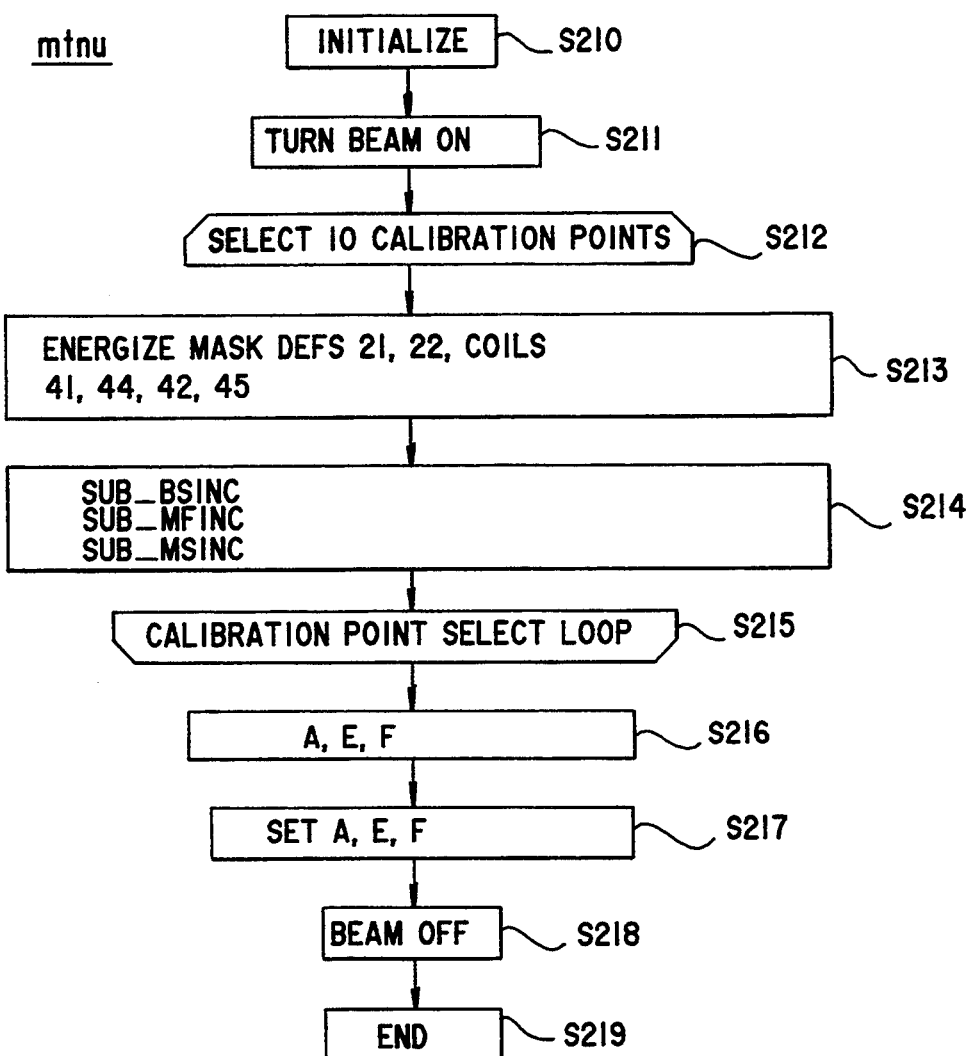
FIG. 37 is a flowchart showing a subroutine called in the process of FIG. 36.

Referring to FIG. 37, an initialization step is carried out in a step S210, and the electron beam is turned on in a step S211 such that the substrate 40 is irradiated with the electron beam. Next, a calibration point is selected from the calibration points (0)–(9) shown in FIG. 23 in a step S212, and the mask deflector 21 is energized in a step S213 such that the electron beam hits the calibration aperture selected in the step S212. Further, the mask deflector 22 and the astigmatic compensation coil 42 or 45 as well as the focusing compensation coil 41 or 44 are energized.

Next, a step S214 is conducted wherein a subroutine, sub—bsinc, for mask deflector adjustment is called, and the relationship between the drive energy of the mask deflector 112 and the intensity of the electron beam arriving at the substrate 40 is obtained. Further, another subroutine, sub—mfinc, for the adjustment of the compensation coil 41 or 44 is called, and the relationship between the drive energy of the coil 41 or 44 and the intensity of the electron beam arriving at the substrate 40 is obtained. Further, a subroutine, sub—msinc, for adjusting the astigmatic compensation coil 42 or 45 is called, and the relationship between the drive energy of the compensation coil and the intensity of the electron beam arriving at the substrate 40 is obtained. In the foregoing process of the step S214, one may change the order for calling the subroutines.

By repeating the process steps between the step S212 and the step S215 for each of the apertures selected in the step S212, the relativistic correction coefficients A, E and F are obtained in a step S216, based upon the relationship shown in FIG. 17, FIG. 34 and FIG. 35. Further, the correction coefficients A, E and F thus obtained are set in a step S217 in the drive circuits of the corresponding compensation coils (the circuit 207d of FIG. 33 and circuits 207g and 207f to be described later with reference to FIG. 45), and the drive energies xma and yma are set to zero in a step S218 to turn off the electron beam. Further, a termination process is carried out in a step S219.

Figure 38:
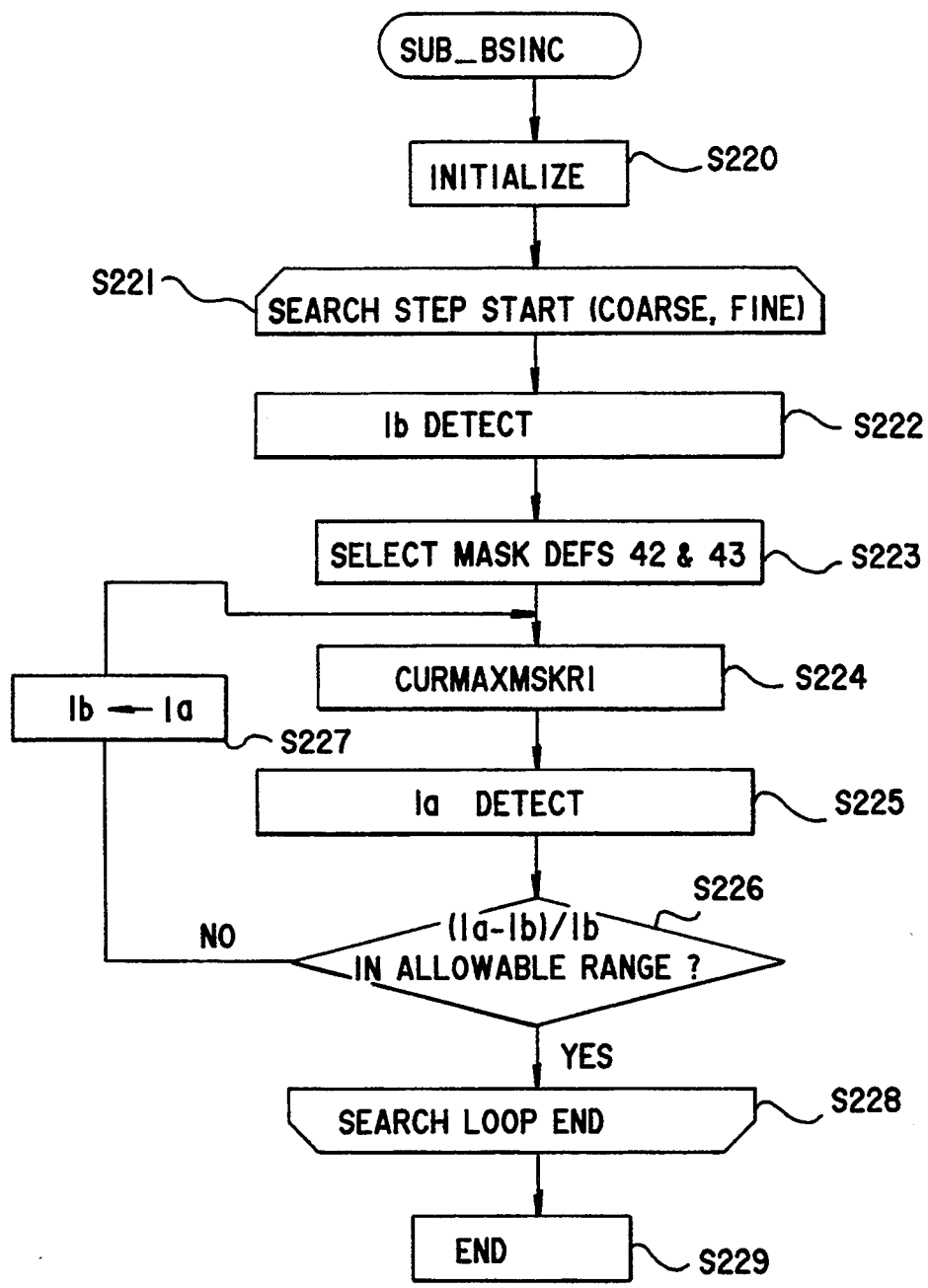
FIG. 38 is a flowchart showing a subroutine called in the process of FIG. 37.

FIG. 38 shows the subroutine sub—bsinc that is called when adjusting the drive energy of the mask deflector 22 in the subroutine of FIG. 37.

Referring to FIG. 38, the subroutine sub—bsinc is initialized in a step S220 and a search step, which includes coarse and fine adjusting steps, is commenced in a step S221. In the search step, a step S222 is conducted first wherein a beam current $I_b$ that flows through the substrate 40 is measured prior to the adjustment of the drive energy. Further, a step S223 is conducted wherein the mask deflector that is subjected to the adjustment is selected. In the present case, the mask deflector 22 is selected, and a subroutine CURMAXMSKR1 is called in a step S224 for adjustment of the drive energy of the selected mask deflector. As will be described later, the subroutine CURMAXMSKR1 obtains the relationship between the drive energy of the selected mask deflector and the detected beam current while changing the drive energy of the selected mask deflector variously. The relationship thus obtained is fitted by a parabolic function and the drive energy that provides a maximum beam current $I_a$ is obtained. Next, the value of the foregoing maximum beam current $I_a$ is measured in a step S225, and a quantity $(I_a-I_b)/I_b$ is obtained in a step S226, wherein it is discriminated in the step S226 whether the foregoing quantity falls in a predetermined, optimum range. When the current $I_a$ after the adjustment is larger than the current $I_b$ before the adjustment and the foregoing quantity $(I_a-I_b)/I_b$ falls outside the optimum range, there is a possibility that further optimization is possible. In this case, therefore, the current $I_b$ is substituted for by the current $I_a$ in a step S227 and the subroutine CURMAXMSKR1 of the step S224 is conducted again. When it is judged, on the other hand, that the current $I_a$ has converged in the step S226, a step S228 is carried out wherein the search process is terminated. Further, a termination process is carried out in a step S229.

Figure 39:
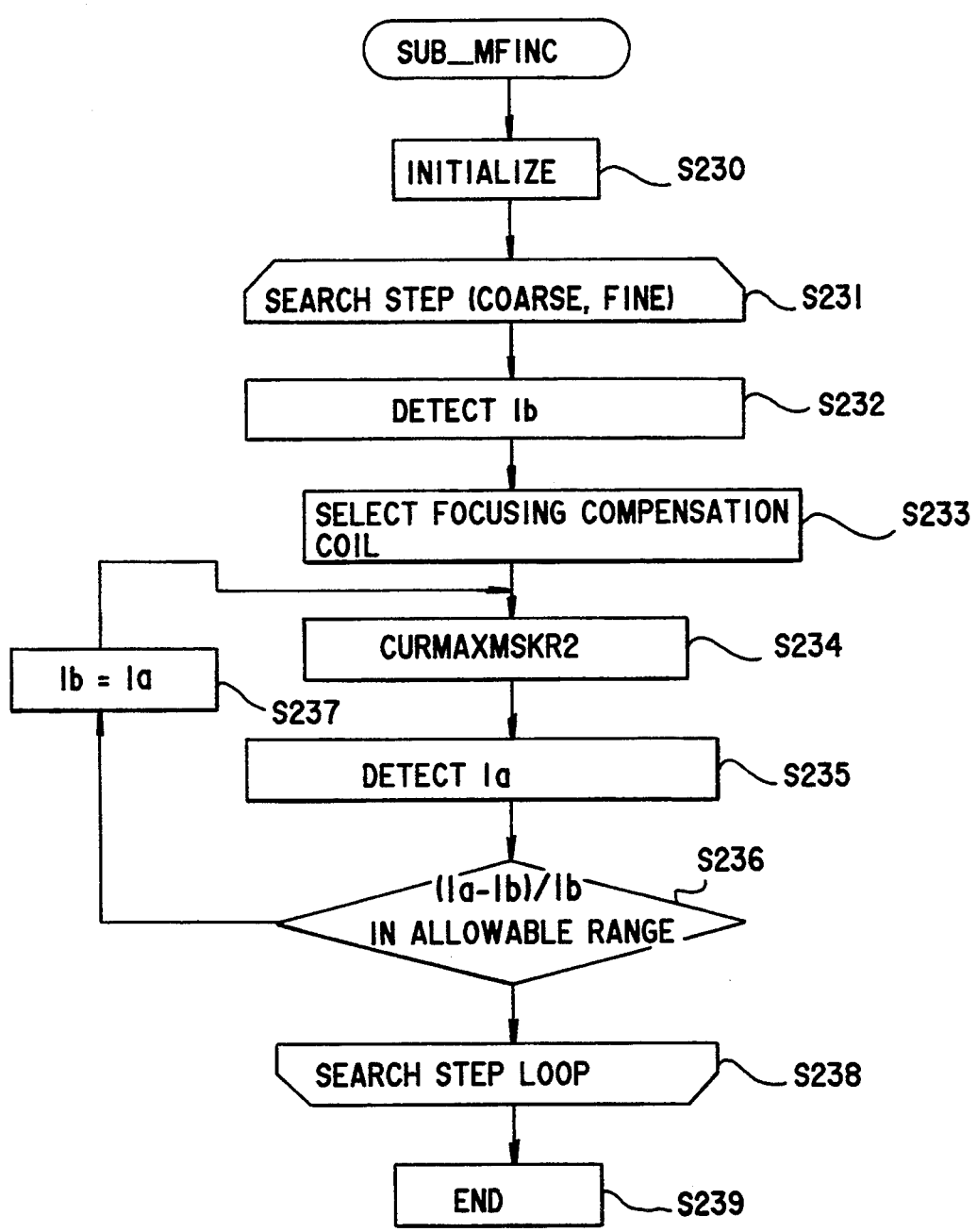
FIG. 39 is a flowchart showing another subroutine called in the process of FIG. 37.
Figure 40:
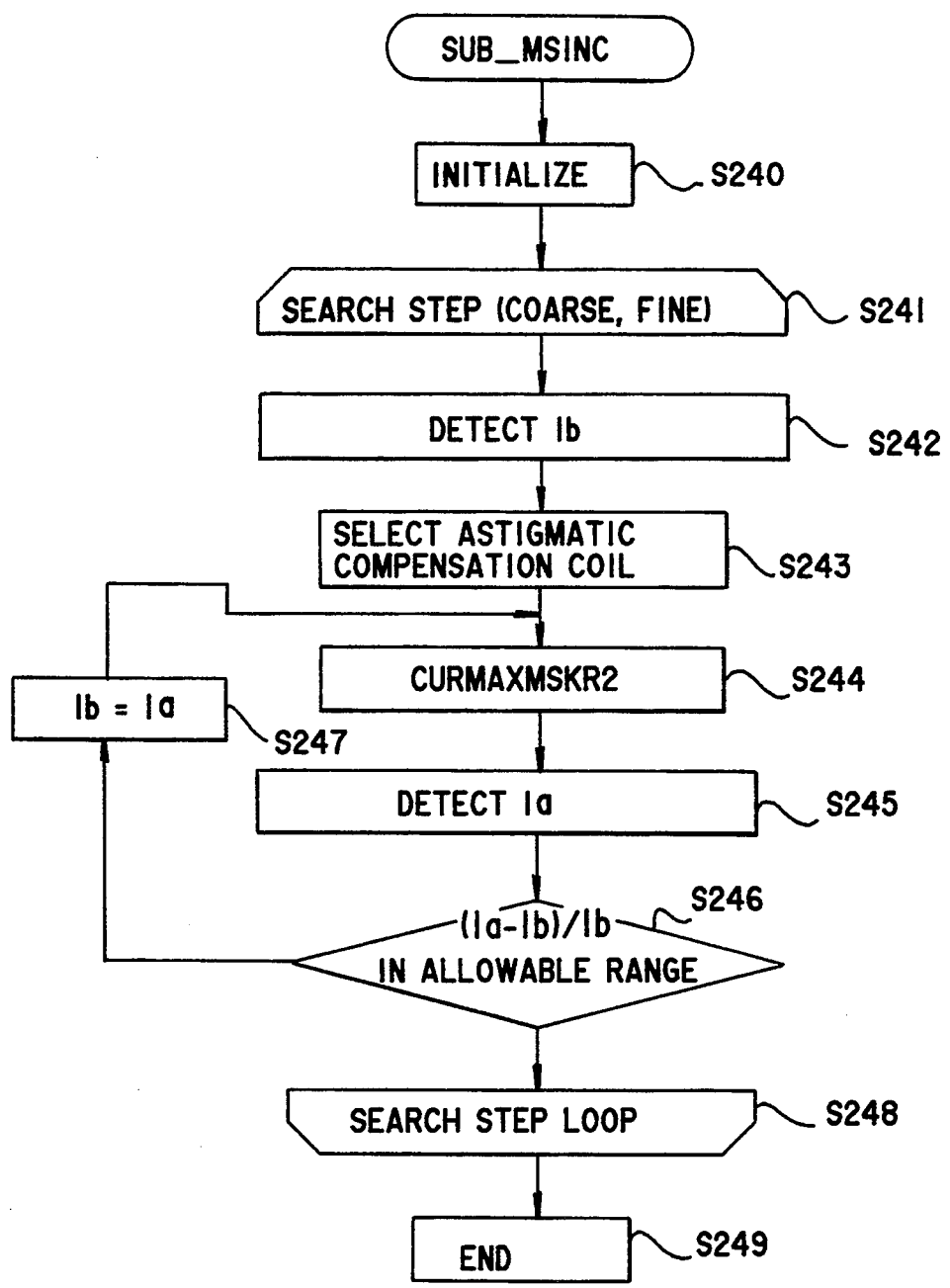
FIG. 40 is a flowchart showing other subroutine called in the process of FIG. 37.

FIG. 39 shows a flowchart of the subroutine sub—mfinc that is carried out in a step S214 of FIG. 37. Referring to FIG. 39, the subroutine sub—mfinc is substantially identical with the subroutine sub—bsinc of FIG. 38 except for the point that a focusing compensation coil such as the coil 41 or 44 is selected in a step S233 and that a subroutine CURMAXMSKR2 is called for optimizing the focusing compensation coil 41 or 44 in place of the subroutine CURMAXMSKR1 that is called for the optimization of the mask deflector 22. Thus, the description of FIG. 39 will be omitted. Similarly, the subroutine sub—msinc, shown in FIG. 40 and is called in the step S214 of FIG. 37, is substantially identical with the subroutine sub—bsinc of FIG. 38 or the subroutine sub—mfinc of FIG. 39 except for the point that the astigmatic compensation coil 42 or 45 is selected in the step S243 and that a subroutine CURMAXMSKR2 is called for the optimization of the astigmatic compensation coils. Thus, the description of FIG. 40 will be omitted.

Figure 41:
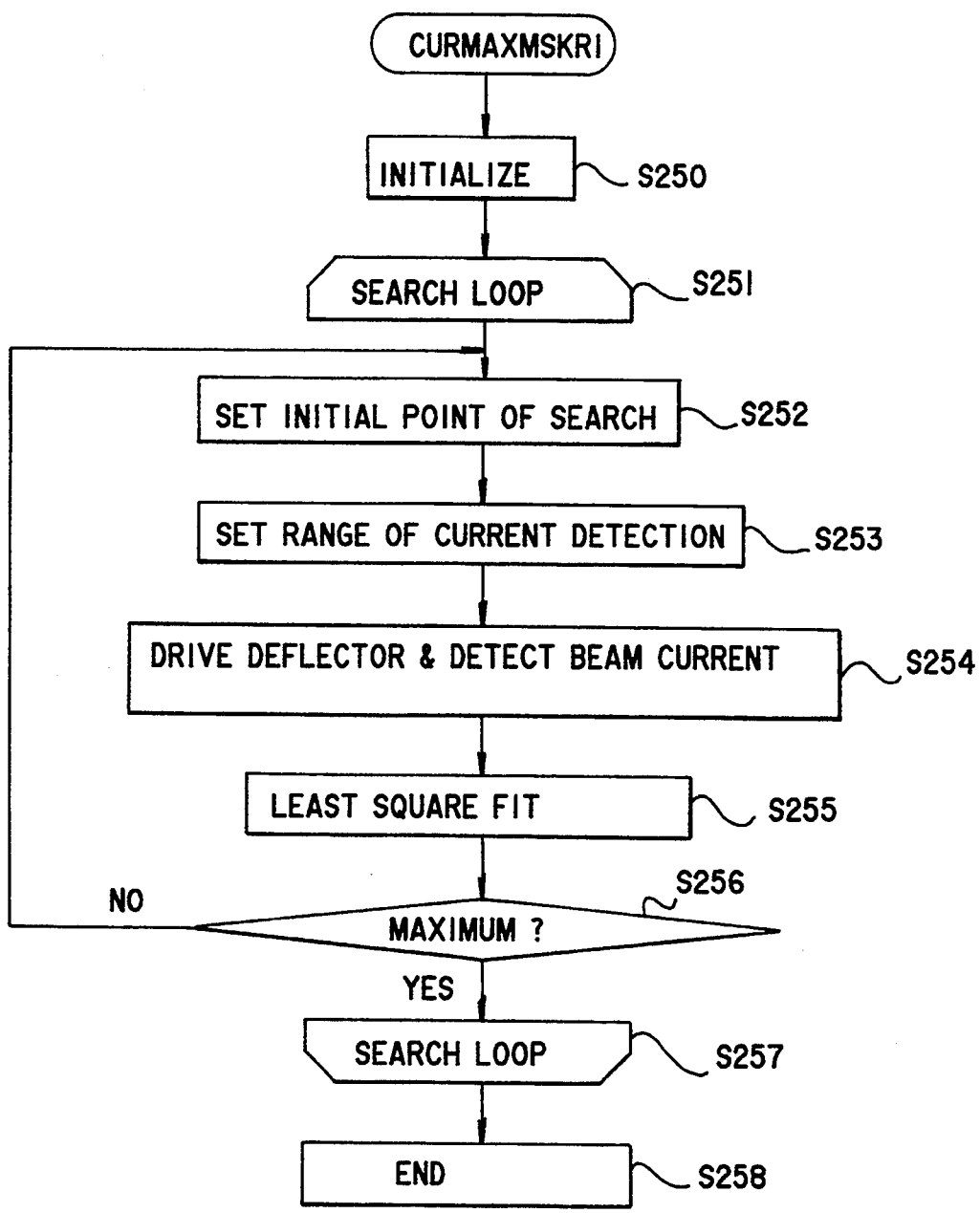
FIG. 41 is a flowchart showing a subroutine called in the process of FIG. 38.

FIG. 41 is a flowchart showing the subroutine CURMAXMSKR1, wherein the subroutine starts with a step S250 for initialization. Next, a search loop S250 is activated in a step S251. Thereby, a step S252 is conducted at first for setting the driving energy of the mask deflector 21 in correspondence to the first point from which the search process is started, based upon the relativistic correction coefficient A. Next, the range of current detection for detecting the beam current is set in a step S253. Further, a step S254 is conducted, wherein the driving energy of the defector 21 is changed stepwise in five steps, starting from an initial point str, with a minimum step division of min. In each point, the beam current is detected. Further, in a step S255, the relationship between the beam current and the deflector driving energy is approximated by a parabolic curve according to the least square process. Further, based upon the parabolic curve thus obtained, an optimum driving energy that provides the maximum of the beam current is searched in a step S256. When the optimum driving current is not existing in the foregoing range, a step S252 is carried out for resetting the initial point str, and the steps S253–S255 are repeated. On the other hand, when the optimized energy is included in the foregoing range, the search is terminated in a step S257, and a step S258 is conducted further for termination processing.

Figure 42:
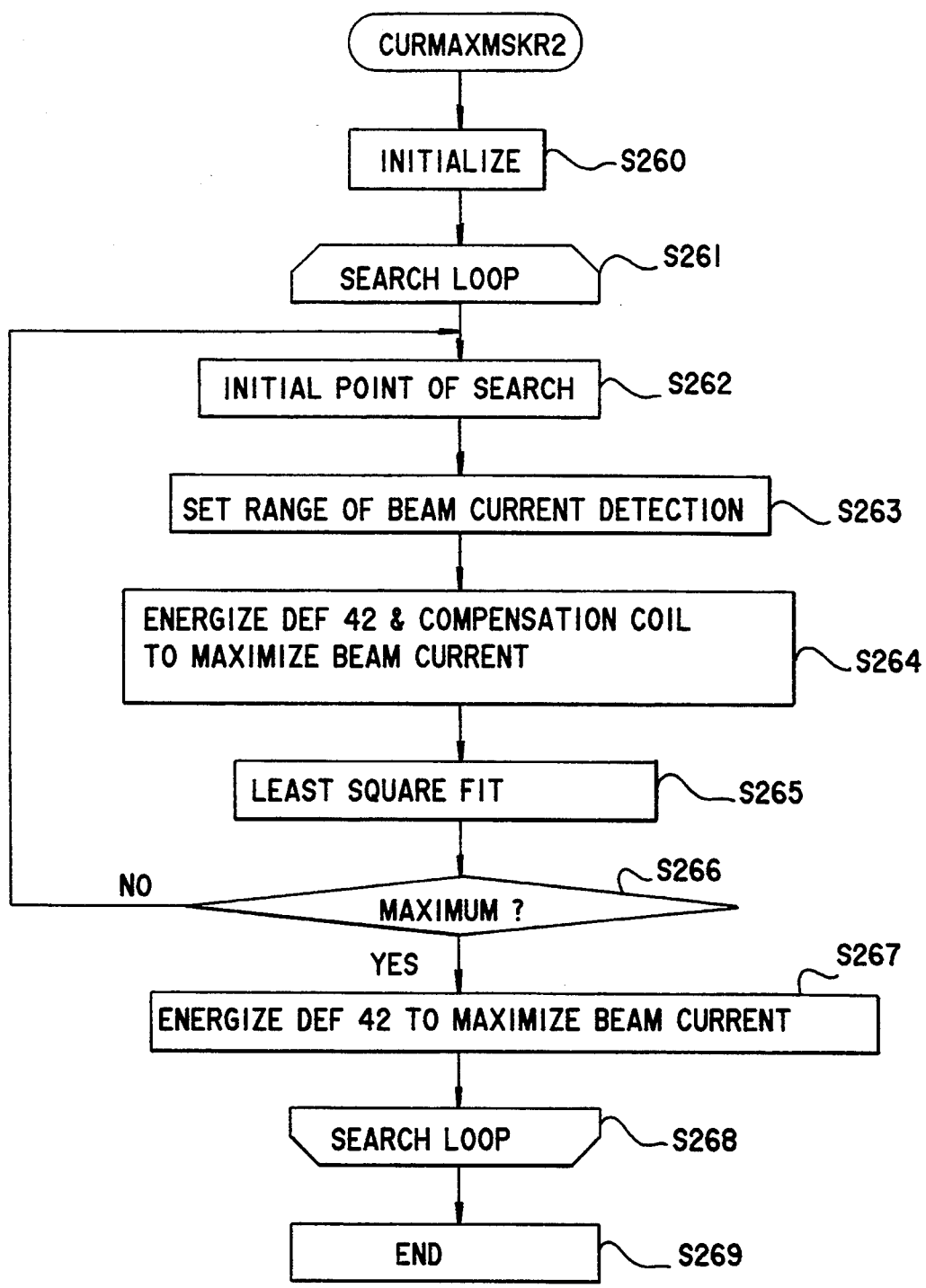
FIG. 42 is a flowchart showing a subroutine called in the process of FIGS. 39 and 40.

FIG. 42 is a flowchart showing the subroutine CURMAXMSKR2. In CURMAXMSKR2, an initialization is carried out in a step S260 and an optimization process is activated in a search loop S261. In the search loop S261, the deflector 21 and the compensation coils 41 and 42 or 44 and 45 are energized with a drive energy corresponding to the first point of search. Further, the range of detection of the beam current is set in a step S263.

Next, a step S264 is conducted wherein the driving energy of the mask deflector 42 is changed about an initial point of search such that the beam current on the substrate 40 becomes maximum. Further, the driving energy of the focusing compensation coil 41 or 44 and the driving energy of the astigmatic compensation coil 42 or 45 are changed about an initial point str in five steps with a minimum division set to min, and the relationship between the beam current and the drive energy is measured. Further, the relationship thus obtained between the beam current and the driving energy of the compensation coil is fitted by a parabolic curve in a step S265, and the optimized drive energy that corresponds to the maximum of the beam current is obtained. In a step S266, a discrimination is made whether or not the optimum driving energy is included in the foregoing range of search, and if it is judged that the optimum driving energy is not included in the foregoing range, the step S262 is carried out again to reset the initial point of search and the steps S263–S265 are carried out again. On the other hand, when such an optimum driving energy is actually included in the foregoing range of search, a step S267 is carried out wherein the driving energy of the mask deflector 42 is adjusted again for maximization of the beam current, and the search loop is terminated in a step S268. Further, a step S269 is carried out for terminating the processing.

In the step S256 of FIG. 41 or in the step S266 of FIG. 42, the following steps are conducted based upon the combination of parameters a and b that represent the parabolic curve $f = a(r-b)^2 + c$ obtained in the step S255 or S265, wherein the parameter f represents the beam current and the parameter r represents the driving energy of the mask deflector or the compensation coil in the form of a value stored in a register that controls the mask deflector or the compensation coil.

(1) When $a \geq 0$ and $b < 0$, the initial point str is displaced by two steps in the positive direction of the parameter r, and the search step S254 or S264 is carried out again.

(2) When $a \geq 0$ and $b < 0$, the initial point str is displaced by two steps in the negative direction of the parameter r, and the search step S254 or S264 is carried out again.

(3) When $a \geq 0$ and $b = 0$, the initial point str is unchanged in the step S252 or S262, and the search step S254 or S264 is carried out again. When the number of repetition of the search exceeds a predetermined number of times, an error flag is set and the subroutine is terminated.

(4) When $a < 0$, there are three possibilities as follows.

(4-1) When a relationship $b - (str + 2 \times min) > min$ holds, the initial point str is redefined as $str = str + 2 \times min$ in the step S252 or S262, and the search is repeated.

(4-2) When a relationship $b - (str + 2 \times min) < -min$ holds, the initial point str is redefined as $str = str - 2 \times min$, and the search is repeated.

(4-3) For those cases other than the foregoing cases, the value for the quantity $str + 2 \times min$ is set in the driver register as the optimized driving energy.

FIGS. 43(A)–43(F) represent the foregoing processes particularly with respect to the subroutine CUR-MAXMSKR2.

Figure 43A:
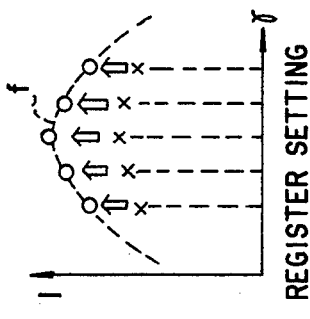
FIGS. 43(A)–43(F) are diagrams showing the optimization of the mask driving energy achieved by the subroutine of FIG. 41 or FIG. 42.
Figure 43B:
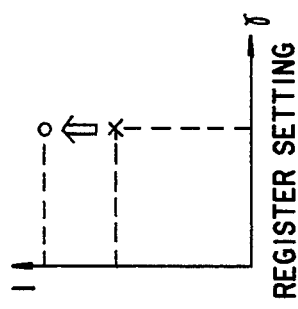
Figure 43C:
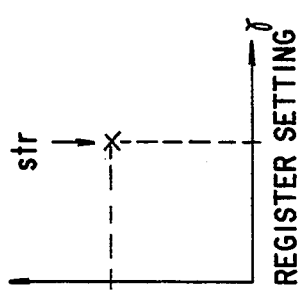

Referring to the drawings, FIG. 43(A) corresponds to the step S262 of FIG. 42 and the driving energies of the mask deflector 42, the focusing compensation coil 41 or 44, and the astigmatic compensation coil 42 or 45 are set to the respective initial points str. In FIG. 43(A) as well as other drawings, the horizontal axis represents the variable r that in turn represents the value held in the driving register for driving the mask deflector or compensation coils. On the other hand, FIG. 43(B) corresponds to the step S264 of FIG. 42 and a search is made for the maximum of the beam current I by driving the mask deflector 42 alone. Further, FIG. 43(C) corresponds to the step S265 of FIG. 42 and approximates the relationship between the driving energy r and the beam current I by means of the foregoing parabolic curve f according to the least square fitting process.

Figure 43D:
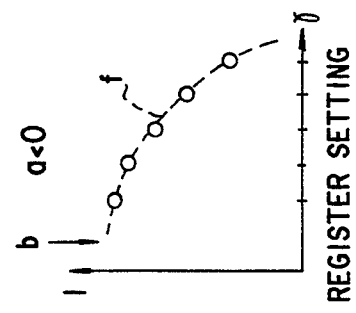
Figure 43E:
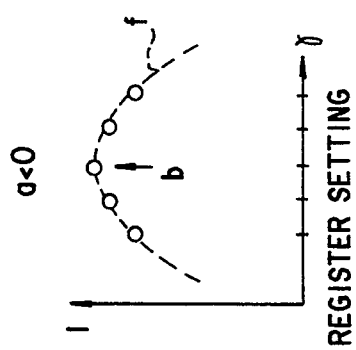

FIG. 43(D) corresponds to the situation explained earlier with reference to (4-1) wherein the maximum of the parabolic curve f, given by the parameter b, is located at a positive side on the horizontal axis r, with respect to the center of the range of search of the driving energy, which is given by the term $str + 2 \times min$, with offset exceeding the minimum search step, min. On the other hand, FIG. 43(F) corresponds to the situation explained earlier with reference to (4-2) wherein the maximum position b of the foregoing parabolic curve f is located at the negative side on the horizontal axis r with an offset exceeding the minimum search step min. Further, FIG. 43(E) shows the case wherein the maximum position b of the parabolic curve f is included in the foregoing range of search of the optimum driving energy.

Figure 43F:
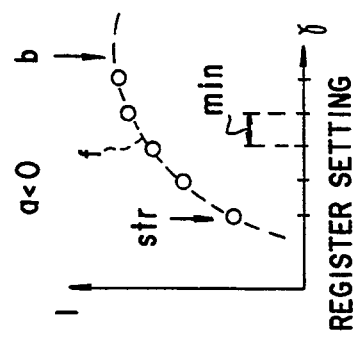

Thus, in the situation of FIG. 43(D), the initial point str is displaced in the positive direction of the variable r with the distance $str + 2 \times min$ as already described with reference to the case of (4-1), wherein the distance corresponds to one half the range of the search for the optimum driving energy. After the initial point str is displaced as such, the discrimination of the maximum is carried out again. In the situation of FIG. 43(F) corresponding to the case (4-2) mentioned before, the initial point str is displaced in the positive direction of the variable r by the distance $str + 2 \times min$, and the search process of the maximum position b is carried out again. Further, by repeating such processes a number of times, the maximum position b of the curve f is ultimately located at the center of the range of search as represented in FIG. 43(E).

Figure 44:
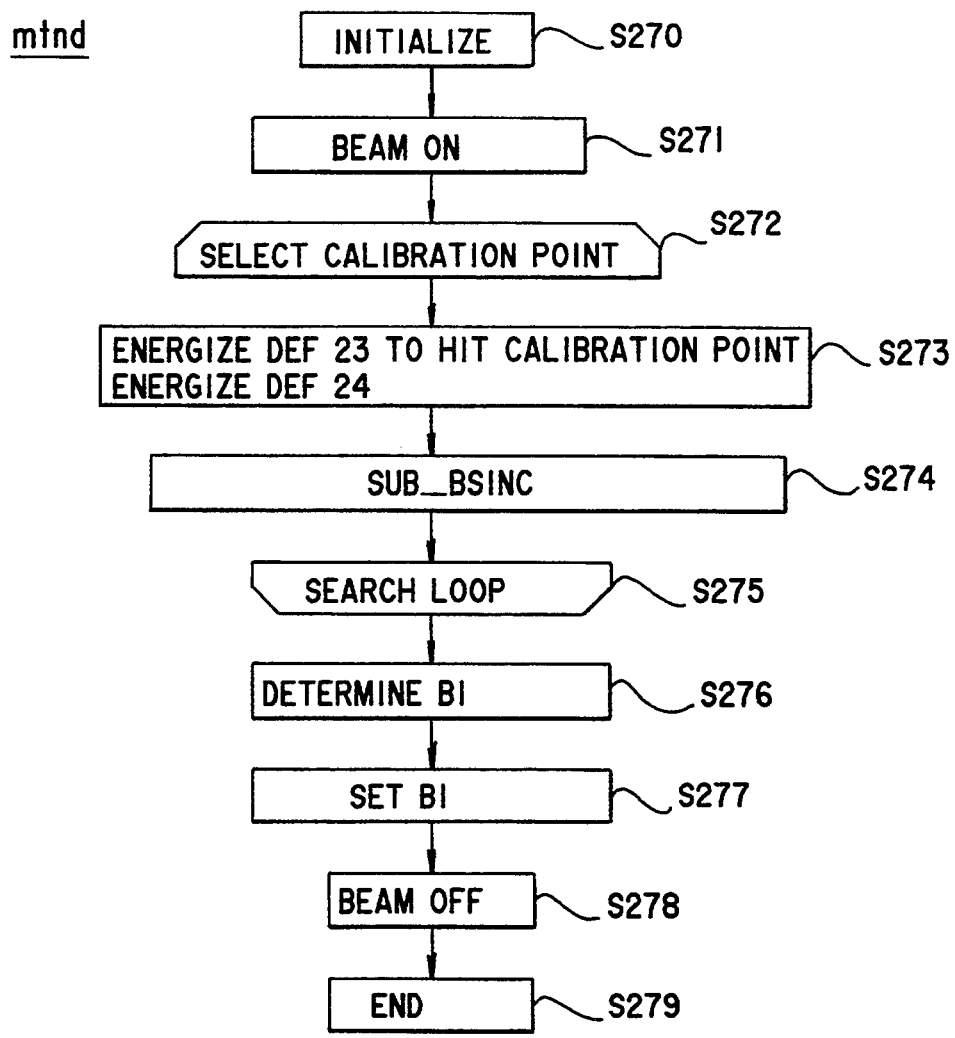
FIG. 44 is a flowchart showing another subroutine called in the process of FIG. 36.

FIG. 44 shows the subroutine mtnd carried out in the step S205 of FIG. 36.

Referring to FIG. 44, the subroutine mtnd is similar to the subroutine mtnu and starts with an initialization step S270. Next, in a step S271, the electron beam is turned on and a calibration point (0)–(9) is selected in a step S272. Further, the steps S273–S274 are carried out for each of the calibration points. In the step S273, the mask deflectors 23 and 24 are energized simultaneously, wherein the mask deflector 23 deflects the electron beam to the selected calibration point such as the point (0). Next, the subroutine sub_bsinc explained with reference to FIG. 38 is called in a step S274, and the driving energy of the mask deflector 113 is optimized. Further, the step S275 is carried out for selecting the next calibration point, and the steps S273–S274 are repeated for each of the calibration points wherein the driving energy of the mask deflector 24 is optimized with respect to the selected calibration points. Further, a step S276 is carried out for calculating the relativistic correction coefficient $B_1$ shown in FIG. 25(B), and the coefficients $B_1$ thus obtained are set in the driving circuit of the mask deflector 24 in a step S277. Further, the driving energies xma and yma are reset to zero and the electron beam is turned off in a step S278. Further, a termination processing is carried out in a step S278.

After the subroutine mtnd is carried out in the process of FIG. 36, a step S207 corresponding to the step $S90_{-3}$ of FIG. 20 is carried out, wherein the electron beam is deflected as indicated in FIG. 27 and the mask area correction coefficients D shown in FIG. 31 are obtained. Further, a step S208 corresponding to the step $S90_{-4}$ of FIG. 20 is carried out, wherein the mask deflectors 21–24 are energized to cause a deflection of the electron beam as indicated in FIG. 30, and the relativistic correction coefficients A–C shown in FIG. 31 are obtained.

Further, based upon the mask area correction coefficients D and the relativistic correction coefficients A–C thus obtained, the exposure of a semiconductor pattern on the substrate 40 is carried out in the steps S91–S94.

Figure 45:
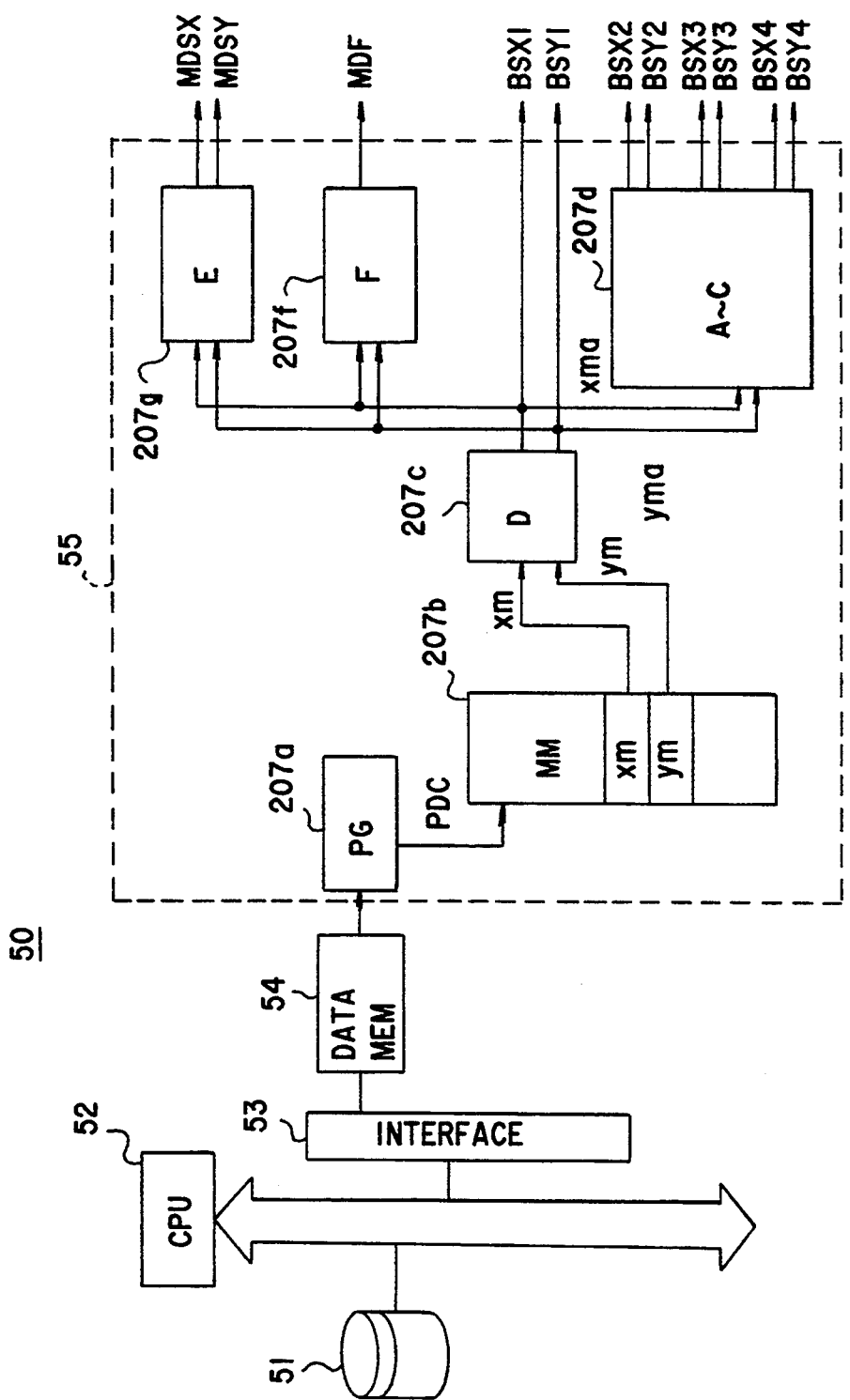
FIG. 45 is a block diagram showing the construction of the electron beam exposure system used in the third embodiment of the present invention.

FIG. 45 is a block diagram similar to FIG. 33 and shows the construction of the control system 50, wherein the system 50 of FIG. 45 includes, in addition to the relativistic correction circuit 207d, an astigmatic compensation circuit 207g and a focusing compensation circuit 207f, wherein the circuit 207f converts the driving signals $BSX_1$ ($=$xma) and $BSY_1$ ($=$yma) to the driving signal MDF of the focusing compensation coil 41 or 44 based upon the correction coefficients F of FIG. 35. Similarly, the circuit 207g is supplied with the driving signals $BSX_1$ and $BSY_1$ of the mask deflector 21 from the circuit 207c and converts the same to driving signals MDSX and MDSY of the astigmatic compensation coil 42 or 45, according to the correction coefficients E of FIG. 34.

8. Correction During Operation for Recovering Optimization

Next, a third embodiment of the present invention will be described with reference to FIG. 46 showing the correction of the coefficients A–D during the operation of the electron beam exposure system for recovering the optimized setting.

In the operation of the electron beam exposure system of FIG. 1, the correction coefficients A–D of FIG. 31 are the quantities that does not change once they are determined by the process described with the second embodiment. However, in the actual electron beam exposure system, there is a tendency that contamination occurs in the evacuated column of the exposure system and the mask deflectors or other parts tend to show a charge up. When such a charge up occurs, the electron beam causes a drift away from the optical axis. Thereby, the correction coefficients A–D determined previously are inevitably modified. Although such a change of the correction coefficients can be rectified by repeating the processes described with reference to the second embodiment, such a process takes a relatively long time and the use of the correction process during the exposure process is not desirable in view point of reducing the throughput of exposure.

In the present embodiment, a process is described wherein the occurrence of the electron beam drift is monitored and the deviation of the correction coefficients A–D is eliminated with a simplified process.

FIG. 13 is a flowchart showing the summary of the correction process of the coefficients A–D according to the present embodiment, wherein the process of FIG. 13 is repeated periodically during the exposure process.

Referring to FIG. 46, a step S300 is conducted for measuring the beam current on the substrate 40, and based upon the beam current thus detected, a current density of the electron beam is determined. Next, a step S301 is carried out wherein it is discriminated whether there occurs a decrease in the beam current as compared with the beam current at the beginning of the exposure process, and when it is discriminated that such a decrease is occurring, a subroutine bsfru is carried out in a step S302 wherein only the relativistic coefficients A for the lower order terms are corrected such that the substrate current becomes maximum.

Next, the mask deflectors 21 and 22 are energized in a step S303 according to the relationship of FIG. 31 based upon the correction coefficients A, and the lower order terms of the mask area correction coefficients D alone are corrected such that the beam current becomes maximum.

Next, in a step S304, the exposure process is conducted again based upon the correction coefficients A and D thus modified, and the process is terminated when it is discriminated in a step S304 that the original current density has been recovered. On the other hand, when the original current density was not recovered in the step S304, a subroutine bsfrd is carried out in a step S305 and the lower order terms of the relativistic coefficients $B_1$ for the mask deflectors 23 and 24 are modified. Further, the mask deflectors 21–24 are energized in a subsequent step S306 and modified correction coefficients B and C are obtained based upon the modified coefficients $B_1$ obtained in the step S305.

Figure 47:
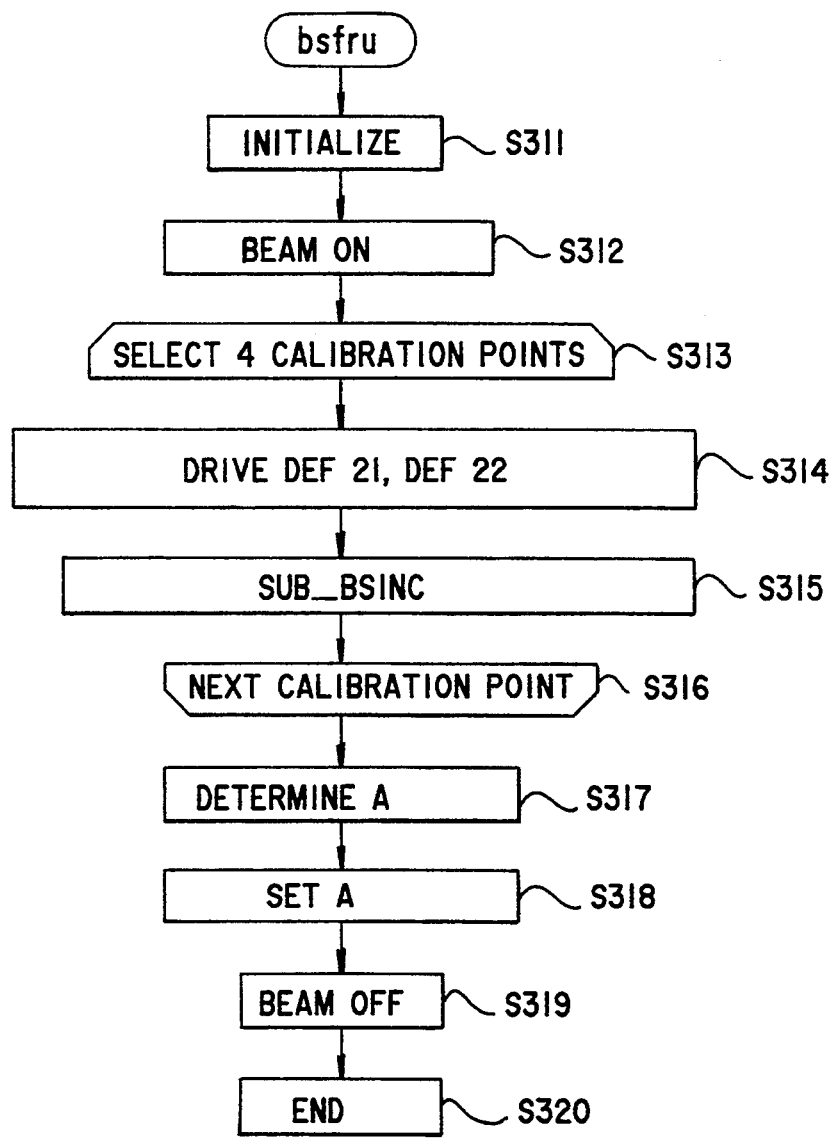
FIG. 47 is a flowchart showing a subroutine used in the process of FIG. 46.

FIG. 47 is a flowchart of the subroutine bsfru, wherein it will be noted that the subroutine bsfru includes steps similar to the subroutine mtnu.

Referring to FIG. 47, an initialization process is conducted in a step S311 and four calibration points are selected in a step S312. Further for each of the four calibration points thus selected, the step S314 and the steps following thereto are carried out.

In the step S314, the mask deflector 21 is energized and the electron beam is deflected to the selected calibration point. Simultaneously, the mask deflector 22 is energized in the step S314, and the subroutine sub_b_sinc described previously with reference to FIG. 38 is called in a next step S315 for optimization of the driving energy of the mask deflector 22. Next, the next calibration point is selected in the step S316, and the relativistic correction coefficients A of FIG. 31 are obtained in a step S317. Further, the relativistic correction coefficients A are set in the correction circuit 207d in a step S318, and the electron beam is turned off in a step S319. Further, a terminating process is carried out in a step S320.

FIG. 48(A) shows the principle of correcting the lower order terms of the relativistic coefficients in response to the occurrence of the drift of the electron beam. As shown in FIG. 48(A), the driving energies $BSX_2$ and $BSY_2$ are determined at first, and the contributions of the higher order terms $D_{20}bsx_i$, $D_{02}bsx_i$, $S_{21}bsx_i$, ..., $D_{20}bsy_i$, $D_{02}bsy_i$, $S_{21}bsy_i$, ... are subtracted from the driving energies $BSX_2$ and $BSY_2$ respectively. Thereby, the lower order driving energies $Ax_i(k)$ and $Ay_i(k)$ are obtained for each of the four calibration points k. When optimizing the mask deflector 22, the suffix i is two (i=2). Further, based upon the lower order driving energies $Ax_i(k)$ and $Ay_i(k)$ thus obtained and further based upon the optimized driving energies $BSX(k)$ and $BSY(k)$ (k=0–3), the lower order correction coefficients $Obsx_i$, $Gbsx_i$, $Rbsx_i$, $Hbsx_i$, $Obsy_i$, $Gbsy_i$, $Rbsy_i$ and $Hbsy_i$ are updated. In other words, the lower order correction coefficients $Obsx_i$, $Gbsx_i$, $Rbsx_i$, $Hbsx_i$, Obsyi, $Gbsy_i$, $Rbsy_i$ and $Hbsy_i$ that are obtained in the algorithm of FIG. 48(B) are updated with respect to the drift of the electron beam. Thus, by combining the lower order correction coefficients thus obtained with the higher order coefficients already obtained, one can obtain the optimized driving energy of the mask deflector 22.

After the step S302, a step S303 is carried out, wherein the mask deflectors 21 and 22 are energized based upon the updated value of the relativistic coefficients obtained in the foregoing step S302, and the lower order terms of the mask area correction coefficients are obtained according to the relationship shown in FIGS. 49(A) and 49(B).

Referring to FIG. 49(A), the optimized driving energies BSX(k) and BSY(k) of the mask deflector 21 are obtained for each of the calibration points (0)–(3) such that the beam drift is canceled, and the contributions of the higher order terms of the mask area correction coefficients D are subtracted from the optimized driving energies BSX(k) and BSY(k). Thereby, the lower order driving energies Cx(k) and Cy(k) (k=0–3) of the mask deflector 21 are obtained for each of the calibration pints (0)–(3). Further, by using the lower order driving energies Cx(k) and Cy(k) (k=0–3) and the coordinates xm(0), ym(0), . . . xm(3), and ym(3) of the calibration points (0)–(3), one can determine the lower order terms of the mask area correction coefficients Omax, Gmax, Rmax, Hmax, Omay, Gmay, Rmay, and Hmay, according to the relationship of FIG. 49(B). Thus, by constructing or synthesizing the mask area correction coefficients from the lower order terms thus obtained and from the higher order terms obtained previously, one can calculate the driving energies $BSX_1$ and $BSY_1$ of the mask deflector 21 to achieve the desired beam deflection.

Figure 50:
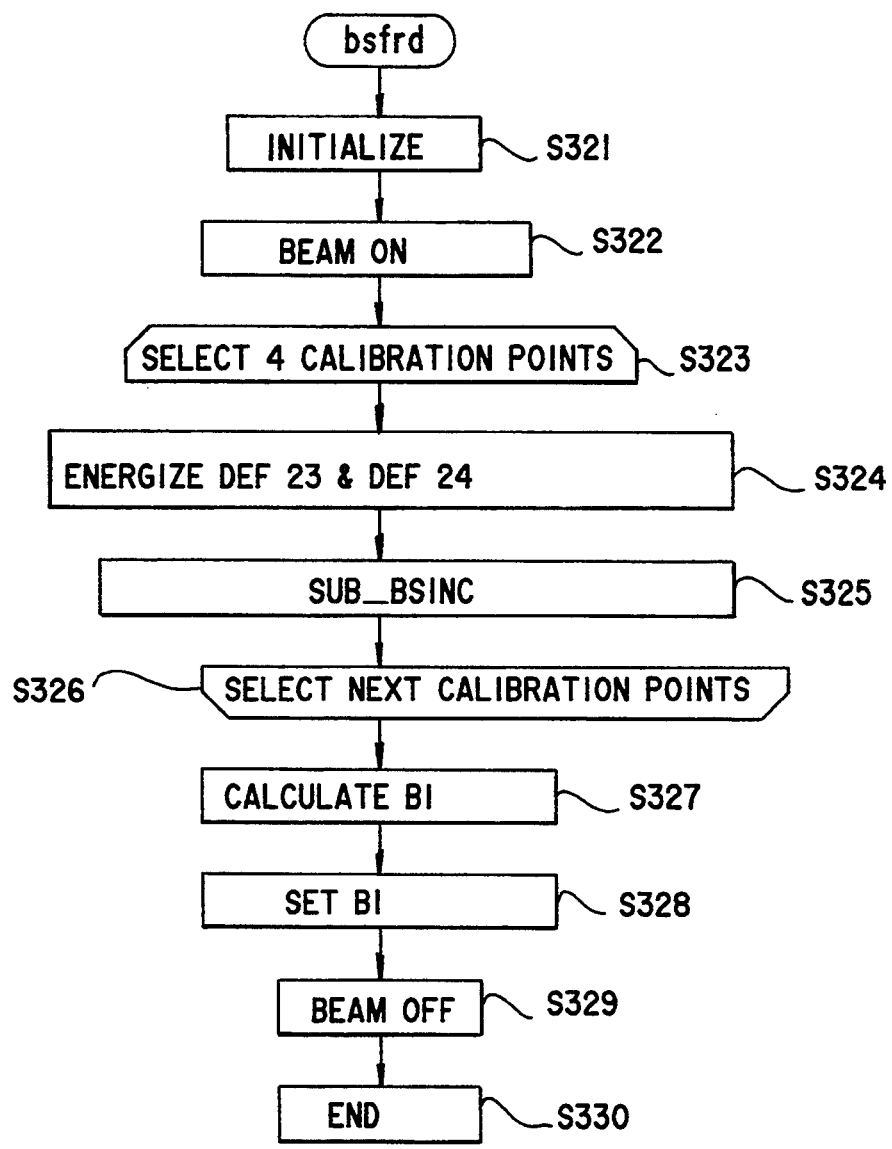
FIG. 50 is a flowchart showing a subroutine called in the process of FIG. 46.

FIG. 50 shows the subroutine bsfrd called in the step S305 of FIG. 46. It will be noted that the subroutine bsfrd includes steps similar to the subroutine bsfru of FIG. 47.

Referring to FIG. 50, an initialization is carried out in a step S321 and the electron beam is turned on continuously in a step S322. Further four calibration points (0)–(3) are selected in a step S333.

Next, in a step S324, the mask deflector 23 is energized such that the electron beam is deflected to a selected calibration point (0)–(3). Further, the mask deflector 24 is energized in a step S324 and the driving energy of the mask deflector 24 is optimized in a step S325 by calling the subroutine sub_bsinc. Further, a step S326 is carried out for selecting the next calibration point from the foregoing four calibration points, and the foregoing steps S324 and S325 are repeated for each of the calibration points (0)–(3). When the optimization of the driving energy for the mask deflectors 23 and 24 is completed with respect to each of the foregoing calibration points (0)–(3), the relativistic correction coefficients $B_1$ are obtained in a step S327, and the coefficients $B_1$ are set in the driving circuit of the mask deflector 24. Further, the electron beam is turned off in the step S329 and a termination processing is carried out in a step S330.

In the process of FIG. 46, the step S306 is carried out after the step S305 and the lower order terms of the mask area correction coefficients are obtained by energizing the mask deflectors 21–24.

Figure 51:
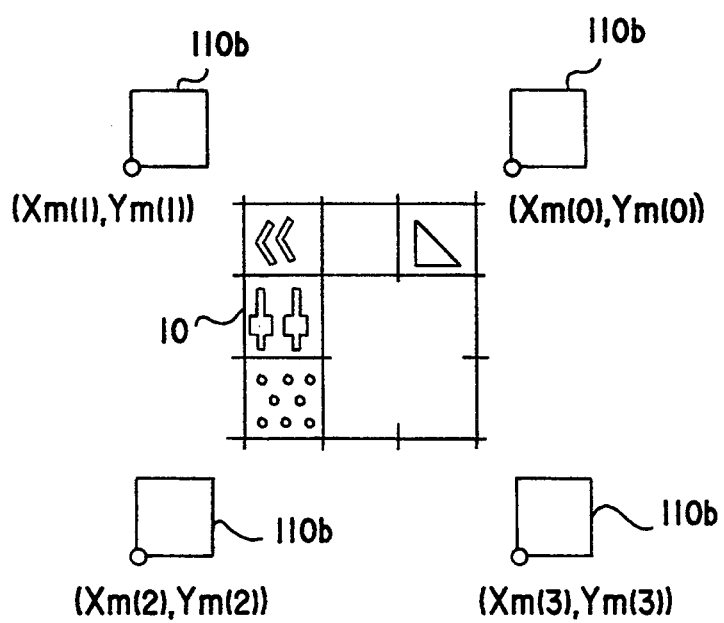
FIG. 51 is a diagram showing the construction of the stencil mask adapted for use in the electron beam exposure process of the third embodiment of the present invention.

FIG. 51 shows another example of the stencil mask 20 that is adapted to the process of FIG. 46. As the updating is applied only to the lower order terms in the present embodiment, four calibration apertures are sufficient for carrying out the foregoing processes. Thus, by disposing the four calibration apertures 110b to surround the area on which the block apertures 10 are formed, one can update the lower order coefficients without replacing or moving the mask 20.

Further, the present invention is not limited to the embodiments described heretofore, but various variations and modifications may be made without departing from the scope of the invention.

What is claimed is:

1. A method for exposing a pattern on an object by means of a focused charged particle beam, comprising the steps of:

forming a charged particle beam in a beam source such that said charged particle beam travels toward said object along an optical axis;

focusing said charged particle beam upon said object;

shaping said charged particle beam in a region between said beam source and said object to form a shaped charged particle beam, said step of shaping comprising a step of deflecting said charged particle beam away from said optical axis by energizing deflection means that includes a plurality of deflectors, such that said charged particle beam passes one of a plurality of apertures provided on a beam shaping mask;

deflecting back said shaped charged particle beam again upon said optical axis;

radiating said shaped charged particle beam along said optical axis upon a shielding plate that is formed with a pinhole having a size generally corresponding to a diameter of said charged particle beam, said shielding plate being provided on said optical axis at a location between said beam shaping mask and said object; and selectively causing a turning off of said charged particle beam on said object by selectively deflecting said charged particle beam that has been radiated upon said shielding plate, away from said pinhole, said plurality of deflectors including first through fourth deflectors wherein said first and second deflectors are disposed at a side close to said beam source with respect to said beam shaping mask and such that said third and fourth deflectors are disposed at a side close to said object;

said method further comprising the steps of:

(a-1) energizing said first deflector forming said deflection means to cause a deflection of said charged particle beam to a plurality of calibration points that are located offset from said optical axis; and energizing, in each of said calibration points, the remaining deflectors forming said deflection means;

(a-2) detecting an intensity of said charged particle beam arriving at said object while energizing said remaining deflectors in said step (a-1), for each of said calibration points; and obtaining optimized energization of said remaining deflectors by optimizing energization of said remaining deflectors such that the charged particle beam, deflected in said step (a-1) and arriving at said object after passing through said pinhole, has a maximum intensity;

(a-3) obtaining a relativistic correction function that describes said optimized energization of said remaining deflectors obtained in said step (a-2) as a function of the energization of said first deflector;

(a-4) energizing said first deflector to cause a deflection of said charged particle beam such that said charged particle beam passes a selected aperture on said beam shaping mask; energizing said remaining deflectors according to said relativistic correction function, simultaneously to said first deflector that is deflecting said charged particle beam to said selected aperture; and obtaining optimized energization of said first deflector such that said charged particle beam, arriving at said object after passing through said pinhole, has a maximum intensity;

(a-5) obtaining an absolute correction function that describes said optimized energization of said first deflector obtained in said step (a-4), as a function of a position of said selected aperture on said beam shaping mask; and (b) deflecting said charged particle beam by energizing said first deflector according to said absolute correction function and said remaining deflectors according to said relativistic correction function, based upon energization of said first deflector, such that said electron beam hits said selected aperture on said beam shaping mask;

said step (a-2) further comprising the steps of:

(a-2-1) obtaining optimized energization of said second deflector with respect to energization of said first deflector by energizing said first and second deflectors simultaneously, such that said charged particle beam arriving at said object has a maximum intensity; and (a-2-2) obtaining optimized energization of said third deflector with respect to the energization of said fourth deflector by energizing said third and fourth deflectors simultaneously, such that said charged particle beam arriving at said object has a maximum intensity.

2. A method as claimed in claim 1, wherein said step (a-3) comprises a step of obtaining a first relativistic correction function based upon said optimized energization of said second deflector obtained in said step (a-2-1), said first relativistic correction function describing a relationship between said optimized energization of said second deflector and the energization said first deflector.

3. A method as claimed in claim 2, wherein said step (a-3) comprises a step of obtaining a second relativistic correction function based upon said optimized energization of said third deflector obtained in said step (a-2-2), said second relativistic correction function describing a relationship between said optimized energization of said third deflector and the energization of said fourth deflector.

4. A method as claimed in claim 2, wherein said step (a-3) comprises a step of obtaining third and fourth relativistic correction functions respectively representing said optimized energization of said third and fourth deflectors with respect to the energization of said first deflector, by energizing said first through fourth deflectors simultaneously such that said charged particle beam arriving at said object after passing through said pinhole has a maximum intensity on said object.

5. A method as claimed in claim 1, wherein said relativistic correction function represents the relationship between the energization of said first deflector and the optimized energization of said remaining deflectors by a polynomial.

6. A method for exposing a pattern on an object by means of a focused charged particle beam, comprising the steps of:

forming a charged particle beam in a beam source such that said charged particle beam travels toward said object along an optical axis;

focusing said charged particle beam upon said object;

shaping said charged particle beam in a region between said beam source and said object to form a shaped charged particle beam, said step of shaping comprising a step of deflecting said charged particle beam away from said optical axis by energizing deflection means that includes a plurality of deflectors, such that said charged particle beam passes one of a plurality of apertures provided on a beam shaping mask;

deflecting back said shaped charged particle beam again upon said optical axis;

radiating said shaped charged particle beam along said optical axis upon a shielding plate that is formed with a pinhole having a size generally corresponding to a diameter of said charged particle beam, said shielding plate being provided on said optical axis at a location between said beam shaping mask and said object; and selectively causing a turning off of said charged particle beam on said object by selectively deflecting said charged particle beam that has been radiated upon said shielding plate, away from said pinhole;

said method further comprising the steps of:

(a-1) energizing a first deflector forming said deflection means to cause a deflection of said charged particle beam to a plurality of calibration points that are located offset from said optical axis; and energizing, in each of said calibration points, the remaining deflectors forming said deflection means;

(a-2) detecting an intensity of said charged particle beam arriving at said object while energizing said remaining deflectors in said step (a-1), for each of said calibration points; and obtaining optimized energization of said remaining deflectors by optimizing energization of said remaining deflectors such that the charged particle beam, deflected in said step (a-1) and arriving at said object after passing through said pinhole, becomes maximum;

(a-3) obtaining a relativistic correction function that describes said optimized energization of said remaining deflectors obtained in said step (a-2) as a function of the energization of said first deflector;

(a-4) energizing said first deflector to cause a deflection of said charged particle beam such that said charged particle beam passes a selected aperture on said beam shaping mask; energizing said remaining deflectors according to said relativistic correction function, simultaneously to said first deflector that is deflecting said charged particle beam to said selected aperture; and obtaining optimized energization of said first deflector such that said charged particle beam, arriving at said object after passing through said pinhole, has a maximum intensity;

(a-5) obtaining an absolute correction function that describes said optimized energization of said first deflector obtained in said step (a-4), as a function of a position of said selected aperture on said beam shaping mask;

(b-1) energizing said first deflector and simultaneously an astigmatic compensation coil provided along said optical axis at a side close to said beam source with respect to said shielding plate, said astigmatic compensation coil compensating for astigmatism upon energization;

(b-2) obtaining optimized energization of said astigmatic compensation coil, by optimizing said energization of said astigmatic compensation coil such that said charged particle beam has a maximum intensity on said object, while simultaneously detecting said intensity of said charged particle beam on said object;

(b-3) obtaining an astigmatic correction function describing said optimized energization of said astigmatic compensation coil as a function of the energization of said first deflector;

(c-1) energizing said first deflector and simultaneously a focusing compensation coil provided along said optical axis at a side close to said beam source with respect to said shielding plate, said focusing compensation coil adjusting a focal point of said charged particle beam;

(c-2) obtaining optimized energization of said focusing compensation coil, by optimizing said energization of said focusing compensation coil such that said charged particle beam has a maximum intensity on said object, while simultaneously detecting said intensity of said charged particle beam on said object;

(c-3) obtaining a focusing correction function describing said optimized energization of said focusing compensation coil as a function of the energization of said first deflector; and (d) deflecting said charged particle beam to hit said selected aperture on said beam shaping mask by energizing said deflectors of the deflection means, said astigmatic compensation coil, and said focusing correction coil according to said absolute correction function, said relativistic correction function, said astigmatic correction function, and said focusing correction function respectively, based upon the energization of said first deflector such that said charged particle beam is shaped by said selected aperture.

7. A method as claimed in claim 6, wherein said steps (b-1) and (b-2) and said steps (c-1) and (c-2) are carried out after said steps (a-1) and (a-2) are carried out.

8. A method as claimed in claim 6, wherein said steps (b-1) and (b-2) are carried out after said steps (c-1) and (c-2) are carried out.

9. A method as claimed in claim 6, wherein said steps (c-1) and (c-2) are carried out after said steps (b-1) and (b-2) are carried out.

10. A method as claimed in claim 6, wherein said relativistic correction function represents the energization of said first deflector and the optimized energization of the remaining deflectors by a first polynomial.

11. A method as claimed in claim 10, wherein said focusing correction function represents the energization of said first deflector and the optimized energization of said focusing compensation coil by a second polynomial having an order identical with an order of said first polynomial that described said relativistic correction function.

12. A method as claimed in claim 10, wherein said astigmatic correction function represents the energization of said first deflector and the optimized energization of said astigmatic compensation coil by a third polynomial having an order identical with an order of said first polynomial.

13. A method as claimed in claim 6, wherein, in each of said steps (a-2), (a-4), (b-2) and (c-2), said intensity of said charged particle beam on said object is represented by a parabolic function of said driving energy, and wherein each of said steps (a-2), (a-4), (b-2) and (c-2) comprises a step of obtaining said optimized energization as the energization that maximizes said intensity.

14. A method as claimed in claim 13, wherein each of said steps (a-2), (a-4), (b-2) and (c-2) comprises the steps of searching said optimized energization in a search range, and searching said optimized energization again while shifting said search range in the event said optimized energization is not included in said search range.

15. A method as claimed in claim 14, wherein said step of searching said optimized energization is repeated until said optimized energy is located substantially at the center of said search range.

16. A method as claimed in claim 6, wherein said step (d) further comprises the steps of detecting an intensity of said charged particle beam arriving at said object, and updating lower order coefficients of said relativistic correction function and said absolute correction function by carrying out said steps (a-1)–(a-5) in the event that said intensity has decreased below a predetermined intensity, while leaving higher order coefficients of said relativistic correction function and said absolute correction function unchanged.

17. A method as claimed in claim 16, wherein said step (d) further comprises the steps of forming updated relativistic correction function and updated absolute correction function, based upon said lower order coefficients updated in said updating step and further based upon said higher order coefficients that remain unchanged, and energizing said first deflectors and said remaining deflectors by said updated relativistic correction function and said updated absolute correction function.

18. A charged particle exposure system for exposing a pattern on an object, comprising:
 beam source means for producing a charged particle beam and emitting the same toward said object along an optical axis;
 focusing means provided on said optical axis for focusing said charged particle beam upon said object;
 a beam shaping mask provided on said optical axis between said object and said beam source means, said beam shaping mask carrying a plurality of apertures for shaping said charged particle beam;
 beam deflection/shaping means provided along said optical axis between said object and said beam source means for deflecting said charged particle beam away from said optical axis such that said charged particle beam passes a selected aperture on said beam shaping mask;
 a beam interruption plate provided on said optical axis between said object and said beam shaping mask for interrupting said charged particle beam, said beam interruption plate having a pinhole in correspondence to said optical axis for passing said charged particle beam;
 deflection means provided along said optical axis between said beam source means and beam interruption plate, for selectively causing an offset in said charged particle beam away from said optical axis upon energization, for causing a turning on and turning off of said charged particle beam on said object;
 astigmatic correction means provided along said optical axis between said beam interruption plate and said beam source means, for compensating for astigmatism of said charged particle beam when said charged particle beam is deflected away from said optical axis; and
 focusing correction means provided along said optical axis between said beam interruption plate and said beam source means, for adjusting a focal point of said charged particle beam such that said focal point coincides to said beam interruption means when said charged particle beam is deflected away from said optical axis;

wherein said charged particle beam exposure system further comprises:

pattern selection means supplied with exposure data corresponding to a pattern to be exposed on said object, for producing a positional selection signal that specifies the position of said selected aperture on said beam shaping mask;

deflection signal outputting means supplied with said positional selection signal from said pattern selection means for producing a first driving signal for energizing said deflection/shaping means;

astigmatic correction signal outputting means supplied with said first driving signal from said deflection signal outputting means for producing a second driving signal for energizing said astigmatic correction means; and focusing correction signal outputting means supplied with said first driving signal from said deflection signal outputting means for producing a third driving signal for energizing said focusing correction means;

wherein said deflection signal outputting means storing therein a first function for converting said positional selection signal to said first driving signal for driving said deflection/shaping means;

said astigmatic correction signal outputting means storing therein a second function for converting said positional selection signal to said second driving signal; and said focusing correction signal outputting means storing therein a third function for converting said positional selection signal to said third driving signal.

* * * * *